(12) United States Patent
Nishimura et al.

(10) Patent No.: US 10,904,464 B2
(45) Date of Patent: *Jan. 26, 2021

(54) IMAGING DEVICE

(71) Applicant: Panasonic Intellectual Property Management Co., Ltd., Osaka (JP)

(72) Inventors: Kazuko Nishimura, Kyoto (JP); Tokuhiko Tamaki, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/447,148

(22) Filed: Jun. 20, 2019

(65) Prior Publication Data

US 2019/0313040 A1   Oct. 10, 2019

Related U.S. Application Data

(63) Continuation of application No. 15/406,822, filed on Jan. 16, 2017, now Pat. No. 10,375,332.

(30) Foreign Application Priority Data

Jan. 22, 2016 (JP) .................................. 2016-010727

(51) Int. Cl.
*H04N 5/369* (2011.01)
*H04N 5/363* (2011.01)
(Continued)

(52) U.S. Cl.
CPC ... *H04N 5/35563* (2013.01); *H01L 27/14614* (2013.01); *H01L 27/14636* (2013.01);
(Continued)

(58) Field of Classification Search
CPC ...... H04N 5/3696; H04N 5/378; H04N 5/363; H04N 5/37457; H04N 5/359; H04N 5/374;
(Continued)

(56) References Cited

U.S. PATENT DOCUMENTS

| 4,647,975 A | 3/1987 | Alston et al. |
| 6,777,660 B1 * | 8/2004 | Lee .................. H01L 27/14609 |
| | | 250/208.1 |

(Continued)

FOREIGN PATENT DOCUMENTS

| CN | 102209210 A | 10/2011 |
| CN | 104081245 A | 10/2014 |

(Continued)

OTHER PUBLICATIONS

Organic CMOS image sensor technology using organic photoelectric conversion layer by FujiFilm (Year: 2013).*

(Continued)

*Primary Examiner* — Abdelaaziz Tissire
(74) *Attorney, Agent, or Firm* — McDermott Will & Emery LLP

(57) ABSTRACT

An imaging device comprising: a first pixel cell including a first photoelectric converter generating a first signal, the first photoelectric converter including a first electrode and a first photoelectric conversion region on the first electrode, and a first circuit coupled to the first electrode and detecting the first signal; and a second pixel cell including a second photoelectric converter generating a second signal, the second photoelectric converter including a second electrode and a second photoelectric conversion region on the second electrode, and a second circuit coupled to the second electrode and detecting the second signal. A sensitivity of the first pixel cell is higher than that of the second pixel cell. A (Continued)

circuit configuration of the first circuit is different from that of the second circuit. The first circuit includes a feedback circuit configured to negatively feed back a voltage of the first electrode to the first electrode.

19 Claims, 75 Drawing Sheets

(51) Int. Cl.
  *H04N 5/378* (2011.01)
  *H01L 27/146* (2006.01)
  *H04N 5/355* (2011.01)
  *H04N 5/3745* (2011.01)
  *H04N 5/359* (2011.01)

(52) U.S. Cl.
  CPC ....... *H01L 27/14643* (2013.01); *H04N 5/359* (2013.01); *H04N 5/363* (2013.01); *H04N 5/3696* (2013.01); *H04N 5/378* (2013.01); *H04N 5/3745* (2013.01); *H04N 5/37457* (2013.01)

(58) Field of Classification Search
  CPC .............. H04N 5/361; H01L 27/14636; H01L 27/14643; H01L 27/14614; H01L 27/14665; H01L 27/14638; H01L 27/14623; H01L 27/14603; H01L 27/14612

See application file for complete search history.

(56) References Cited

U.S. PATENT DOCUMENTS

| | | | |
|---|---|---|---|
| 10,375,332 B2* | 8/2019 | Nishimura | H04N 5/378 |
| 2005/0040320 A1* | 2/2005 | Lule | H01L 27/14609 250/214 R |
| 2006/0119720 A1* | 6/2006 | Hong | H04N 5/3745 348/308 |
| 2007/0290238 A1* | 12/2007 | Adachi | H04N 5/3559 257/288 |
| 2008/0211954 A1* | 9/2008 | Ota | H01L 27/14632 348/311 |
| 2008/0297609 A1* | 12/2008 | Song | H04N 5/235 348/207.99 |
| 2009/0045319 A1* | 2/2009 | Sugawa | H04N 5/37452 250/208.1 |
| 2010/0002110 A1 | 1/2010 | Ota | |
| 2011/0036969 A1* | 2/2011 | Ahn | H01L 27/14609 250/208.1 |
| 2011/0049591 A1* | 3/2011 | Nakatani | H01L 27/307 257/292 |
| 2011/0049661 A1 | 3/2011 | Maehara et al. | |
| 2011/0074995 A1 | 3/2011 | Rafferty et al. | |
| 2011/0109776 A1 | 5/2011 | Kawai | |
| 2011/0121162 A1* | 5/2011 | Murata | H01L 27/14645 250/208.1 |
| 2011/0199106 A1 | 8/2011 | Lotto et al. | |
| 2011/0242381 A1* | 10/2011 | Sakakibara | H04N 5/355 348/301 |
| 2012/0188424 A1 | 7/2012 | Li | |
| 2013/0033631 A1 | 2/2013 | Mabuchi | |
| 2013/0107094 A1 | 5/2013 | Yamamoto et al. | |
| 2013/0182173 A1* | 7/2013 | Murata | H01L 27/14627 348/349 |
| 2013/0258149 A1 | 10/2013 | Choi et al. | |
| 2013/0313410 A1 | 11/2013 | Goto | |
| 2013/0341491 A1* | 12/2013 | Hirose | H01L 27/1464 250/208.1 |
| 2014/0027618 A1* | 1/2014 | Goto | H01L 27/14603 250/208.1 |
| 2014/0145068 A1 | 5/2014 | Meynants | |
| 2014/0240536 A1 | 8/2014 | Kanemitsu et al. | |
| 2014/0346321 A1 | 11/2014 | Kinugasa | |
| 2015/0222833 A1 | 8/2015 | Murata | |
| 2016/0035920 A1 | 2/2016 | Tashiro et al. | |
| 2016/0065871 A1 | 3/2016 | Sakakibara et al. | |
| 2016/0105622 A1* | 4/2016 | Tamaki | H04N 5/3696 348/322 |
| 2016/0190188 A1* | 6/2016 | Murakami | H01L 27/14665 250/214 A |
| 2016/0191825 A1* | 6/2016 | Sato | H04N 5/363 348/250 |
| 2016/0219233 A1 | 7/2016 | Murata | |
| 2016/0261814 A1 | 9/2016 | Ueda et al. | |
| 2016/0293654 A1* | 10/2016 | Tomekawa | H01L 27/14603 |
| 2016/0360131 A1* | 12/2016 | Shimasaki | H04N 5/363 |
| 2017/0150017 A1* | 5/2017 | Geurts | H04N 5/372 |
| 2017/0214871 A1* | 7/2017 | Kanehara | H04N 5/35563 |
| 2017/0221947 A1* | 8/2017 | Shishido | H01L 27/14609 |
| 2017/0324916 A1* | 11/2017 | Sugawa | H01L 28/40 |

FOREIGN PATENT DOCUMENTS

| | | |
|---|---|---|
| JP | S62-108678 A | 9/1977 |
| JP | 2007-059465 A | 3/2007 |
| JP | 2008-099073 A | 4/2008 |
| JP | 2011-166792 A | 8/2011 |
| JP | 2012-019167 A | 1/2012 |
| JP | 2013-034045 A | 2/2013 |
| JP | 2014-168112 A | 9/2014 |
| JP | 2014-230212 A | 12/2014 |

OTHER PUBLICATIONS

English Translation of Chinese Search Report dated Mar. 4, 2020 for the related Chinese Patent Application No. 201611049715.1.

* cited by examiner

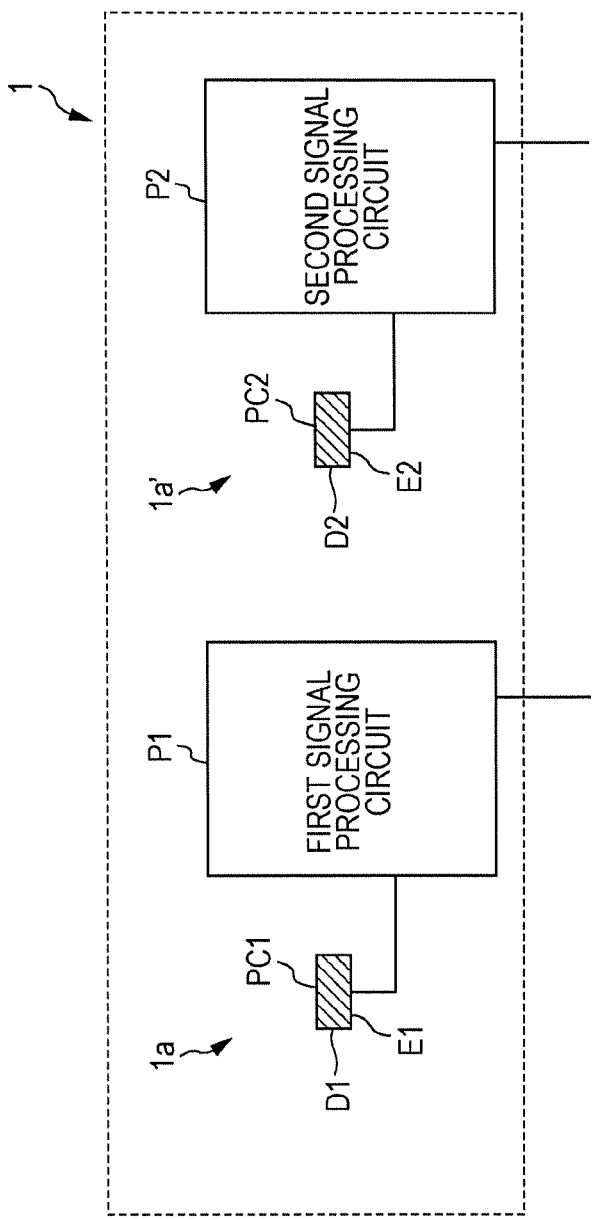

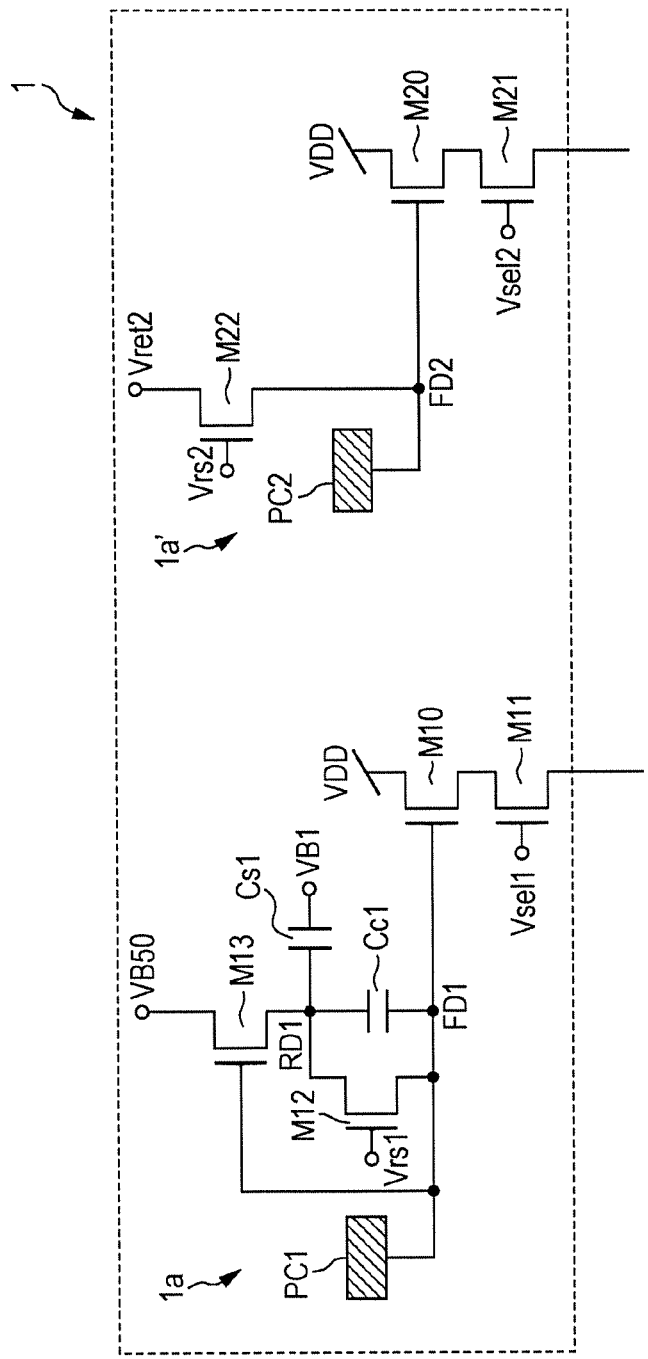

IMAGING DEVICE

CROSS-REFERENCE OF RELATED APPLICATIONS

This application is a Continuation of U.S. patent application Ser. No. 15/406,822, filed on Jan. 16, 2017, which in turn claims the benefit of Japanese Application No. 2016-010727, filed on Jan. 22, 2016, the entire disclosures of which Applications are incorporated by reference herein.

BACKGROUND

Technical Field

The present disclosure relates to an imaging device.

Description of the Related Art

A dynamic range of a subject existing in nature is wide. For example, an on-board imaging device is required to image a bright subject and a dark subject concurrently (wide dynamic range) since the brightness of a subject changes from moment to moment. For example, the following methods have been proposed in order to achieve a wide dynamic range.

A silicon photo diode is used in imaging devices disclosed in Japanese Unexamined Patent Application Publication No. 62-108678 and Japanese Unexamined Patent Application Publication No. 2008-99073. In Japanese Unexamined Patent Application Publication No. 62-108678, a wide dynamic range can be obtained by synthesizing images that are different in terms of an exposure period (hereinafter sometimes referred to as an "accumulation period"). This method has been already put into practical use. In Japanese Unexamined Patent Application Publication No. 2008-99073, a dynamic range is widened by synthesizing images obtained from a plurality of pixel cells having different degrees of sensitivity that are disposed in each pixel.

Japanese Unexamined Patent Application Publication No. 2007-59465 proposes a stacked sensor having a photoelectric conversion film instead of a silicon photo diode that hinders a wide dynamic range.

The aforementioned conventional imaging devices are required to be further improved in imaging in a wide dynamic range.

SUMMARY

One non-limiting and exemplary embodiment provides an imaging device and a camera system that allow wide dynamic range imaging.

In one general aspect, the techniques disclosed here feature an imaging device including: a first pixel cell including a first photoelectric converter that generates a first signal by photoelectric conversion, the first photoelectric converter including a first electrode and a first photoelectric conversion region on the first electrode, and a first circuit that is coupled to the first electrode and that detects the first signal; and a second pixel cell including a second photoelectric converter that generates a second signal by photoelectric conversion, the second photoelectric converter including a second electrode and a second photoelectric conversion region on the second electrode, and a second circuit that is coupled to the second electrode and that detects the second signal. A sensitivity of the first pixel cell is higher than a sensitivity of the second pixel cell. A circuit configuration of the first circuit is different from a circuit configuration of the second circuit. The first circuit includes a feedback circuit that is configured to negatively feed back a voltage of the first electrode to the first electrode.

It should be noted that general or specific embodiments may be implemented as an element, a device, an apparatus, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a schematic view illustrating a first signal processing circuit and a second signal processing circuit in a unit pixel;

FIG. 21 is a schematic view illustrating a circuit configuration of a unit pixel according to exemplary Fifth Embodiment;

DETAILED DESCRIPTION

First, problems of the conventional arts found by the inventor of the present invention are described below.

In image synthesis disclosed in Japanese Unexamined Patent Application Publication No. 62-108678, a plurality of image data are sequentially acquired. This requires a period that is several times longer than a general imaging period in order to obtain a single synthetic image. Furthermore, since images that are acquired at different times are synthesized, concurrency of the images is impaired. This distorts an image of a moving subject.

In Japanese Unexamined Patent Application Publication No. 2008-99073, a plurality of photo diodes that are the same in terms of sensitivity, the number of saturation electrons, and size are used. An on-chip structure having an on-chip top lens, which separates amounts of light entering the respective photo diodes into large and small ones, is employed. According to this configuration, the plurality of pixel cells appear to have different degrees of effective sensitivity. Since two cells are mounted in each pixel, images can be taken concurrently, and therefore concurrency of the images is secured.

However, since two cells need be disposed in each pixel, the area of each photo diode need be equal to or smaller than ½ of that of a conventional art. The area of a photo diode is proportional to sensitivity or the number of saturation electrons. Accordingly, in a case where the area of a photo diode is ½ or smaller, the sensitivity and the number of saturation electrons are also equal to or smaller than ½ of those of a conventional art.

Figure 1:
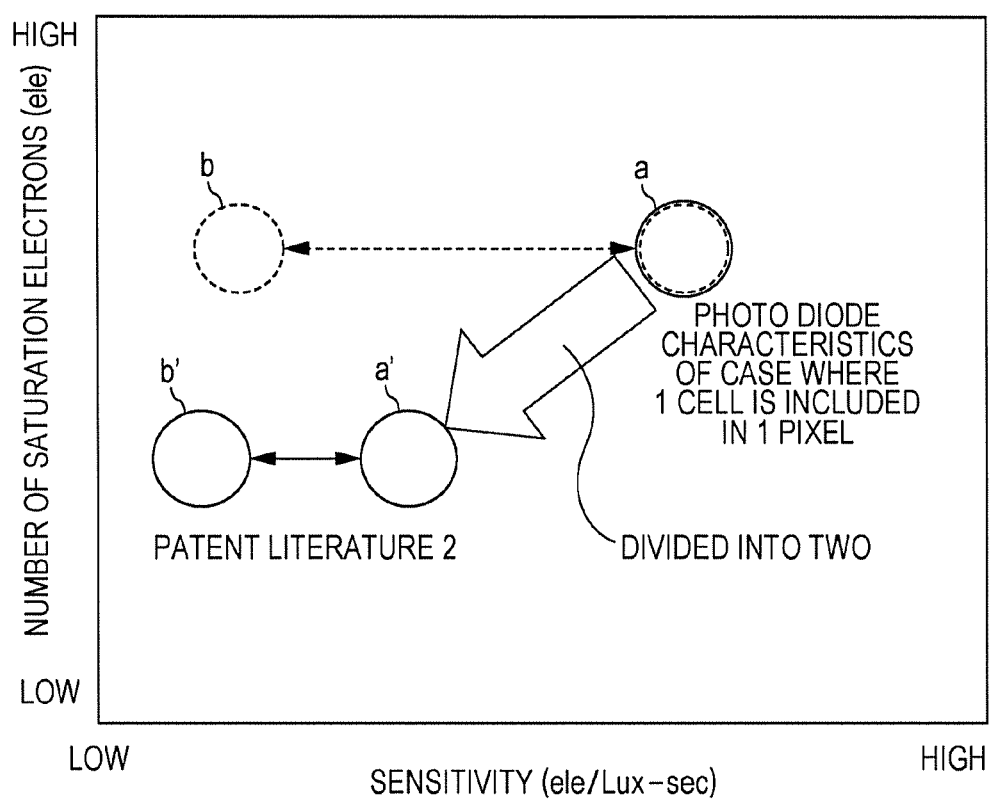
FIG. 1 is a diagram illustrating conventional pixel cell characteristics and desired pixel cell characteristics.

FIG. 1 schematically illustrates conventional pixel cell characteristics and desirable pixel cell characteristics. In FIG. 1, the horizontal axis represents sensitivity, and the vertical axis represents the number of saturation electrons. The "sensitivity" as used herein is one of indices indicative of characteristics of an imaging device (specifically, an image sensor) and refers to the number of electric charges (electron-hole pairs) generated in a pixel cell in response to incident light. The sensitivity is generally expressed in a unit "ele/Lux-sec". The "number of saturation electrons" as used herein refers to an allowable number of electrons accumulated in a pixel cell and is expressed in a unit "ele". In principle, the sensitivity and the number of saturation electrons are proportional to an effective area of a photoelectric conversion element. The sensitivity also depends on design of a microlens.

A cell having a single pixel cell within a single pixel is hereinafter referred to as a "general cell". In wide dynamic range imaging, it is desirable that two pixel cells within a single pixel have (a) pixel cell characteristics that are in the same level in terms of sensitivity and the number of saturation electrons as the general cell and (b) pixel cell characteristics that are in the same level in terms of the number of saturation electrons as the general cell and are lower in terms of sensitivity than the general cell. The combination of a and b in FIG. 1 is a desirable combination of two pixel cells.

The combination of a' and b' in FIG. 1 is a combination of two pixel cells in Japanese Unexamined Patent Application Publication No. 2008-99073. As described above, the area of each pixel cell (photo diode) is equal to or smaller than ½ of that of the general cell. Accordingly, the sensitivity of each pixel cell decreases, and the number of saturation electrons also decreases. This means that the pixel cell characteristics are deviated from desirable ones. That is, the pixel cell characteristics in Japanese Unexamined Patent Application Publication No. 2008-99073 are much inferior to requested ones.

Figure 2:
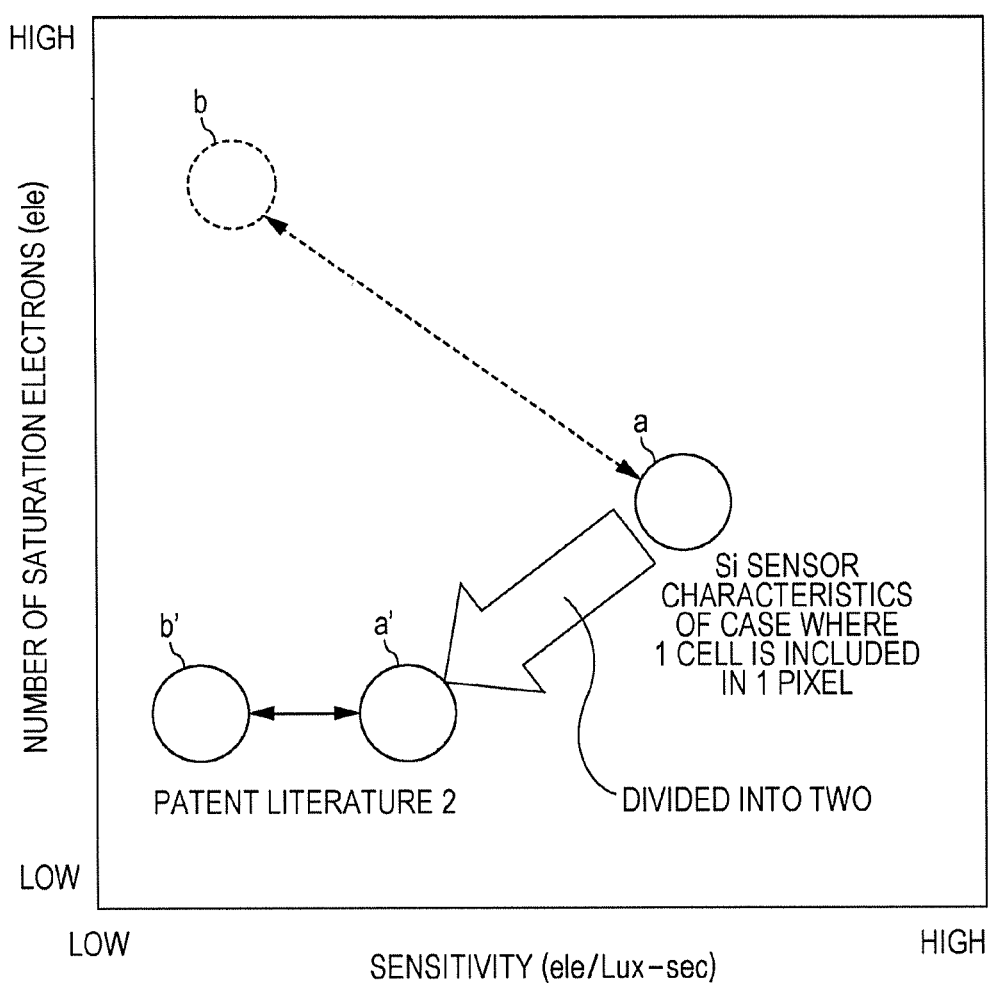
FIG. 2 is a diagram illustrating conventional pixel cell characteristics and more desired pixel cell characteristics.

FIG. 2 schematically illustrates conventional pixel cell characteristics and more desirable pixel cell characteristics. Saturation that can occur in a case where an amount of incident light is large is mitigated by lowering sensitivity. In addition, if the number of saturation electrons can be increased, a dynamic range is further widened.

Table 1 illustrates factors determining element functions and sensor performance while comparing a conventional Si sensor having a photodiode and a stacked sensor having a photoelectric conversion film disclosed in Japanese Unexamined Patent Application Publication No. 2007-59465. As is clear from Table 1, in the conventional Si sensor, both of the sensitivity and the number of saturation electrons are determined by performance of the photodiode. Meanwhile, in the stacked sensor having a photoelectric conversion film, the sensitivity depends on the area of the photoelectric conversion film and quantum efficiency thereof, and the number of saturation electrons depends on the capacity of an electric charge storage node. Accordingly, as the capacity of the electric charge storage node increases, the number of saturation electrons increases. However, an increase in capacity of the electric charge storage node has a large side effect.

TABLE 1

|  |  | Conventional Si sensor | Photoelectric conversion film sensor |
|---|---|---|---|
| Element functions | Photoelectric conversion | Photo diode | Photoelectric conversion film |
|  | Electric charge storage | Photo diode | Electric charge storage node |
|  | Signal readout (gate voltage of amplifier Tr) | Floating diffusion | Electric charge storage node |
| Sensor performance | Sensitivity | Depend on quantum efficiency of photo diode | Depend on quantum efficiency of photoelectric conversion film |
|  | Number of saturation electrons | Depend on capacity of photo diode | Depend on capacity of electric charge storage node |

Figure 3:
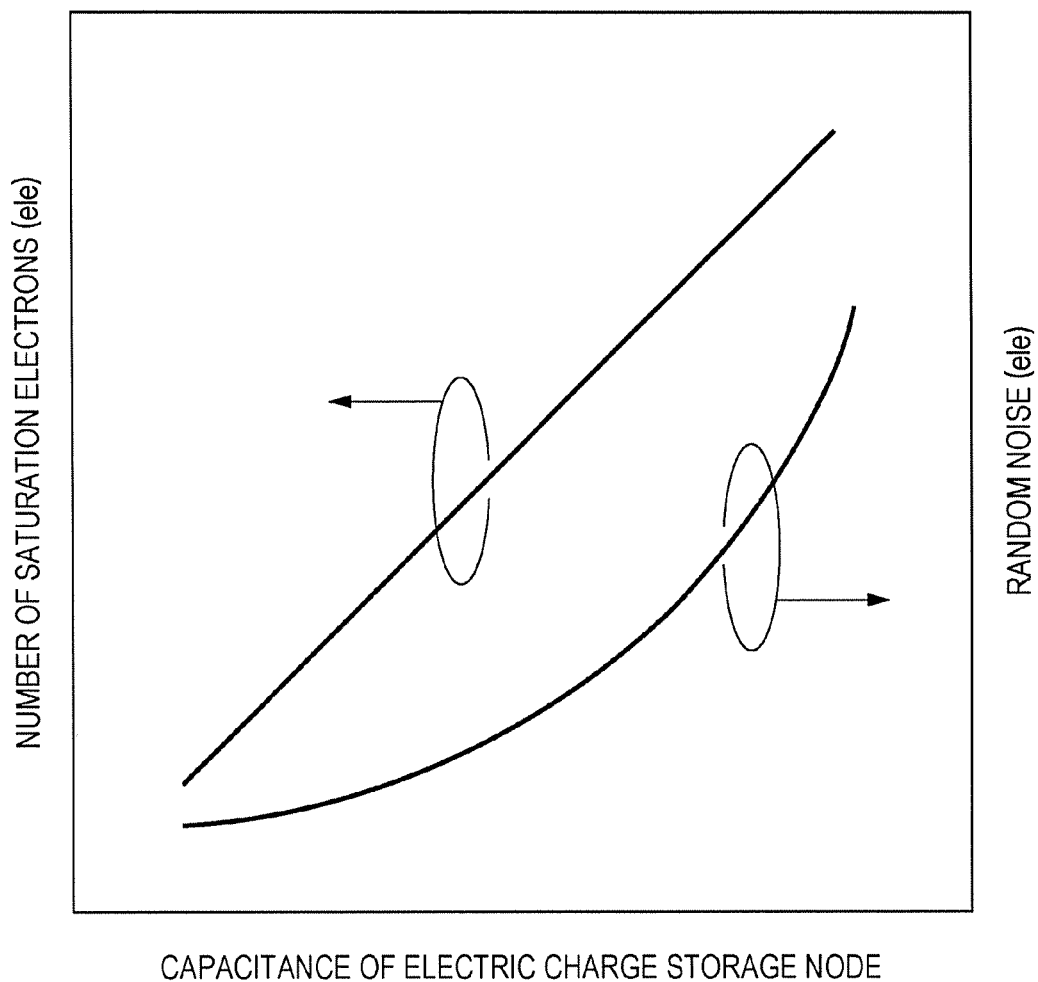
FIG. 3 is a diagram schematically illustrating a relationship among the capacitance of an electric charge storage node, the number of saturation electrons (ele), and random noise (ele)

FIG. 3 schematically illustrates a relationship among the capacity of an electric charge storage node, the number of saturation electrons (ele), and random noise (ele). In FIG. 3, the horizontal axis represents the capacity of an electric charge storage node, and the vertical axis represents the number of saturation electrons and random noise. It is possible to increase the number of saturation electrons by increasing the capacity of an electric charge storage node, but random noise also undesirably increases.

The random noise includes noise that occurs when an electric charge stored in an electric charge storage node is read out (i.e., transferred) by an electric charge sensing circuit and noise (hereinafter referred to as "kTC noise") that occurs when an electric charge stored in the electric charge storage node is reset by the electric charge sensing circuit. In a case where the capacity of the electric charge storage node is increased, the number of saturation electrons can be increased, but a ratio of the amount of change of the voltage of the electric charge storage node to the amount of change of the number of stored electric charges per unit volume decreases. Noise that occurs in the electric charge sensing circuit is voltage noise, and as a result, noise converted into the number of electric charges undesirably increases.

In a sensor using a silicon photo diode for photoelectric conversion, complete electric charge transfer is achieved, correlated double sampling (CDS) is effective for suppression of kTC noise. Meanwhile, in the stacked sensor using a photoelectric conversion film, complete electric charge transfer cannot be achieved, and therefore kTC noise cannot be cancelled by using CDS. This requires noise cancelling using feedback proposed, for example, in Japanese Unexamined Patent Application Publication No. 2012-19167. However, since a ratio of the amount of change of the voltage of the electric charge storage node to the amount of change of the number of stored electric charges per unit volume decreases in a case where the capacity of the electric charge storage node is increased as described above, an effect of sufficiently suppressing kTC noise by using feedback cannot be obtained.

In view of such problems, the inventor of the present invention attained an imaging device having a novel structure. One aspect of the present disclosure is outlined as the following items.

[Item 1]

An imaging device including:
a first pixel cell including
a first photoelectric converter, and
a first signal processing circuit that is electrically connected to the first photoelectric converter; and
a second pixel cell including
a second photoelectric converter, and
a second signal processing circuit that is electrically connected to the second photoelectric converter,
the first signal processing circuit including a first signal detection circuit that detects an electric signal generated in the first photoelectric converter, a capacitance circuit in which a first capacitive element and a second capacitive element having a larger capacitance value than the first capacitive element are connected in series with each other, and a first feedback circuit that forms a first feedback path for negatively feeding back the electric signal generated in the first photoelectric converter,
the first photoelectric converter including a first pixel electrode and a first photoelectric conversion region that is in contact with the first pixel electrode,
the first signal detection circuit including a first transistor that amplifies and outputs a signal voltage corresponding to the voltage of the first pixel electrode and a second transistor, a gate of the first transistor being connected to the first pixel electrode, and one of a source and a drain of the second transistor being connected to the first pixel electrode,
the first feedback circuit negatively feeding back the electric signal generated in the first photoelectric converter to the other one of the source and the drain of the second transistor,
the capacitance circuit being provided between the first pixel electrode and a reference voltage,
the second signal processing circuit including a second signal detection circuit that detects an electric signal generated in the second photoelectric converter, a third capacitive element one end of which is electrically connected to the second photoelectric converter, and a second feedback circuit that forms a second feedback path for negatively feeding back the electric signal,
the second photoelectric converter including a second pixel electrode and a second photoelectric conversion region that is in contact with the second pixel electrode,
the second signal detection circuit including a third transistor that amplifies and outputs a signal voltage corresponding to the voltage of the second pixel electrode and a fourth transistor, a gate of the third transistor being connected to the second pixel electrode, and one of a source and a drain of the fourth transistor being connected to the second pixel electrode, and
the second feedback circuit negatively feeding back the electric signal generated in the second photoelectric converter to the other one of the source and the drain of the fourth transistor.

According to the imaging device of Item 1, high-saturation and low-sensitivity imaging is achieved by using two pixel cells within each pixel.

[Item 2]

An imaging device including:
a first pixel cell including
a first photoelectric converter, and
a first signal processing circuit that is electrically connected to the first photoelectric converter; and
a second pixel cell including
a second photoelectric converter, and
a second signal processing circuit that is electrically connected to the second photoelectric converter,
the first signal processing circuit including a first signal detection circuit that detects an electric signal generated in the first photoelectric converter, a capacitance circuit in which a first capacitive element and a second capacitive element having a larger capacitance value than the first capacitive element are connected in series with each other, and a first feedback circuit that forms a first feedback path for negatively feeding back the electric signal generated in the first photoelectric converter, the first photoelectric converter including a first pixel electrode and a first photoelectric conversion region that is in contact with the first pixel electrode, the first signal detection circuit including a first transistor that amplifies and outputs a signal voltage corresponding to the voltage of the first pixel electrode, a second transistor, and a fifth transistor, a gate of the first transistor being connected to the first pixel electrode, one of a source and a drain of the second transistor being connected to the first pixel electrode, and one of a source and a drain of the fifth transistor being connected to the other one of the drain and the source of the second transistor, the first feedback circuit negatively feeding back the electric signal generated in the first photoelectric converter to the other one of the source and the drain of the fifth transistor, the capacitance circuit being provided between the first pixel electrode and a reference voltage, the second signal processing circuit including a second signal detection circuit that detects an electric signal generated in the second photoelectric converter, a third capacitive element one end of which is electrically connected to the second photoelectric converter, and a second feedback circuit that forms a second feedback path for negatively feeding back the electric signal, the second photoelectric converter including a second pixel electrode and a second photoelectric conversion region that is in contact with the second pixel electrode, the second signal detection circuit including a third transistor that amplifies and outputs a signal voltage corresponding to the voltage of the second pixel electrode and a fourth transistor, a gate of the third transistor being connected to the second pixel electrode, and one of a source and a drain of the fourth transistor being connected to the second pixel electrode, and the second feedback circuit negatively feeding back the electric signal generated in the second photoelectric converter to the other one of the source and the drain of the fourth transistor.

According to the imaging device of Item 2, high-saturation and low-sensitivity imaging is achieved by using two pixel cells within each pixel.

[Item 3]

The imaging device according to Item 1 or 2, wherein the first capacitive element is connected between the source and the drain of the second transistor.

According to the imaging device of Item 3, it is possible to improve noise suppression performance of the first pixel cell.

[Item 4]

The imaging device according to any one of Items 1 through 3, wherein the first feedback circuit includes, as part of the first feedback path, the first transistor and a first inverting amplifier and negatively feeds back the electric signal generated in the first photoelectric converter to the other one of the source and the drain of the second transistor via the first transistor and the first inverting amplifier; and the second feedback circuit includes, as part of the second feedback path, the third transistor and a second inverting amplifier and negatively feeds back the electric signal generated in the second photoelectric converter to the other one of the source and the drain of the fourth transistor via the third transistor and the second inverting amplifier.

According to the imaging device of Item 4, it is possible to suppress random noise in each pixel cell.

[Item 5]

The imaging device according to any one of Items 1 through 4, wherein the second capacitive element is connected to the source or the drain of the second transistor.

According to the imaging device of Item 5, it is possible to improve noise suppression performance of the first pixel cell.

[Item 6]

The imaging device according to any one of Items 1 through 5, wherein the first pixel cell includes a plurality of first pixel cells and the second pixel cell includes a plurality of second pixel cells, and the plurality of first pixel cells and the plurality of second pixel cells are one-dimensionally or two-dimensionally arranged.

According to the imaging device of Item 6, it is possible to provide an imaging device that can image a subject of a wide dynamic range without a time lag and without blown out highlights and blocked up shadows.

[Item 7]

The imaging device according to Item 6, wherein each of the plurality of first pixel cells and a corresponding one of the plurality of second pixel cells are adjacent to each other.

According to the imaging device of Item 7, high-saturation imaging and low-noise imaging are achieved by the same resolution.

[Item 8]

An imaging device including a plurality of pixels, each of the plurality of pixels including a first pixel cell including a first photoelectric converter and a first signal processing circuit that is electrically connected to the first photoelectric converter via a connection part, and a second pixel cell including a second photoelectric converter and a second signal processing circuit that is electrically connected to the second photoelectric converter via a connection part, the first photoelectric converter including a first pixel electrode and a first photoelectric conversion region that is in contact with the first pixel electrode, and the second photoelectric converter including a second pixel electrode and a second photoelectric conversion region that is in contact with the second pixel electrode, and the first signal processing circuit and the second signal processing circuit having different circuit configurations, and the first signal processing circuit having a configuration that reduces noise.

[Item 9]

The imaging device according to Item 8, wherein the first signal processing circuit includes a first signal detection circuit that detects an electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter;

the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode; and the first transistor and the third transistor or the second transistor and the fourth transistor have different sizes.

[Item 10]

The imaging device according to Item 8, wherein the first signal processing circuit includes a first signal detection circuit that detects an electric signal generated in the first photoelectric converter and a first feedback circuit that forms a first feedback path for negatively feeding back the electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter; and the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode.

[Item 11]

The imaging device according to Item 8, wherein the first signal processing circuit includes a first signal detection circuit that detects an electric signal generated in the first photoelectric converter and a first feedback circuit that forms a first feedback path for negatively feeding back the electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter and a second feedback circuit that forms a second feedback path for negatively feeding back the electric signal generated in the second photoelectric converter;

the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode; and sizes of the first transistor and the third transistor, sizes of the second transistor and the fourth transistor, or the first feedback circuit and the second feedback circuit are different from each other.

[Item 12]

The imaging device according to Item 8, wherein the first signal processing circuit includes a first signal detection circuit that detects an electric signal generated in the first photoelectric converter, a capacitance circuit in which a first capacitive element one end of which is electrically connected to the connection part and a second capacitive element having a larger capacitance value than the first capacitive element are connected in series with each other, and a first feedback circuit that forms a first feedback path for negatively feeding back the electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter; and the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode.

[Item 13]

The imaging device according to Item 8, wherein the first signal processing circuit includes a first signal detection circuit that detects an electric signal generated in the first photoelectric converter, a capacitance circuit in which a first capacitive element one end of which is electrically connected to the connection part and a second capacitive element having a larger capacitance value than the first capacitive element are connected in series with each other, and a first feedback circuit that forms a first feedback path for negatively feeding back the electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter and a second feedback circuit that forms a second feedback path for negatively feeding back the electric signal generated in the second photoelectric converter; and the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode.

[Item 14]

The imaging device according to Item 8, wherein the first signal processing circuit includes a first signal detection circuit that detects an electric signal generated in the first photoelectric converter, a capacitance circuit in which a first capacitive element one end of which is electrically connected to the connection part and a second capacitive element having a larger capacitance value than the first capacitive element are connected in series with each other, and a first feedback circuit that forms a first feedback path for negatively feeding back the electric signal generated in the first photoelectric converter;

the first signal detection circuit includes a first transistor that amplifies and outputs a signal voltage corresponding to a voltage of the first pixel electrode and a second transistor, a gate of the first transistor being connected to the first pixel electrode, and one of a source and a drain of the second transistor being connected to the first pixel electrode;

the second signal processing circuit includes a second signal detection circuit that detects an electric signal generated in the second photoelectric converter, a capacitance circuit in which a third capacitive element one end of which is electrically connected to the connection part and a fourth capacitive element having a larger capacitance value than the third capacitive element are connected in series with each other, and a second feedback circuit that forms a second feedback path for negatively feeding back the electric signal generated in the second photoelectric converter;

the second signal detection circuit includes a third transistor that amplifies and outputs a signal voltage corresponding to a voltage of the second pixel electrode and a fourth transistor, a gate of the third transistor being connected to the second pixel electrode, and one of a source and a drain of the fourth transistor being connected to the second pixel electrode; and sizes of the first transistor and the third transistor, sizes of the second transistor and the fourth transistor, the first feedback circuit and the second feedback circuit, the first capacitive element and the third capacitive element, or the second capacitive element and the fourth capacitive element are different from each other.

[Item 15]
The imaging device according to any one of Items 8 through 14, wherein
the second signal processing circuit includes a fifth capacitive element one end of which is electrically connected to the second photoelectric converter.

[Item 16]
The imaging device according to any one of Items 12 through 15, wherein
the first capacitive element is connected between the source and the drain of the second transistor.

[Item 17]
The imaging device according to any one of Items 12 through 16, wherein
the second capacitive element is connected between the one of the source and the drain of the second transistor and a reference voltage.

[Item 18]
The imaging device according to Item 14, wherein
the third capacitive element is connected between the source and the drain of the fourth transistor.

[Item 19]
The imaging device according to any one of Items 14 and 16 through 18, wherein
the fourth capacitive element is connected between the one of the source and the drain of the fourth transistor and a reference voltage.

[Item 20]
The imaging device according to any one of Items 8 through 19, wherein
the first feedback circuit includes, as part of the first feedback path, the first transistor and a first inverting amplifier and negatively feeds back the electric signal generated in the first photoelectric converter to the other one of the source and the drain of the second transistor via the first transistor and the first inverting amplifier; and the second feedback circuit includes, as part of the second feedback path, the third transistor and a second inverting amplifier and negatively feeds back the electric signal generated in the second photoelectric converter to the other one of the source and the drain of the fourth transistor via the third transistor and the second inverting amplifier.

[Item 21]
The imaging device according to any one of Items 8 through 20, wherein
the first feedback circuit includes, as part of the first feedback path, the first transistor and negatively feeds back the electric signal generated in the first photoelectric converter to the other one of the source and the drain of the second transistor; and the second feedback circuit includes, as part of the second feedback path, the third transistor and negatively feeds back the electric signal generated in the second photoelectric converter to the other one of the source and the drain of a fourth transistor via the third transistor.

[Item 22]
The imaging device according to any one of Items 8 through 19, wherein
the first feedback circuit includes, as part of the first feedback path, a seventh transistor that determines selection or non-selection of output of the first transistor in addition to the first transistor and negatively feeds back the electric signal generated in the first photoelectric converter to the other one of a source and a drain of a fifth transistor that limits a bandwidth of the first feedback circuit via the first transistor and the seventh transistor; and the second feedback circuit includes, as part of the second feedback path, an eighth transistor that determines selection or non-selection of output of the third transistor in addition to the third transistor and negatively feeds back the electric signal generated in the second photoelectric converter to the other one of a source and a drain of a sixth transistor that limits a bandwidth of the second feedback circuit via the third transistor and the eighth transistor.

[Item 23]
The imaging device according to any one of Items 8 through 19, wherein
the first feedback circuit does not include the first transistor as part of the first feedback path and negatively feeds back the electric signal generated in the first photoelectric converter via the one of the source and the drain of the second transistor and the gate of the second transistor; and the second feedback circuit includes, as part of the second feedback path, the third transistor and negatively feeds back the electric signal generated in the second photoelectric converter to the other one of a source and a drain of a sixth transistor via the third transistor.

[Item 24]
The imaging device according to Item 8, wherein
the second signal processing circuit includes a second signal detection circuit that detects an electric signal generated in the second photoelectric converter; and the second signal detection circuit includes a fourteenth transistor that is connected between the second pixel electrode and an output of the first photoelectric converter.

[Item 25]
The imaging device according to any one of Items 8 through 24, wherein
the second signal processing circuit includes a fifth capacitive element connected to the second pixel electrode.

[Item 26]
The imaging device according to any one of Items 8 through 25, wherein a gate width of the first transistor is larger than that of the third transistor or a gate length of the second transistor is longer than that of the fourth transistor.

[Item 27]

The imaging device according to any one of Items 8 through 26, wherein the first pixel cell includes a plurality of first pixel cells and the second pixel cell includes a plurality of second pixel cells, and the plurality of first pixel cells and the plurality of second pixel cells are one-dimensionally or two-dimensionally arranged.

[Item 28]

The imaging device according to Item 27, wherein each of the first pixel cells and a corresponding one of the second pixel cells are adjacent to each other.

[Item 29]

The imaging device according to any one of Items 8 through 28, wherein the first pixel cell accumulates therein a first electric charge generated in the first photoelectric converter;

the second pixel cell accumulates therein a second electric charge generated in the second photoelectric converter; and a period of accumulation of the second electric charge in the second pixel cell is longer than that of the first electric charge in the first pixel cell.

[Item 30]

A camera system including:

the imaging device according to any one of Items 1 through 29;

an optical system that forms an image of a subject on the imaging device; and a signal processing unit that performs signal processing.

[Item 31]

An imaging device including:

a first pixel cell including a first photoelectric converter that generates a first signal by photoelectric conversion, and a first signal detection circuit that is electrically connected to the first photoelectric converter and detects the first signal; and a second pixel cell including a second photoelectric converter that generates a second signal by photoelectric conversion, a second reset transistor one of a source and a drain of which is electrically connected to the second photoelectric converter, the other of the source and the drain of the second reset transistor being electrically connected to the first photoelectric converter, and a first capacitive element one end of which is electrically connected to the second photoelectric converter, the other end of the first capacitive element being set to a reference voltage.

[Item 32]

The imaging device according to Item 31, further including a first feedback circuit including an inverting amplifier, wherein the first photoelectric converter includes a first pixel electrode and a first photoelectric conversion region that is in contact with the first pixel electrode, the first signal detection circuit includes a first amplifier transistor that detects the first signal and a first reset transistor that resets the first signal, a gate of the first amplifier transistor being electrically connected to the first pixel electrode, one of a source and a drain of the first reset transistor being electrically connected to the first pixel electrode, and the first feedback circuit forms a feedback path for negatively feeding back a voltage of the first pixel electrode via the first amplifier transistor, the inverting amplifier, and the first reset transistor.

[Item 33]

The imaging device according to Item 32, wherein the first signal detection circuit further includes a first capacitive element, a second capacitive element having a larger capacitance value than the first capacitive element, and a first band control transistor;

one end of the first capacitive element is electrically connected to the first pixel electrode;

one end of the second capacitive element is electrically connected to the other end of the first capacitive element, the other end of the second capacitive element is set to a reference voltage;

one of a source and a drain of the first band control transistor is connected to the other end of the first capacitive element; and the first feedback circuit forms a feedback path for negatively feeding back a voltage of the first pixel electrode via the first amplifier transistor, the inverting amplifier, the first band control transistor, and the first capacitive element.

[Item 34]

The imaging device according to Item 33, wherein the other one of the source and the drain of the first reset transistor is electrically connected to the one of the source and the drain of the first band control transistor.

[Item 35]

The imaging device according to Item 33, wherein the other one of the source and the drain of the first reset transistor is electrically connected to the other one of the source and the drain of the first band control transistor.

[Item 36]

The imaging device according to Item 31, further including a first feedback circuit, wherein the first photoelectric converter includes a first pixel electrode and a first photoelectric conversion region that is in contact with the first pixel electrode, the first signal detection circuit includes a first amplifier transistor that detects the first signal, a first reset transistor that resets the first signal, a first capacitive element, a second capacitive element having a larger capacitance value than the first capacitive element, and a first band control transistor;

a gate of the first amplifier transistor is electrically connected to the first pixel electrode;

one of a source and a drain of the first reset transistor is electrically connected to the first pixel electrode;

one end of the first capacitive element is electrically connected to the first pixel electrode;

one of the second capacitive element is electrically connected to the other end of the first capacitive element, the other end of the second capacitive element is set to a reference voltage;

one of a source and a drain of the first band control transistor is connected to the other end of the first capacitive element;

one of a source and a drain of the first amplifier transistor is electrically connected to the other one of the source and the drain of the first band control transistor, and the first feedback circuit forms a feedback path for negatively feeding back a voltage of the first pixel electrode via the first amplifier transistor, the first band control transistor, and the first capacitive element.

[Item 37]

The imaging device according to Item 36, wherein the other one of the source and the drain of the first reset transistor is electrically connected to the one of the source and the drain of the first band control transistor.

[Item 38]

The imaging device according to Item 36, wherein the other one of the source and the drain of the first reset transistor is electrically connected to the other one of the source and the drain of the first band control transistor.

[Item 39]

The imaging device according to Item 31, further including a first feedback circuit, wherein the first photoelectric converter includes a first pixel electrode and a first photoelectric conversion region that is in contact with the first pixel electrode, the first signal detection circuit includes a first amplifier transistor that detects the first signal, a first reset transistor that resets the first signal, a first capacitive element, a second capacitive element having a larger capacitance value than the first capacitive element, a first band control transistor, and a first selection transistor;

a gate of the first amplifier transistor is electrically connected to the first pixel electrode;

one of a source and a drain of the first reset transistor is electrically connected to the first pixel electrode;

one end of the first capacitive element is electrically connected to the first pixel electrode;

one of the second capacitive element is electrically connected to the other end of the first capacitive element, the other end of the second capacitive element is set to a reference voltage;

one of a source and a drain of the first band control transistor is connected to the other end of the first capacitive element;

one of a source and a drain of the first selection transistor is electrically connected to one of a source and a drain of the first amplifier transistor;

the other one of the source and the drain of the first selection transistor is electrically connected to the other one of the source and the drain of the first band control transistor, and the first feedback circuit forms a feedback path for negatively feeding back a voltage of the first pixel electrode via the first amplifier transistor, the first selection transistor, the first band control transistor, and the first capacitive element.

[Item 40]

The imaging device according to Item 30, wherein the other one of the source and the drain of the first reset transistor is electrically connected to the one of the source and the drain of the first band control transistor.

[Item 41]

The imaging device according to Item 39, wherein the other one of the source and the drain of the first reset transistor is electrically connected to the other one of the source and the drain of the first band control transistor.

[Item 42]

The imaging device according to Item 31, wherein the first photoelectric converter includes a first pixel electrode and a first photoelectric conversion region that is in contact with the first pixel electrode;

the first signal detection circuit includes a first amplifier transistor that detects the first signal, a first reset transistor that resets the first signal, a first capacitive element, a second capacitive element having a larger capacitance value than the first capacitive element, a first band control transistor, and a first feedback circuit;

a gate of the first amplifier transistor is electrically connected to the first pixel electrode;

one of a source and a drain of the first reset transistor is electrically connected to the first pixel electrode;

one end of the first capacitive element is electrically connected to the first pixel electrode;

one of the second capacitive element is electrically connected to the other end of the first capacitive element, the other end of the second capacitive element is set to a reference voltage;

one of a source and a drain of the first band control transistor is connected to the other end of the first capacitive element;

a gate of the first band control transistor is electrically connected to the first pixel electrode, and the first feedback circuit forms a feedback path for negatively feeding back a voltage of the first pixel electrode via the first band control transistor and the first capacitive element.

[Item 43]

The imaging device according to Item 42, wherein the other one of the source and the drain of the first reset transistor is electrically connected to the one of the source and the drain of the first band control transistor.

[Item 44]

The imaging device according to Item 42, wherein the other one of the source and the drain of the first reset transistor is electrically connected to the other one of the source and the drain of the first band control transistor.

According to one aspect of the present disclosure, two pixel cells having different configurations can be provided in each pixel. A first pixel cell requires low-noise characteristics, but does not require high-saturation characteristics. "Low-noise high-sensitivity imaging" is achieved by the first pixel cell. The second pixel cell requires high-saturation characteristics, but does not require low-noise characteristics since the second pixel cell is in charge of imaging of a bright scene where a light amount is large and the influence of shot noise is large. "High-saturation low-sensitivity imaging" is achieved by the second pixel cell. It is therefore possible to image even a subject having a larger difference in brightness without blown out highlights and blocked up shadows than a conventional art. That is, more desirable pixel cell characteristics as illustrated in FIG. 2 can be achieved. Furthermore, according to the present configuration, high-sensitivity imaging and low-sensitivity imaging are concurrently achieved by two pixel cells. It is therefore possible to prevent a time lag between the high-sensitivity imaging and the low-sensitivity imaging.

Embodiments of the present disclosure are described below in detail with reference to the drawings. Each of the embodiments described below illustrates a general or specific example. Numerical values, shapes, materials, constituent elements, ways in which the constituent elements are arranged and connected, steps, the order of steps, and the like in the embodiments below are examples and do not limit the present disclosure. Various aspects described herein can be combined as long as no contradiction occurs. Among constituent elements in the embodiments described below, constituent elements that are not described in independent claims that indicate the highest concepts are described as optional constituent elements. In the following description, constituent elements having substantially the same functions are given identical reference signs, and description thereof is sometimes omitted.

First Embodiment

A structure of an imaging device 100 according to the present embodiment is described below with reference to FIGS. 4 through 6B. The following describes an example of a structure using a p-type silicon substrate as a semiconductor substrate. An example in which a hole is used as a signal electric charge is illustrated below. Note that an electron may be used as a signal electric charge.

Structure of Imaging Device 100

Figure 4:
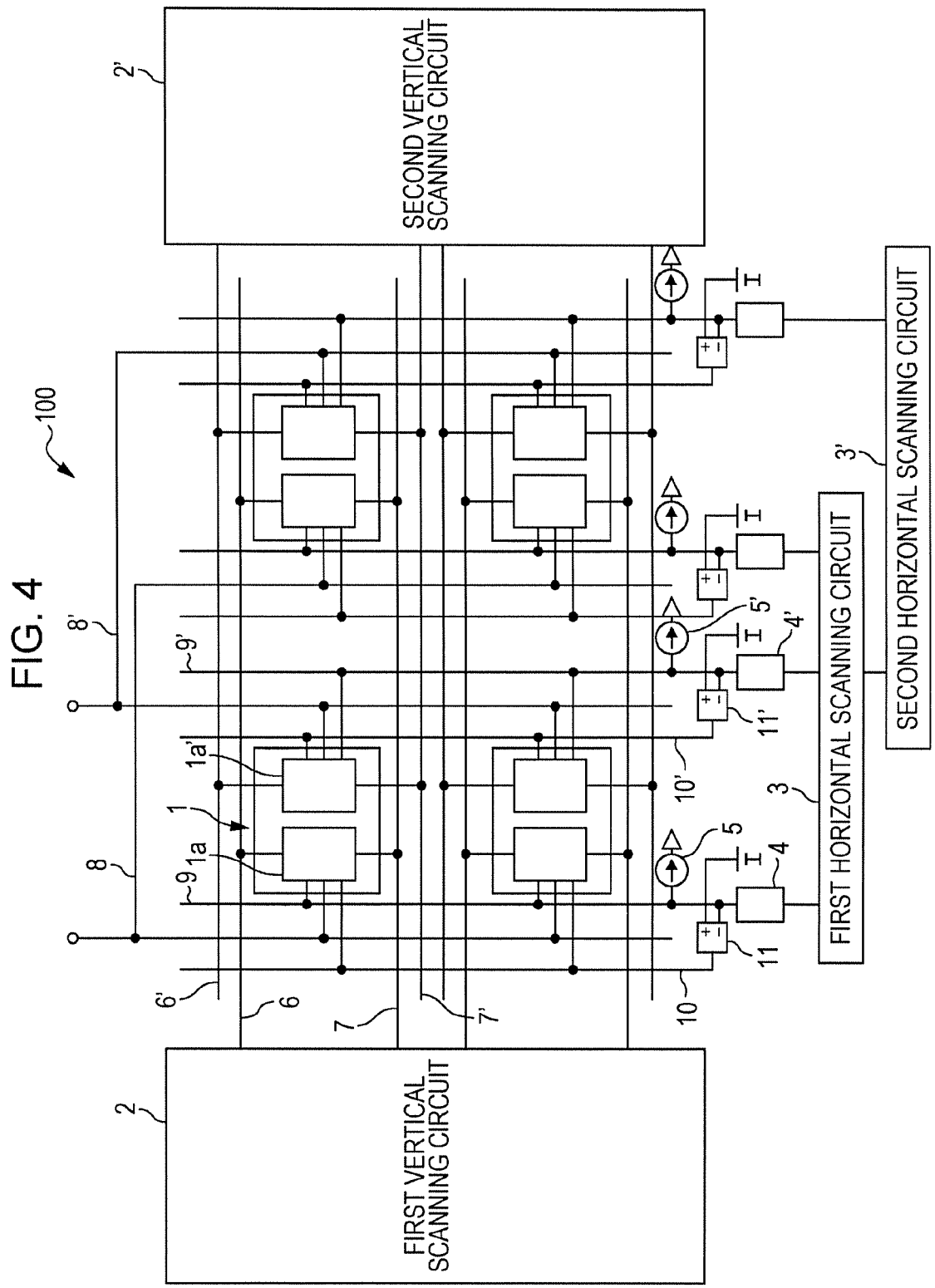
FIG. 4 is a block diagram schematically illustrating an example of a structure of an imaging device.

FIG. 4 schematically illustrates an example of the structure of the imaging device 100. The imaging device 100 includes a plurality of unit pixels 1 that are two-dimensionally arranged. Millions of unit pixels 1 can be two-dimensionally arranged actually, but FIG. 4 illustrates only unit pixels 1 that are arranged in a 2×2 matrix. The imaging device 100 may be a line sensor. In this case, the plurality of unit pixels 1 may be arranged one-dimensionally (in a row direction or a column direction).

Each of the unit pixels 1 includes a first pixel cell 1a and a second pixel cell 1a'. The first pixel cell 1a is an pixel cell that copes with low noise, and the second pixel cell 1a' is an pixel cell that copes with high saturation. Typically, the first pixel cell 1a functions as an pixel cell for high sensitivity, and the second pixel cell 1a' functions as an pixel cell for low sensitivity. The imaging device 100 includes, for the first pixel cell 1a, a plurality of reset signal lines 6 and a plurality of address signal lines 7 that are disposed in respective rows and a plurality of vertical signal lines 9, a power source wire 8, and a plurality of feedback signal lines 10 that are disposed in respective columns. Furthermore, the imaging device 100 includes, for the second pixel cell 1a', a plurality of reset signal lines 6' and a plurality of address signal lines 7' that are disposed in the respective rows and a plurality of vertical signal lines 9', a power source wire 8', and a plurality of feedback signal lines 10' that are disposed in the respective columns.

In the imaging device 100, a first peripheral circuit that processes a signal from the first pixel cell 1a and a second peripheral circuit that processes a signal from the second pixel cell 1a' are separately provided. The first peripheral circuit includes a first vertical scanning circuit 2, a first horizontal scanning circuit 3, a first inverting amplifier 11, a first column AD conversion circuit 4, and an electric current source 5, and the second peripheral circuit includes a second vertical scanning circuit 2', a second horizontal scanning circuit 3', a second inverting amplifier 11', a second column AD conversion circuit 4', and a second electric current source 5'.

As to the first pixel cell 1a, the first vertical scanning circuit 2 controls the plurality of reset signal lines 6 and the plurality of address signal lines 7. The vertical signal lines 9 are connected to the first horizontal scanning circuit 3 and transmit a pixel signal to the first horizontal scanning circuit 3. The power source wire 8 supplies a power source voltage (e.g., VDD) to all of the unit pixels 1a. The feedback signal lines 10 transmit a feedback signal from the inverting amplifier 11 that will be described later to the first pixel cells 1a of the unit pixels 1. As for the second pixel cell 1a', various signal lines are arranged and controlled by the circuits in a manner similar to the first pixel cell 1a. Note, however, that the reset signal lines 6 and 6' and the address signal lines 7 and 7' of the first pixel cell 1a and the second pixel cell 1a' can be replaced with a reset signal line and an address signal line that are shared by the first pixel cell 1a and the second pixel cell 1a' depending on the pixel configuration. Furthermore, the feedback signal lines 10 and 10' and the first inverting amplifier 11 and the second inverting amplifier 11' can be replaced with a feedback signal line and an inverting amplifier that are shared by the first pixel cell 1a and the second pixel cell 1a' or can be omitted depending on the pixel configuration. Furthermore, the first vertical scanning circuit 2 and the second vertical scanning circuit 2' and the first horizontal scanning circuit 3 and the second horizontal scanning circuit 3' can also be replaced with a vertical scanning circuit and a horizontal scanning circuit that are shared by the first pixel cell 1a and the second pixel cell 1a' accordingly depending on the pixel configuration.

Circuit Configuration of First and Second Pixel Cells 1a and 1a'

Figure 6A:
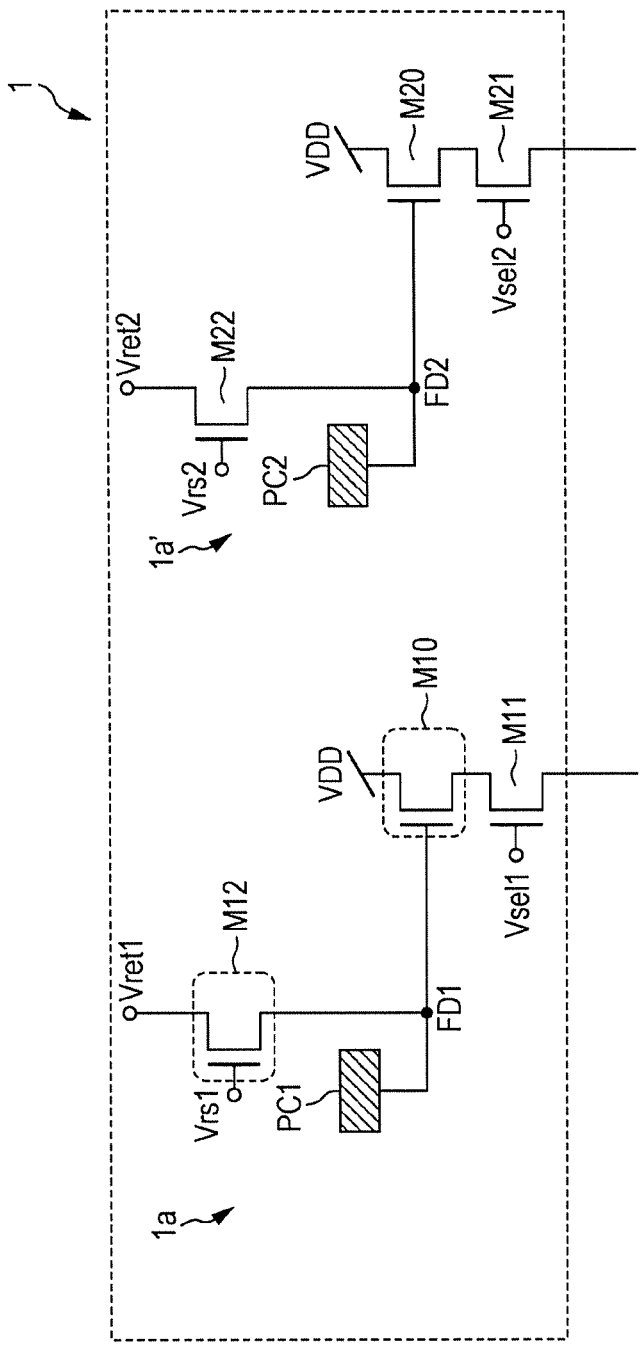
FIG. 6A is a schematic view illustrating a circuit configuration of a unit pixel according to exemplary First Embodiment.

Next, an example of a circuit configuration of the first and second pixel cells 1a and 1a' (the unit pixel 1) is described with reference to FIGS. 5 and 6A.

FIG. 5 illustrates first and second signal processing circuits P1 and P2 in the unit pixel 1. FIG. 6A illustrates an example of a circuit configuration of the unit pixel 1 according to the present embodiment.

The unit pixel 1 includes the first pixel cell 1a and the second pixel cell 1a'. The first pixel cell 1a functions as a low-noise cell. The first pixel cell 1a includes a first photoelectric converter PC1 that converts light into an electric signal and the first signal processing circuit P1 that is electrically connected to the first photoelectric converter PC1 and reads out the electric signal generated in the first photoelectric converter PC1. The first photoelectric converter PC1 includes a first pixel electrode E1 and a first photoelectric conversion region D1 that is in contact with the first pixel electrode E1.

The first signal processing circuit P1 includes a first signal detection circuit that detects the electric signal generated in the first photoelectric converter PC1. The first signal detection circuit includes a first amplifier transistor M10, a first selection transistor M11, and a first reset transistor M12. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M12 is connected to a readout node FD1. The first reset transistor M12 resets (initializes) the readout node FD1 connected to the first pixel electrode E1 of the first photoelectric converter PC1.

The second pixel cell 1a' functions as a high-saturation cell. The second pixel cell 1a' includes a second photoelectric converter PC2 that converts light into an electric signal and the second signal processing circuit P2 that is electrically connected to the second photoelectric converter PC2 and reads out the electric signal generated in the second photoelectric converter PC2. The second photoelectric converter PC2 includes a second pixel electrode E2 and a second photoelectric conversion region D2 that is in contact with the second pixel electrode E2.

The second signal processing circuit P2 includes a second signal detection circuit that detects the electric signal generated in the second photoelectric converter PC2. The second signal detection circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated in the second photoelectric converter PC2. One of a source and a drain of the second selection transistor M21 is connected to one of a source and a drain of the second amplifier transistor M20. The second selection transistor M20 selectively outputs the signal amplified by the second amplifier transistor M20. One of a source and a drain of the second reset transistor M22 is connected to a readout node FD2. The second reset transistor M22 resets (initializes) the readout node FD2 connected to the second pixel electrode E2 of the second photoelectric converter PC2.

The first photoelectric converter PC1 of the first pixel cell 1a is configured to take in a larger amount of light per unit time than the second photoelectric converter PC2 of the second pixel cell 1a'. For example, the first photoelectric converter PC1 of the first pixel cell 1a may be disposed on an optical axis of a light collecting lens. Furthermore, for example, the first photoelectric converter PC1 of the first pixel cell 1a may be larger in area in a plan view than the second photoelectric converter PC2 of the second pixel cell 1a'.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene.

In the present embodiment, a gate width of the first amplifier transistor M10 is larger than that of the second amplifier transistor M20. This makes it possible to set gm of the first amplifier transistor M10 large. As a result, it is possible to reduce readout noise of the first pixel cell 1a. Meanwhile, low-noise characteristics of the second pixel cell 1a' do not pose a problem even in a case where the low-noise characteristics are equivalent to conventional ones. A gate length of the first reset transistor M12 is longer than that of the second reset transistor M22. This improves the noise reducing effect of the first pixel cell 1a. Meanwhile, low-noise characteristics of the second pixel cell 1a' do not pose a problem even in a case where the low-noise characteristics are equivalent to conventional ones.

Figure 6B:
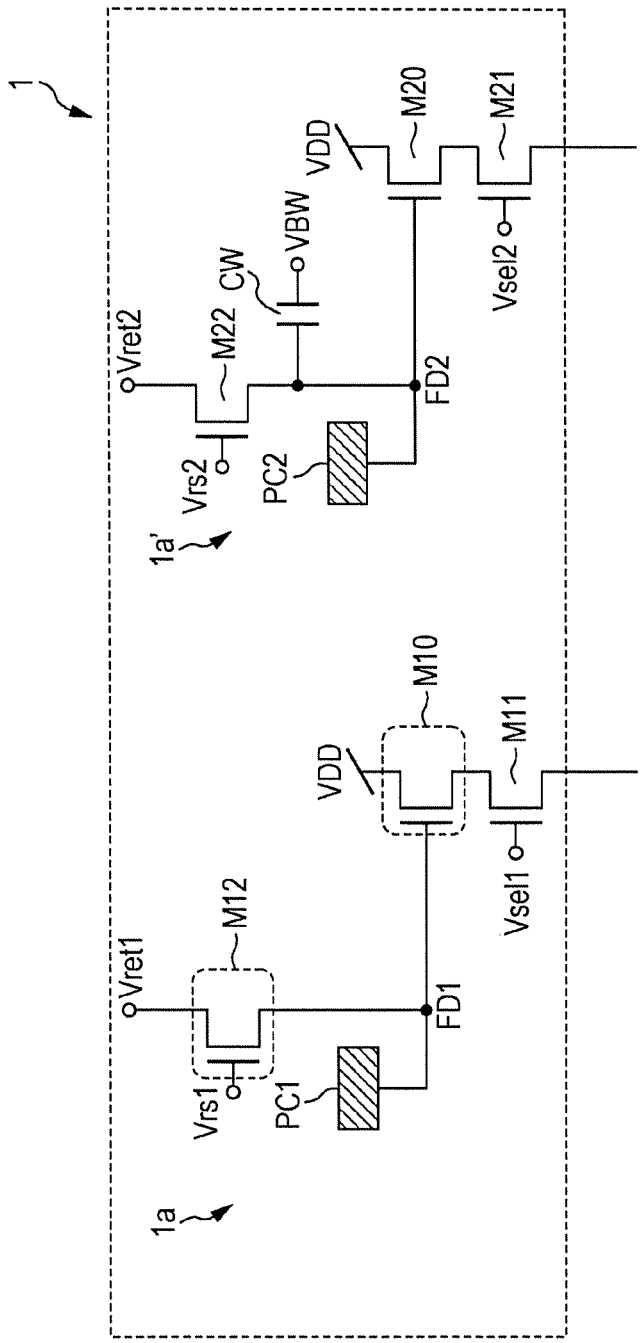
FIG. 6B is a schematic view illustrating another circuit configuration of the unit pixel according to exemplary First Embodiment.

FIG. 6B illustrates another example of a circuit configuration of the unit pixel 1 according to the present embodiment. As illustrated in FIG. 6B, a fifth capacitive element CW that is electrically connected between the second photoelectric converter PC2 and a reference voltage VBW is provided. This makes it possible to improve the high-saturation characteristics of the second pixel cell 1a' by a degree corresponding to a capacitance ratio. As a result, it is possible to further widen a dynamic range. The reference sign "P1" of the first signal processing circuit and the reference sign "P2" of the second signal processing circuit are omitted in FIG. 6B and the subsequent drawings and are used only in the specification.

According to the present embodiment, it is possible to prevent an unnecessary increase in pixel size. Furthermore, according to the present embodiment, it is possible to provide a small imaging device in which low-noise high-sensitivity imaging is achieved by the first pixel cell 1a and high-saturation low-sensitivity imaging is achieved by the second pixel cell 1a'. Furthermore, according to the present embodiment, a subject having a large difference in brightness can be imaged without a time lag and without blown out highlights and blocked up shadows.

Second Embodiment

An example of a circuit configuration of a unit pixel 1 according to Second Embodiment is described with reference to FIGS. 7 through 10.

Figure 7:
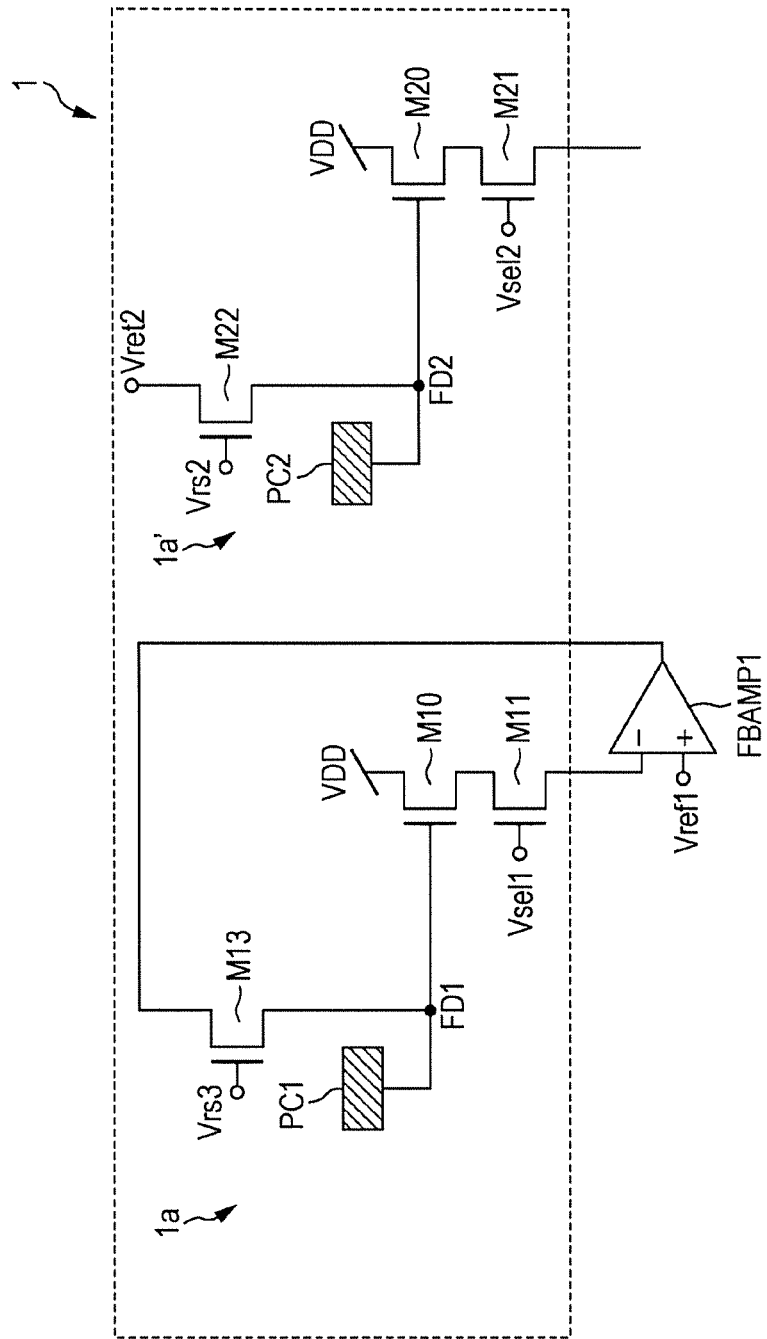
FIG. 7 is a schematic view illustrating a circuit configuration of a unit pixel according to exemplary Second Embodiment.

FIG. 7 illustrates an example of a circuit configuration of the unit pixel 1 according to the present embodiment. The unit pixel 1 includes a first pixel cell 1a and a second pixel cell 1a'. The first pixel cell 1a functions as a low-noise cell. The first pixel cell 1a includes a first photoelectric converter PC1 that converts light into an electric signal and a first signal processing circuit P1 that is electrically connected to the first photoelectric converter PC1 and reads out the electric signal generated in the first photoelectric converter PC1.

The first signal processing circuit P1 includes a first signal detection circuit that detects the electric signal generated in the first photoelectric converter PC1. The first signal detection circuit includes a first amplifier transistor M10, a first selection transistor M11, a first reset transistor M13, and a first feedback circuit. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to a source and a drain of the first amplifier transistor M10. The first amplifier transistor M10 selectively outputs the signal amplified by the first amplifier transistor M10. One of a source and a drain of the first reset transistor M13 is connected to a readout node FD1. The first reset transistor M13 resets (initializes) the readout node FD1 connected to a first pixel electrode of the first photoelectric converter PC1.

The first feedback circuit has a first inverting amplifier FBAMP1 and forms a first feedback path for negative feedback of kTC noise that occurs when the first reset transistor M13 is turned off. Gain of the first feedback path can be increased and a noise suppressing effect can be improved by the first inverting amplifier FBAMP1. The first inverting amplifier FBAMP1 corresponds to the first inverting amplifier 11 in FIG. 4.

The second pixel cell 1a' functions as a high-saturation cell. The second pixel cell 1a' includes a second photoelectric converter PC2 that converts light into an electric signal and a second signal processing circuit P2 that is electrically connected to the second photoelectric converter PC2 and reads out the electric signal generated in the second photoelectric converter PC2.

The second signal processing circuit P2 includes a second signal detection circuit that detects the electric signal generated in the second photoelectric converter PC2. The second signal detection circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated in the second photoelectric converter PC2. One of a source and a drain of the second selection transistor M21 is connected to one of a source and a drain of the second amplifier transistor M20. The second selection transistor M21 selectively outputs the signal amplified by the second amplifier transistor M20. The second reset transistor M22 is connected to a readout node FD2 and resets (initializes) the readout node FD2 connected to a second pixel electrode of the second photoelectric converter PC2.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene.

Since the first pixel cell 1a includes the first feedback circuit, the first pixel cell 1a can markedly suppress noise that occurs when the first reset transistor M13 is turned off. Meanwhile, noise characteristics of the second pixel cell 1a' do not pose a problem even in a case where the noise characteristics are equivalent to conventional ones. Note that a method for suppressing noise will be described later. A gate width of the first amplifier transistor M10 may be larger than that of the second amplifier transistor M20. This makes it possible to set gm of the first amplifier transistor M10 large. As a result, it is possible to reduce readout noise of the first pixel cell 1a. Meanwhile, noise characteristics of the second pixel cell 1a' do not pose a problem even in a case where the noise characteristics are equivalent to conventional ones. A gate length of the first reset transistor M13 may be longer than that of the second reset transistor M22. This further improves the noise reducing effect of the first pixel cell 1a. The noise characteristics of the second pixel cell 1a' do not pose a problem even in a case where the noise characteristics are equivalent to conventional ones.

Figure 8:
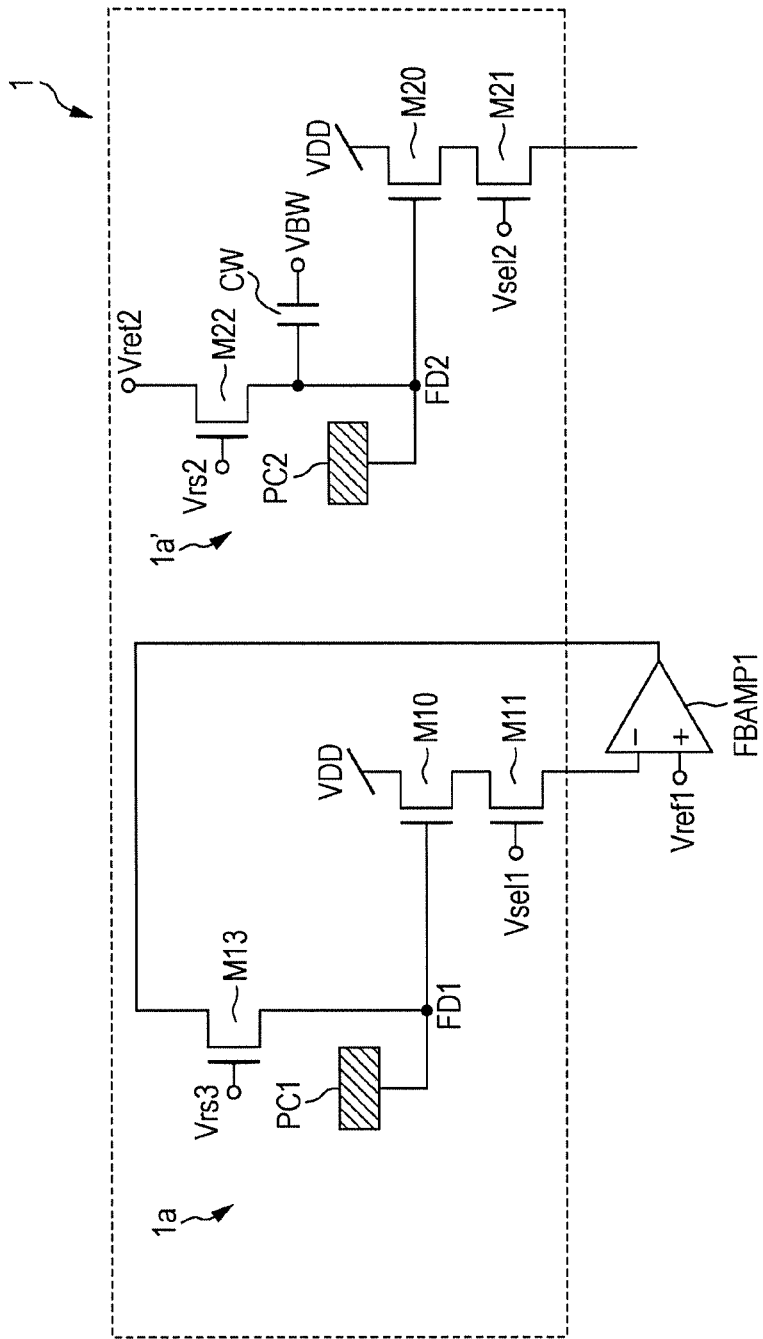
FIG. 8 is a schematic view illustrating another circuit configuration of the unit pixel according to exemplary Second Embodiment.

FIG. 8 illustrates another example of a circuit configuration of the unit pixel 1 according to the present embodiment. As illustrated in FIG. 8, a fifth capacitive element CW that is electrically connected between the second photoelectric converter PC2 and a reference voltage VBW is provided. This makes it possible to improve the high-saturation characteristics of the second pixel cell 1a' by a degree corresponding to a capacitance ratio. As a result, it is possible to further widen a dynamic range.

According to the present embodiment, it is possible to suppress an unnecessary increase in pixel size. Furthermore, according to the present embodiment, it is possible to provide a small imaging device in which low-noise high-sensitivity imaging is achieved by the first pixel cell 1a and high-saturation low-sensitivity imaging is achieved by the second pixel cell 1a'. Furthermore, according to the present embodiment, a subject having a large difference in brightness can be imaged without a time lag and without blown out highlights and blocked up shadows.

Still other examples of a circuit configuration of the unit pixel 1 according to the present embodiment are described with reference to FIGS. 9A through 9N. The same effects as those described above can be obtained by using any of the circuit configurations.

Figure 9A:
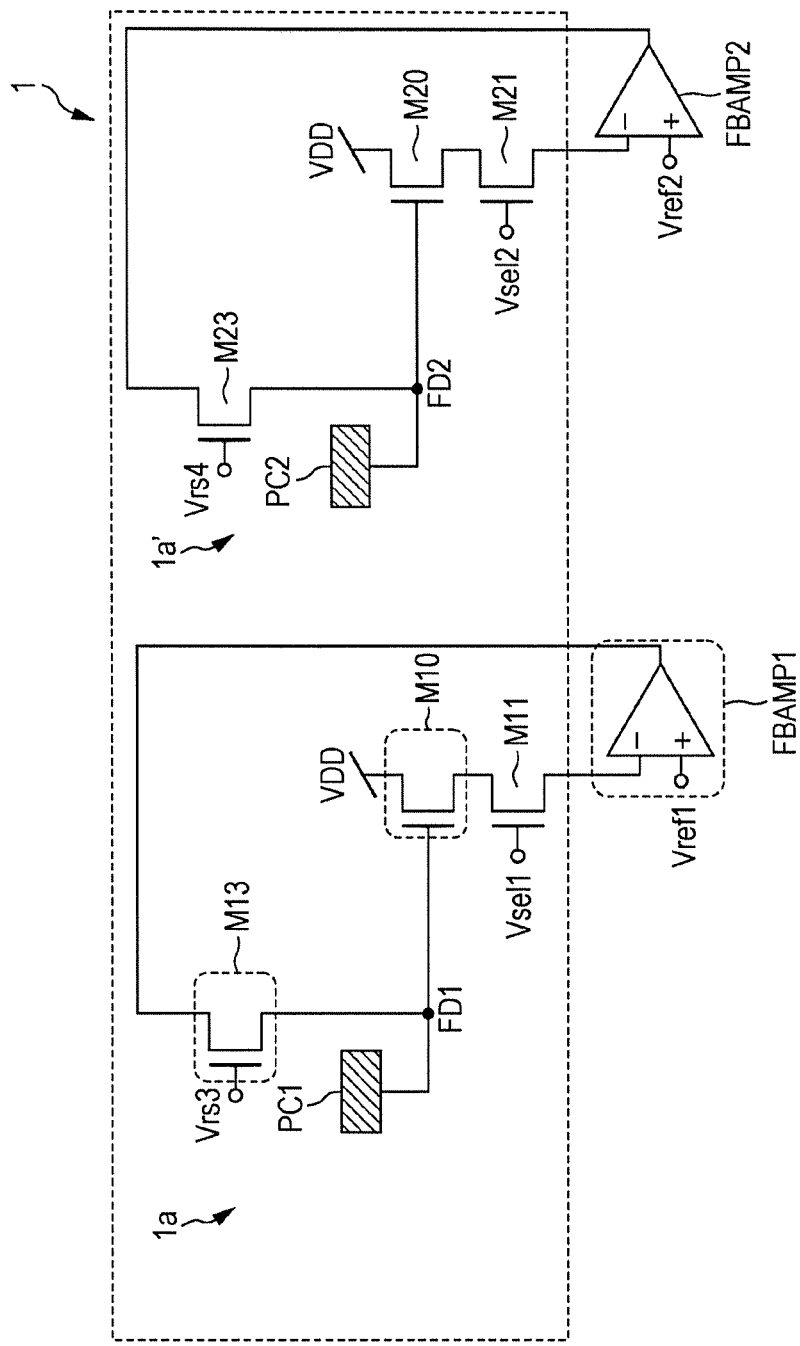
FIG. 9A is a schematic view illustrating still another circuit configuration of the unit pixel according to exemplary Second Embodiment.
Figure 9B:
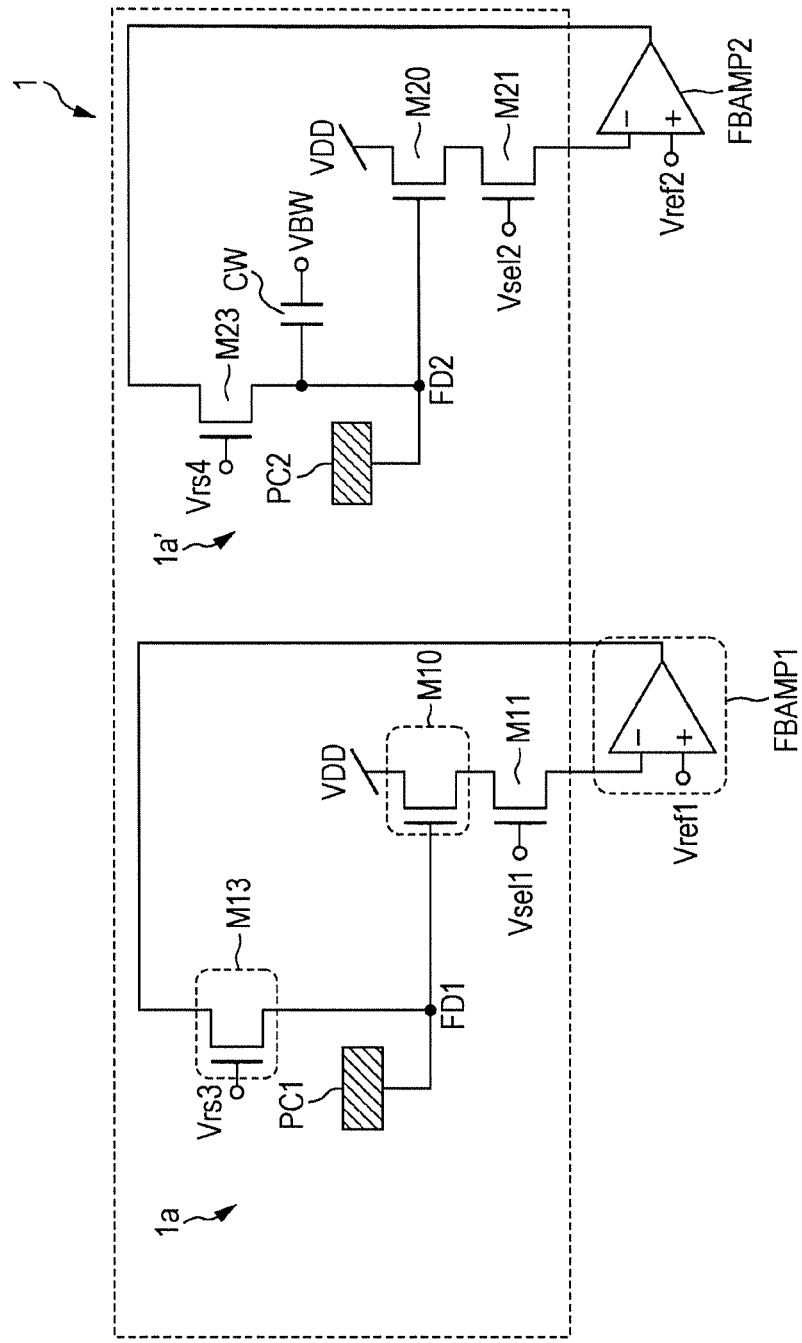
FIG. 9B is a schematic view illustrating still another circuit configuration of the unit pixel according to exemplary Second Embodiment.
Figure 9C:
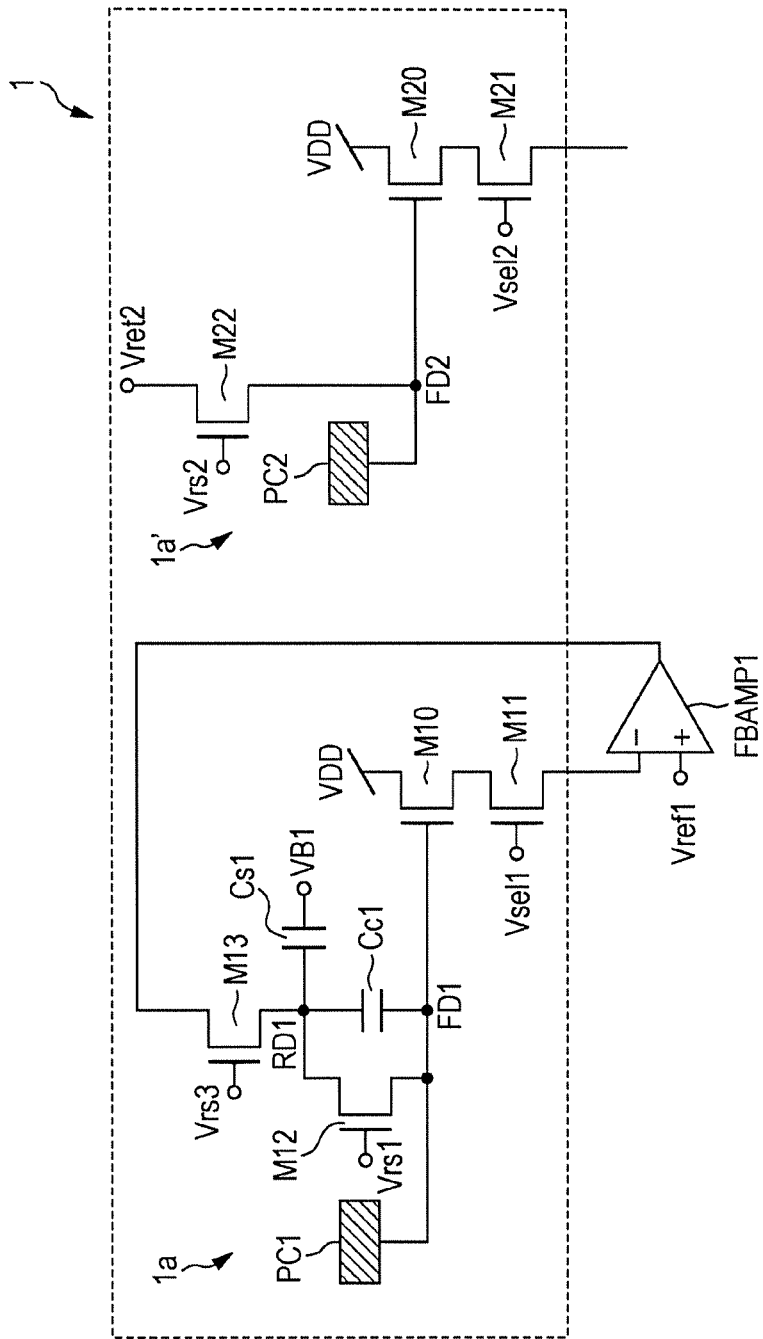
FIG. 9C is a schematic view illustrating still another circuit configuration of the unit pixel according to exemplary Second Embodiment.
Figure 9D:
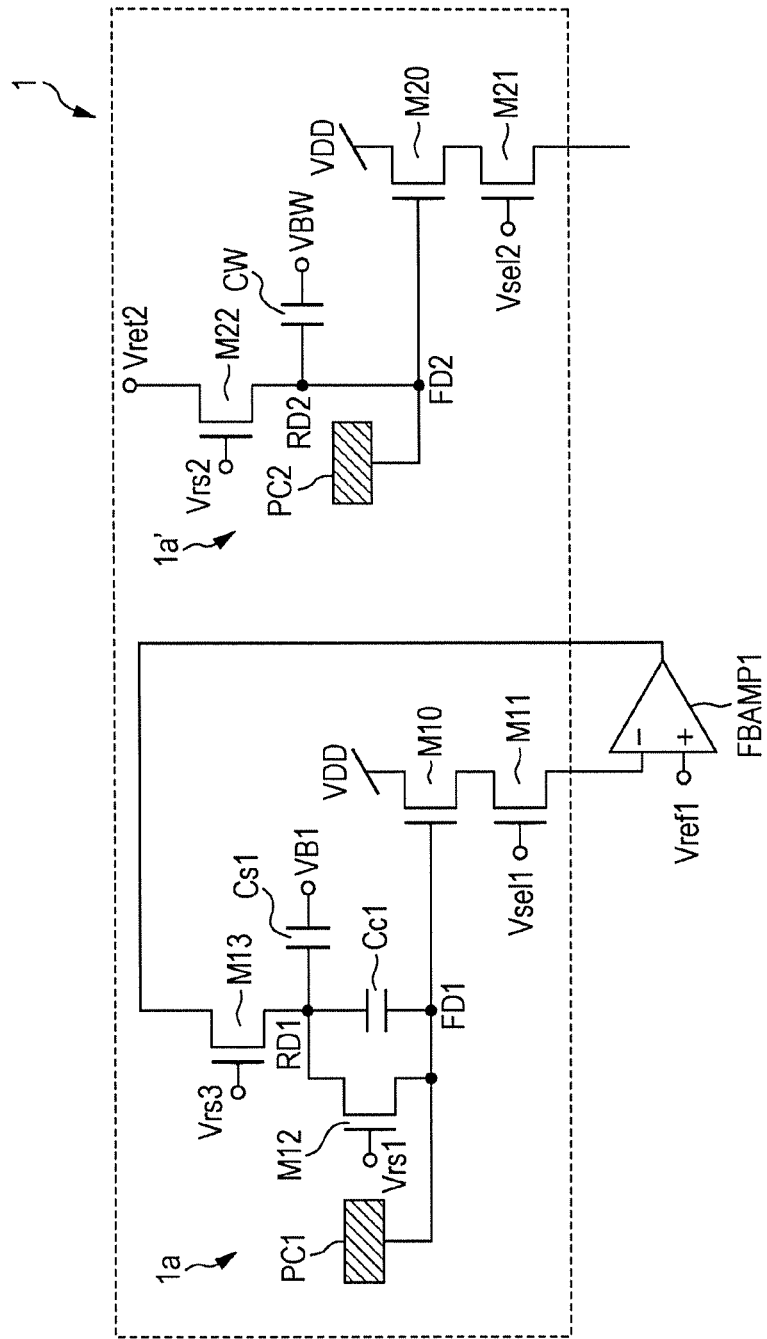
FIG. 9D is a schematic view illustrating still another circuit configuration of the unit pixel according to exemplary Second Embodiment.
Figure 9E:
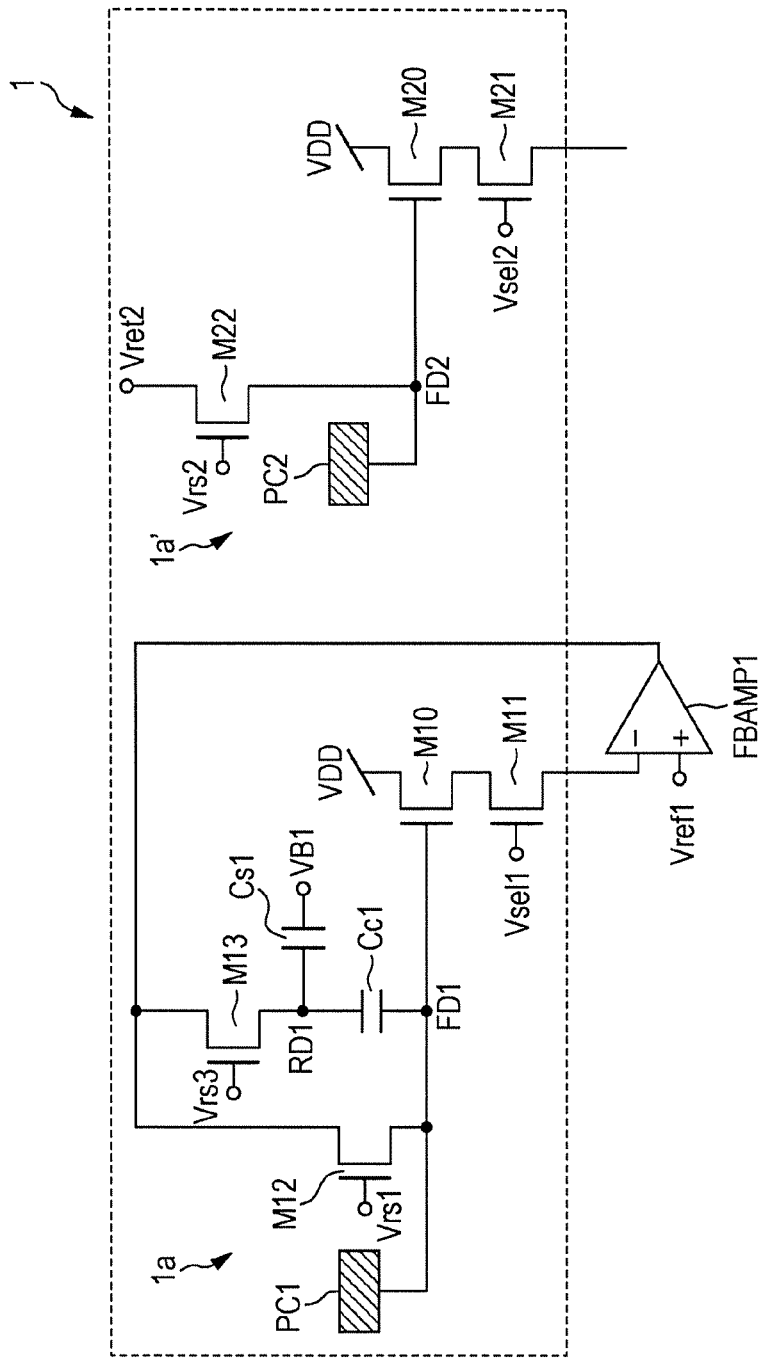
FIG. 9E is a schematic view illustrating still another circuit configuration of the unit pixel according to exemplary Second Embodiment.
Figure 9F:
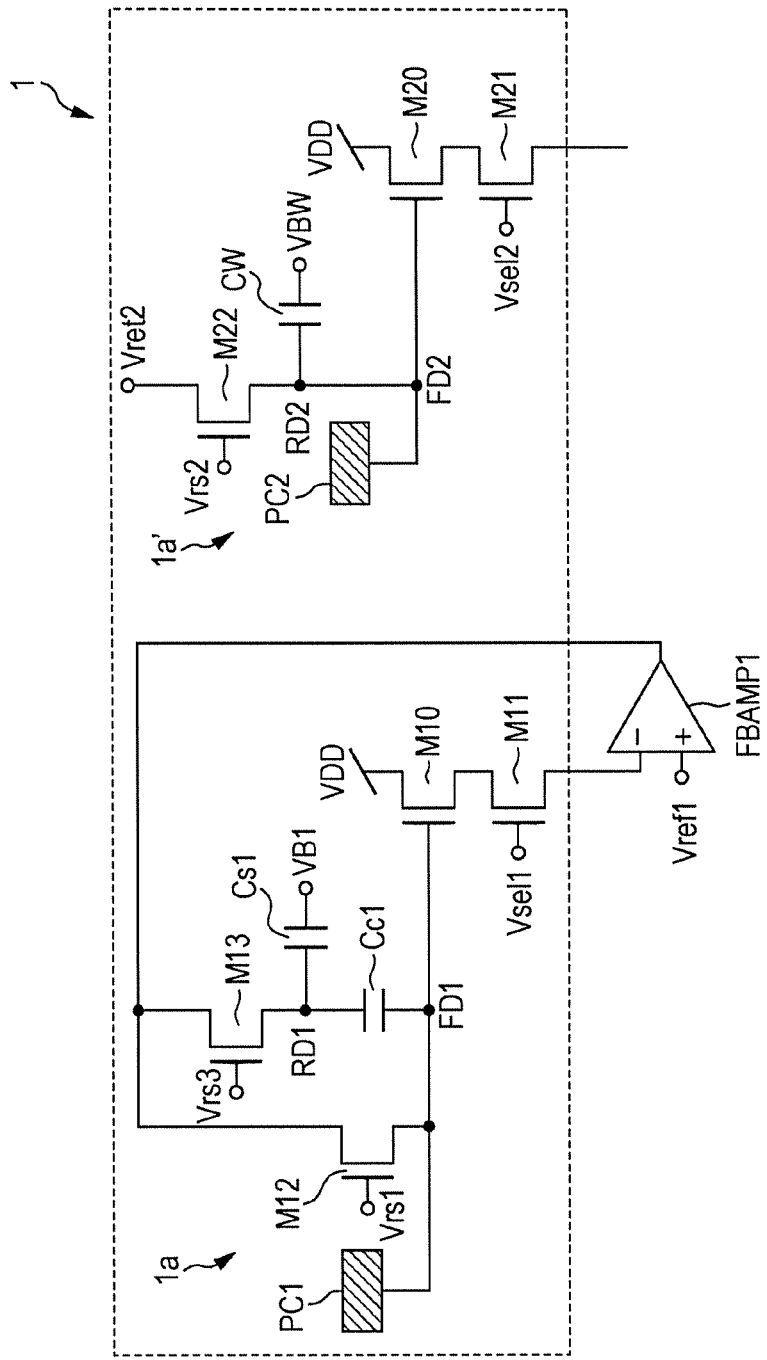
FIG. 9F is a schematic view illustrating still another circuit configuration of the unit pixel according to exemplary Second Embodiment.
Figure 9G:
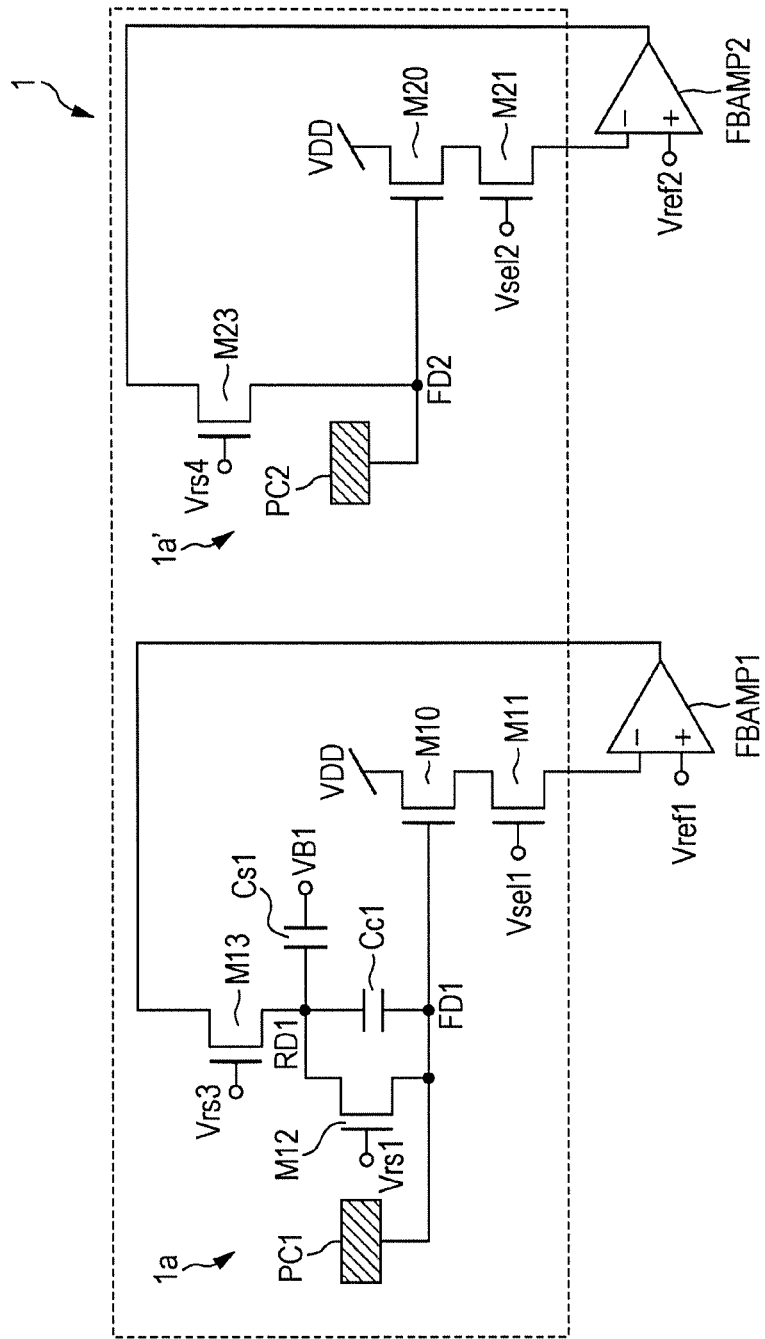
FIG. 9G is a schematic view illustrating still another circuit configuration of the unit pixel according to exemplary Second Embodiment.
Figure 9H:
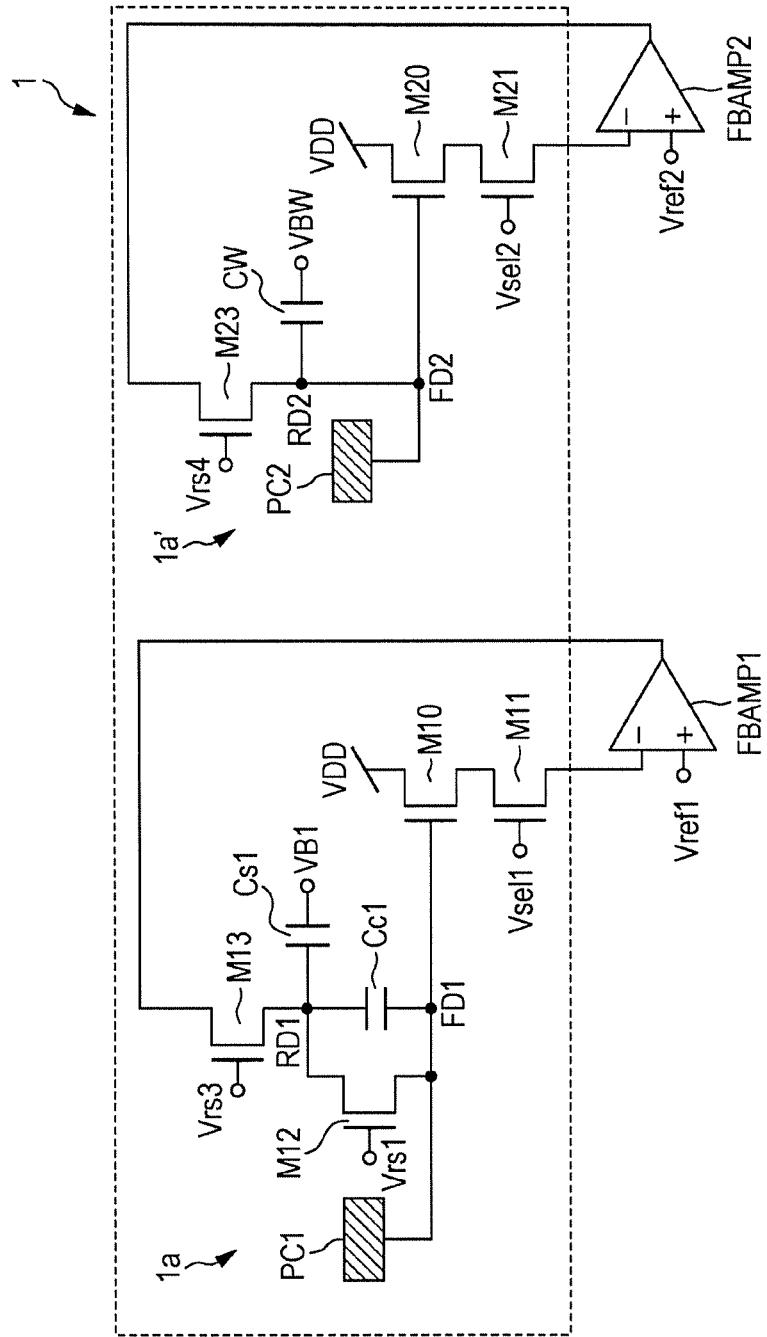
FIG. 9H is a schematic view illustrating still another circuit configuration of the unit pixel according to exemplary Second Embodiment.
Figure 9I:
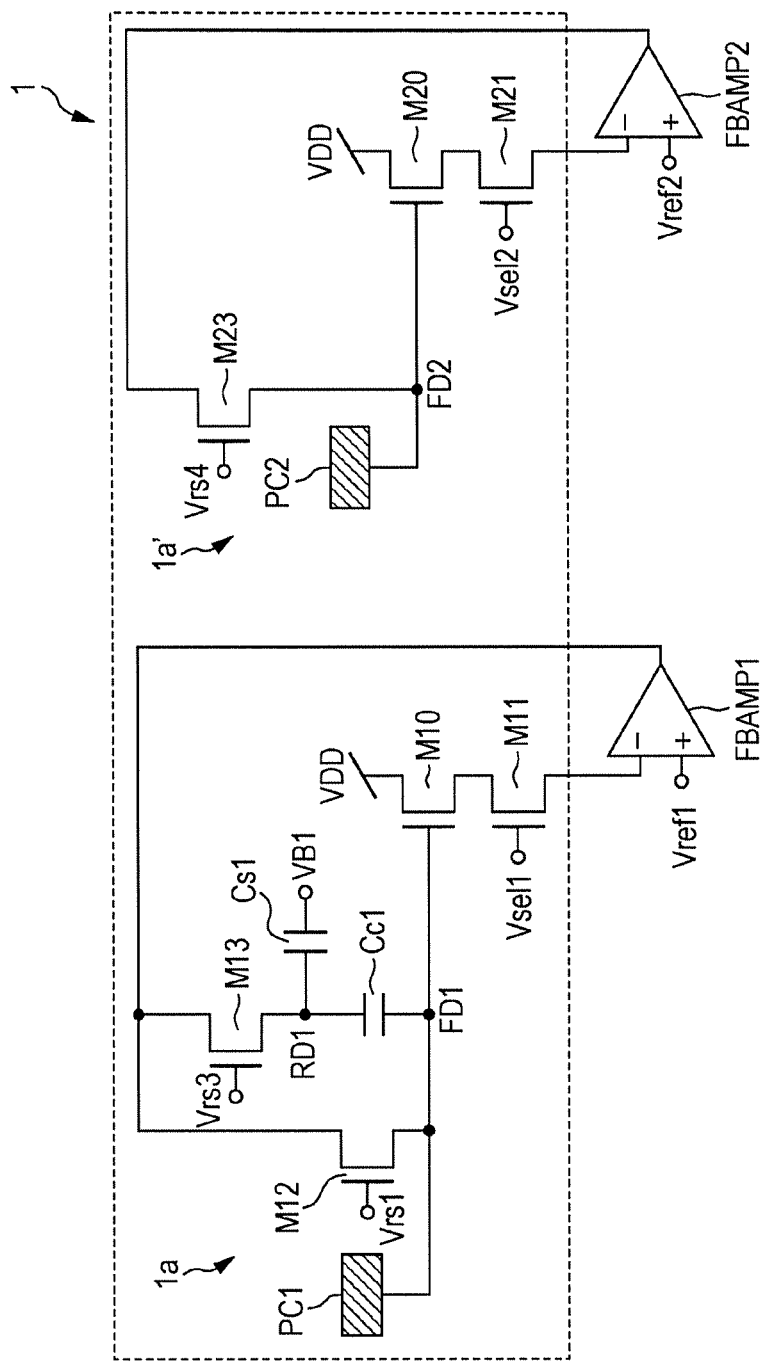
FIG. 9I is a schematic view illustrating still another circuit configuration of the unit pixel according to exemplary Second Embodiment.
Figure 9J:
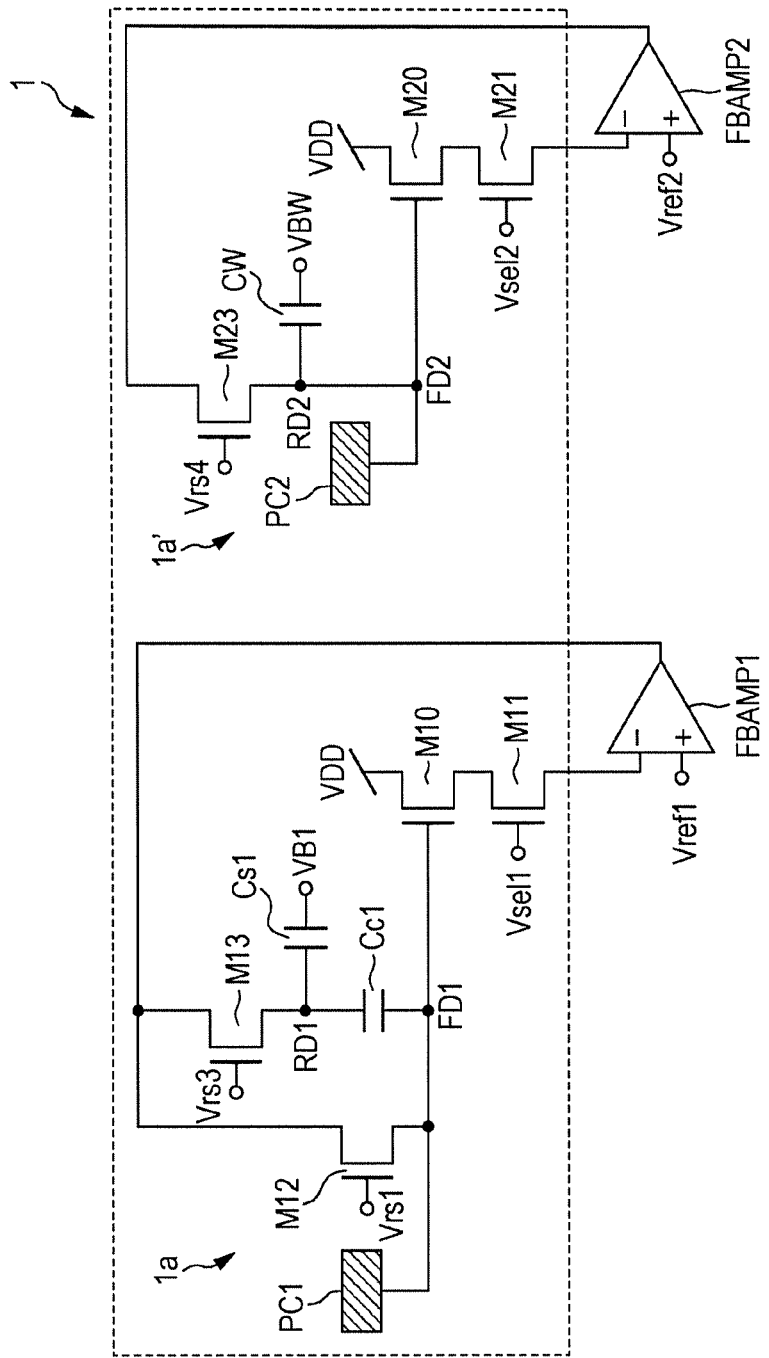
FIG. 9J is a schematic view illustrating still another circuit configuration of the unit pixel according to exemplary Second Embodiment.
Figure 9K:
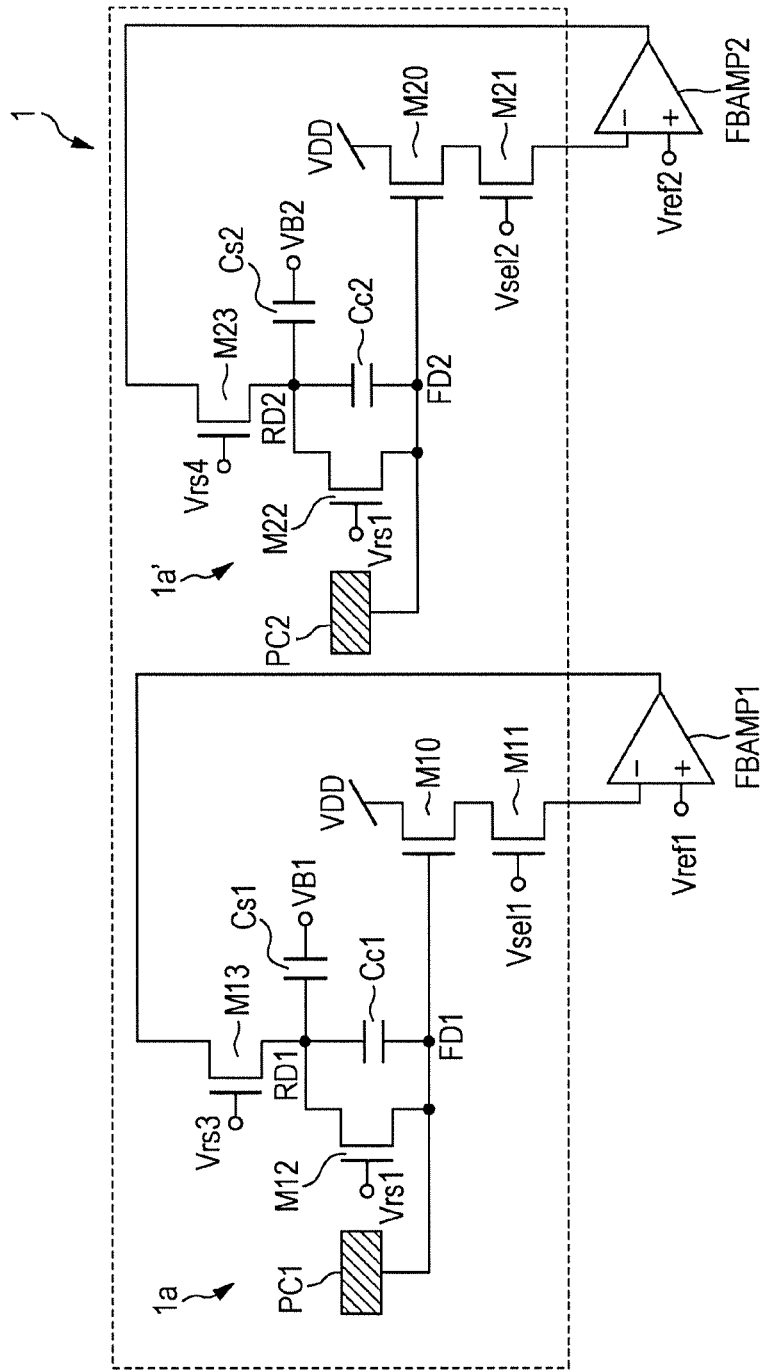
FIG. 9K is a schematic view illustrating still another circuit configuration of the unit pixel according to exemplary Second Embodiment.
Figure 9L:
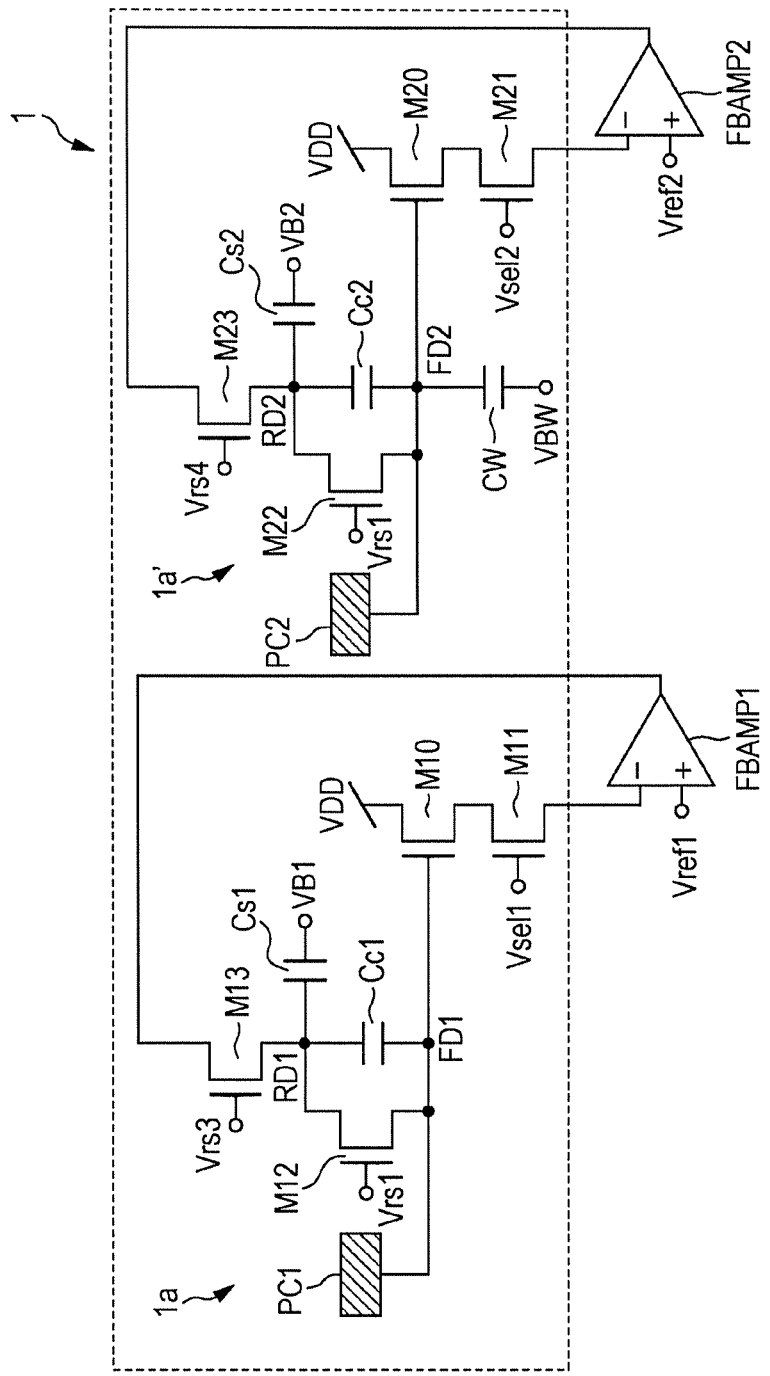
FIG. 9L is a schematic view illustrating still another circuit configuration of the unit pixel according to exemplary Second Embodiment.
Figure 9M:
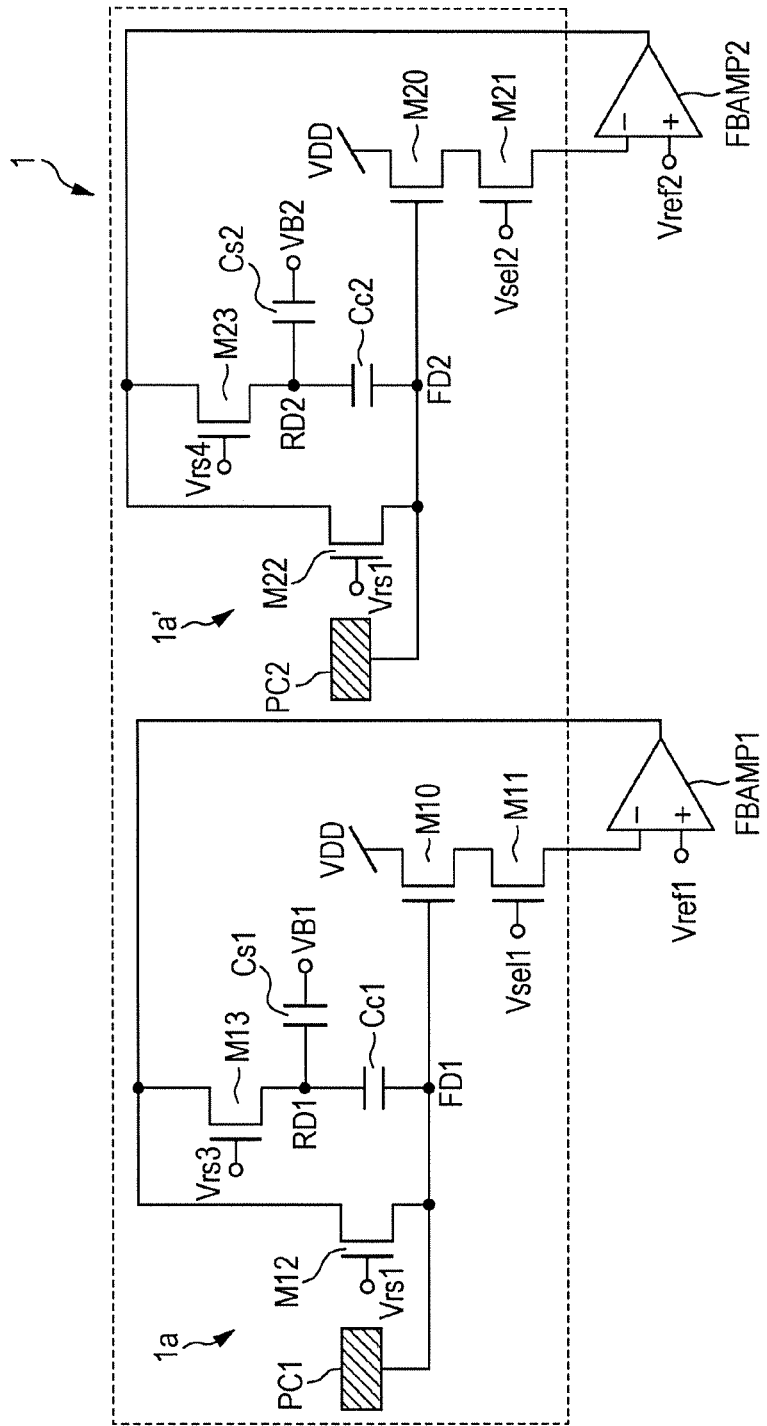
FIG. 9M is a schematic view illustrating still another circuit configuration of the unit pixel according to exemplary Second Embodiment.
Figure 9N:
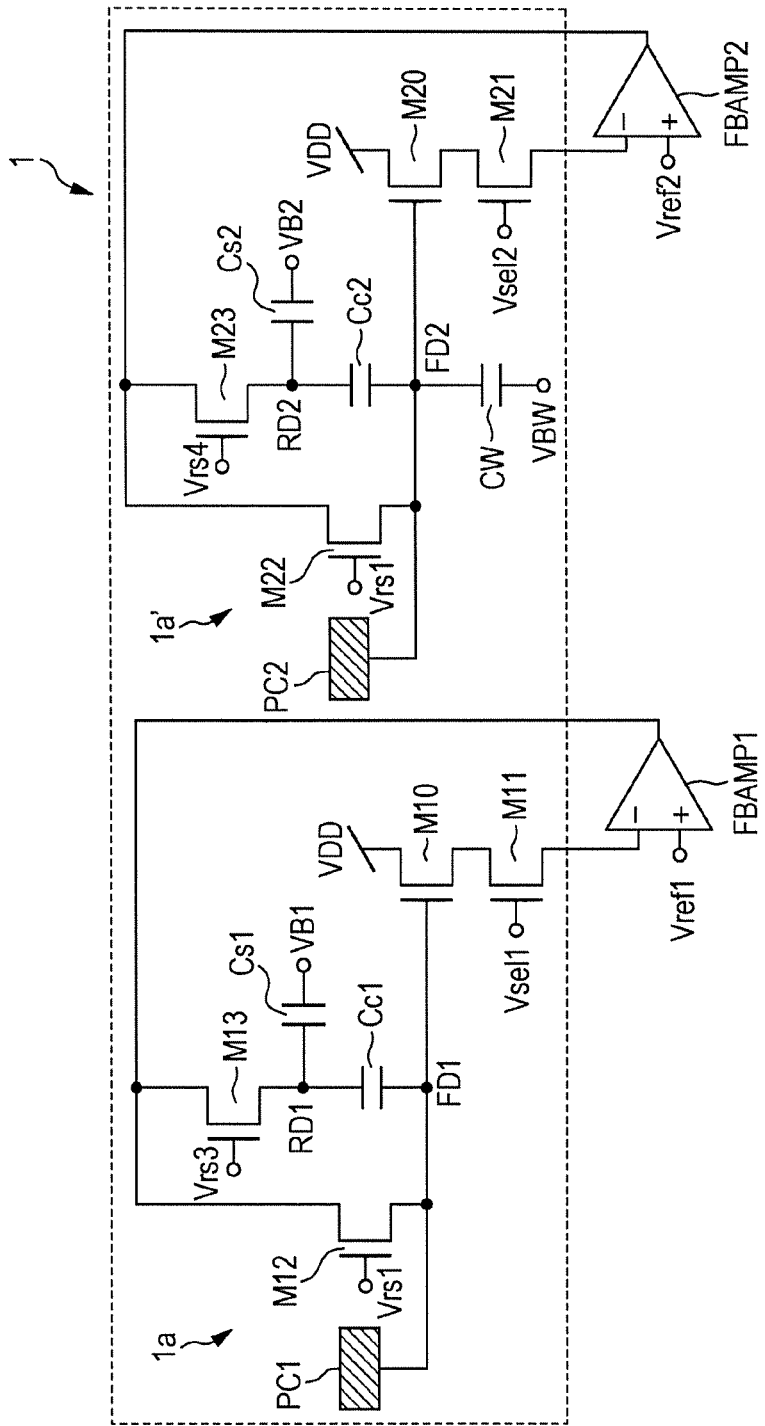
FIG. 9N is a schematic view illustrating still another circuit configuration of the unit pixel according to exemplary Second Embodiment.

FIGS. 9A through 9N illustrate still other examples of the circuit configuration of the unit pixel 1 according to the present embodiment. The following mainly describes representative ones of the examples of the circuit configuration.

The unit pixel 1 illustrated in FIG. 9A has a configuration obtained by adding a second feedback circuit that forms a second feedback path for negative feedback of kTC noise that occurs when the second reset transistor M23 is turned off to the second pixel cell 1a' of the unit pixel 1 illustrated in FIG. 7. The second feedback circuit includes a second inverting amplifier FBAMP2. According to this configuration, low-noise imaging is achieved by using the first pixel cell 1a, and low-noise and high-saturation imaging is achieved by using the second pixel cell 1a'. As a result, it is possible to suppress noise throughout imaging data. Especially in imaging of a subject of an intermediate amount of light, noise can be effectively suppressed, and a higher-definition image can be obtained. The second inverting amplifier FBAMP2 corresponds to the first inverting amplifier 11' in FIG. 4.

As described above, a gate width of the first amplifier transistor M10 may be larger than that of the second amplifier transistor M20. This makes it possible to set gm of the first amplifier transistor M10 large. As a result, it is possible to reduce readout noise of the first pixel cell 1a. Meanwhile, noise characteristics of the second pixel cell 1a' do not pose a problem even in a case where the noise characteristics are equivalent to conventional ones. A gate length of the first reset transistor M13 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones. Furthermore, gain of the first feedback circuit may be set larger than that of the second feedback circuit. This further improves the noise reducing effect of the first pixel cell 1a. Noise characteristics of the second pixel cell 1a' do not pose a problem even in a case where the noise characteristics are equivalent to conventional ones.

The unit pixel 1 illustrated in FIG. 9C has a configuration including a first reset transistor M12, a first band control transistor M13, a first capacitive element Cc1, and a second capacitive element Cs1 in contrast with the configuration illustrated in FIG. 7. The first band control transistor M13 performs band control of the first feedback circuit. The first band control transistor M13 is disposed on the feedback path and is connected to an output of the first inverting amplifier FBAMP1. The first capacitive element Cc1 is electrically connected between the readout node FD1 and a source or a drain of the first band control transistor M13. The second capacitive element Cs1 has a larger capacitance value than the first capacitive element Cc1 and is connected between the first capacitive element Cc1 and a reference voltage VB1. According to this configuration, it is possible to improve noise suppression performance of the first pixel cell 1a.

As described above, a gate width of the first amplifier transistor M10 may be larger than that of the second amplifier transistor M20. This makes it possible to set gm of the first amplifier transistor M10 large. As a result, it is possible to reduce readout noise of the first pixel cell 1a. Noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones.

It is desirable that the first reset transistor M12 be connected between the readout node FD1 connected to the first photoelectric converter PC1 and a connection node (hereinafter sometimes referred to as a "connection part") RD1 between the first capacitive element Cc1 and the second capacitive element Cs1, as illustrated in FIG. 9C. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 9E. According to such a configuration, it is unnecessary to additionally provide a reset voltage Vret (=VRST). Furthermore, since convergence into a value close to a reset value can be achieved by feedback, the speed of noise cancelling can be increased.

The unit pixel 1 illustrated in FIG. 9G has a configuration including a second reset transistor M23 and a second feedback circuit that forms a second feedback path for negative feedback of kTC noise that occurs when the second reset transistor M23 is turned off in contrast with the configuration illustrated in FIG. 9C. According to this configuration, low-noise imaging is achieved by using the first pixel cell 1a, and low-noise and high-saturation imaging is achieved by using the second pixel cell 1a'. As a result, it is possible to suppress noise throughout imaging data. Especially in imaging of a subject of an intermediate amount of light, noise can be effectively suppressed, and a higher-definition image can be obtained.

As described above, a gate width of the first amplifier transistor M10 may be larger than that of the second amplifier transistor M20. This makes it possible to set gm of the first amplifier transistor M10 large. As a result, it is possible to reduce readout noise of the first pixel cell 1a. Noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones. Furthermore, gain of the first feedback circuit may be set larger than that of the second feedback circuit. This further improves the noise reducing effect of the first pixel cell 1a. Noise characteristics of the second pixel cell 1a' do not pose a problem even in a case where the noise characteristics are equivalent to conventional ones.

It is desirable that the first reset transistor M12 be connected between the readout node FD1 connected to the first photoelectric converter PC1 and the connection node RD1 between the first capacitive element Cc1 and the second capacitive element Cs1, as illustrated in FIG. 9G. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 9I. According to such a configuration, it is unnecessary to additionally provide a reset voltage Vret (=VRST). Furthermore, since convergence into a value close to a reset value can be achieved by feedback, the speed of noise cancelling can be increased.

Each of the unit pixels 1 illustrated in FIGS. 9K and 9M has a configuration including a second reset transistor M22, a second band control transistor M23 and a capacitance circuit including a third capacitive element Cc2 and a fourth capacitive element Cs2 in contrast with the configuration illustrated in FIG. 9G. The second band control transistor M23 performs band control of the second feedback circuit. The second band control transistor M23 is disposed on the feedback path and is connected between an output of the second inverting amplifier FBAMP2 and a connection node RD2 between the third capacitive element Cc2 and the fourth capacitive element Cs2. The third capacitive element Cc2 is electrically connected between the readout node FD2 and a source or a drain of the second band control transistor M23. The fourth capacitive element Cs2 has a larger capacitance value than the third capacitive element Cc2 and is connected between the third capacitive element Cc2 and a reference voltage VB2. The third capacitive element Cc2 is connected in series with the fourth capacitive element Cs2. According to this configuration, low-noise imaging is achieved by using the first pixel cell 1a, and low-noise and high-saturation imaging is achieved by using the second pixel cell 1a'. As a result, it is possible to suppress noise throughout imaging data. Especially in imaging of a subject of an intermediate amount of light, noise can be effectively suppressed, and a higher-definition image can be obtained.

As described above, a gate width of the first amplifier transistor M10 may be larger than that of the second amplifier transistor M20. This makes it possible to set gm of the first amplifier transistor M10 large. As a result, it is possible to reduce readout noise of the first pixel cell 1a. Noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones. Furthermore, gain of the first feedback circuit may be set larger than that of the second feedback circuit. This further improves the noise reducing effect of the first pixel cell 1a. Noise characteristics of the second pixel cell 1a' do not pose a problem even in a case where the noise characteristics are equivalent to conventional ones.

It is desirable that the first reset transistor M12 be connected between the readout node FD1 connected to the first photoelectric converter PC1 and the connection node RD1 between the first capacitive element Cc1 and the second capacitive element Cs1, as illustrated in FIG. 9K. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 9M. According to such a configuration, it is unnecessary to additionally provide a reset voltage Vret (=VRST). Furthermore, since convergence into a value close to a reset value can be achieved by feedback, the speed of noise cancelling can be increased.

According to the circuit configurations illustrated in FIGS. 9A through 9N, it is possible to suppress an unnecessary increase in pixel size. Furthermore, it is possible to provide a small imaging device in which low-noise high-sensitivity imaging is achieved by the first pixel cell 1a and high-saturation low-sensitivity imaging is achieved by the second pixel cell 1a'. Furthermore, a subject having a large difference in brightness can be imaged without a time lag and without blown out highlights and blocked up shadows.

As in the unit pixel 1 illustrated in FIG. 8, a fifth capacitive element CW that is electrically connected between the second photoelectric converter PC2 and the reference voltage VBW may be provided as illustrated in FIGS. 9B, 9D, 9F, 9H, 9J, 9L, and 9N. This makes it possible to improve the high-saturation characteristics of the second pixel cell 1a' by a degree corresponding to a capacitance ratio. As a result, it is possible to further widen a dynamic range.

A specific example of a noise suppression and data readout operation using a feedback circuit is described below.

Readout and Noise Suppression

A noise suppression and data readout operation using the first pixel cell 1a of the unit pixel 1 illustrated in FIG. 9C is described below as a specific example.

In the first signal processing circuit P1, one end of the second capacitive element Cs1 is connected to one of a source and a drain of the first band control transistor M13. The first band control transistor M13 and the second capacitive element Cs1 form an RC filter circuit. Furthermore, one end of the first capacitive element Cc1 is also connected to the one of the source and the drain of the first band control transistor M13. The other end of the first capacitive element Cc1 is connected to the first readout node FD1.

A gate of the first band control transistor M13 receives a first band control signal Vrs3, and the state of the first band control transistor M13 is determined by the voltage of the first band control signal Vrs3. For example, in a case where the first band control signal Vrs3 is at a high level, the first band control transistor M13 is on, and the readout node FD1, the first amplifier transistor M10, the first selection transistor M11, the first inverting amplifier FBAMP1, the first band control transistor M13, and the first capacitive element Cc1 form a feedback path. When the voltage of the first band control signal Vrs3 decreases, a resistance component of the first band control transistor M13 increases. This narrows the bandwidth of the first band control transistor M13 and narrows a frequency region of a signal that is fed back. While feedback is being formed, a signal that is output by the first band control transistor M13 is attenuated by an attenuation circuit formed by the first capacitive element Cc1 and parasitic capacitance of the readout node FD1 and is fed back to the readout node FD1. An attenuation rate B is expressed by B=Cc/(Cc+CFD) where Cc is the capacitance value of the first capacitive element Cc1 and CFD is the parasitic capacitance of the readout node FD1. When the voltage of the first band control signal Vrs3 decreases to a low level, the first band control transistor M13 is turned off, and no feedback is formed. The readout node FD1 is further connected to one of a source and a drain of the first reset transistor M12. The other one of the source and the drain of the first reset transistor M12 is connected to the connection node RD1.

A gate of the first reset transistor M12 receives a first reset control signal Vrs1, and the state of the first reset transistor M12 is determined by the voltage of the first reset control signal Vrs1. For example, in a case where the first reset control signal Vrs1 is at a high level, the first reset transistor M12 is on, and the readout node FD1 has the same voltage as the connection node RD1. In this case, in a case where the first band control signal Vrs3 is also at a high level, both of the first reset transistor M12 and the first band control transistor 13M are on, and both of the readout node FD1 and the connection node RD1 have a desired reset voltage VRST. This reset voltage VRST is a value obtained by subtracting a voltage between a gate of the first amplifier transistor M10 and one of a source and a drain of the first amplifier transistor M10 that is not connected to VDD, from the reference voltage Vref1 of the first inverting amplifier FBAMP1. One of a source and a drain of the first selection transistor M11 is connected to the vertical signal line 9. A gate of the first selection transistor M11 receives a first selection control signal Vsel1, and the state of the first selection transistor M11 is determined by the voltage of the first selection control signal Vsel1. For example, in a case where the first selection control signal Vsel1 is at a high level, the first selection transistor M11 is on, and the first amplifier transistor M10 and the vertical signal line 9 are electrically connected. In a case where the first selection control signal Vsel1 is at a low level, the first selection transistor M11 is off, and the first amplifier transistor M10 and the vertical signal line 9 are electrically separated.

Operation of First Pixel Cell 1a

Figure 10:
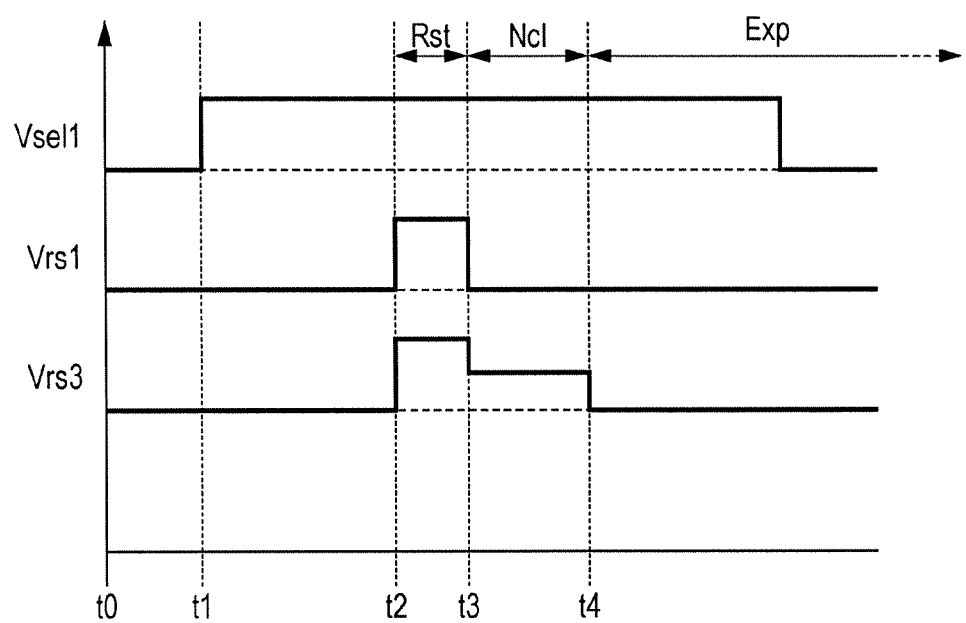
FIG. 10 is a timing chart illustrating an example of operation timings of a first pixel cell according to exemplary Second Embodiment.

FIG. 10 illustrates an example of operation timings of the first pixel cell 1a according to the present embodiment.

Reset Period

First, the first selection control signal Vsel1 is brought into a high level (time t1). Next, the voltage of the first band control signal Vrs3 is brought into a high level so that the first band control transistor M13 is turned on. At the same timing, the first reset control signal Vrs1 is brought into a high level so that the first reset transistor M12 is turned on (time t2). This makes the voltage of the readout node FD1 equal to the reset voltage VRST.

Noise Suppression Period

Next, the first reset control signal Vrs1 is brought into a low level so that the first reset transistor M12 is turned off (time t3). In this state, the first feedback circuit forms a feedback path at an amplification factor ($=-A \times B$), and therefore the kTC noise of the readout node FD1 that occurs when the first reset transistor M12 is turned off is suppressed to $1/(1+A \times B)$. Furthermore, noise is suppressed at high speed by setting the voltage of the first band control signal Vrs3 so that the operation bandwidth of the first band control transistor M13 is a first bandwidth that is a broad bandwidth.

At the same timing, the first band control signal Vrs3 is set to an intermediate voltage between the high level and the low level (time t3). Note that this timing may be slightly later than the time t3. At this point in time, the operation bandwidth of the first band control transistor M13 is a second bandwidth that is lower than the first bandwidth. The noise suppressing effect is increased by making the second bandwidth sufficiently lower than the operation bandwidth of the first amplifier transistor M10. However, trade-off for this is extension of a period necessary for noise suppression. A noise suppression effect is obtained even in a case where the second bandwidth is higher than the operation bandwidth of the first amplifier transistor M10. A designer can design the second bandwidth to any value in accordance with a period for noise suppression. In the present embodiment, it is assumed that the second bandwidth is sufficiently lower than the operation bandwidth of the first amplifier transistor M10.

In a state where the second bandwidth is lower than the operation bandwidth of the first amplifier transistor M10, thermal noise that occurs in the first band control transistor M13 is suppressed to be $1/(1+A \times B)^{1/2}$ times by the first feedback circuit. In this state, the first band control signal Vrs3 is set to a low level so that the first band control transistor M13 is turned off (time t4). At this point in time, kTC noise that remains in the readout node FD1 is the sum of squares of kTC noise resulting from the first reset transistor M12 and kTC noise resulting from the first band control transistor M13. When Cs is the capacitance value of the second capacitive element Cs1, the kTC noise of the first band control transistor M13 that occurs in a state where there is no suppression by feedback is $(CFD/Cs)^{1/2}$ times the kTC noise of the first reset transistor M12 that occurs in a state where there is no suppression by feedback. When this is taken into consideration, the kTC noise is suppressed to be $[1+(1+A \times B) \times CFD/Cs]^{1/2}/(1+A \times B)$ times as compared with a case where there is no feedback.

Note that the first band control signal Vrs3 may be controlled to a voltage that changes across a threshold voltage of the first band control transistor M13 so that the first band control transistor M13 gradually changes from an ON state to an OFF state. This makes it possible to suppress noise of all of the unit pixels 1 even in a case where there are variations in threshold voltage of the first band control transistor M13 among the plurality of unit pixels 1 that constitute the imaging device 100. Furthermore, a voltage range in which the first band control signal Vrs3 is changed may be limited to a range of the variations of the unit pixels 1. This makes it possible to shorten a period for the change and achieve high speed noise suppression.

Exposure/Readout Period

Next, the voltage of the vertical signal line 9 shifts to a level corresponding to the voltage of the readout node FD1, but an amplification factor of a source follower circuit formed by the first amplifier transistor M10, the first selection transistor M11, and the electric current source 5 (see FIG. 4) is approximately 1. At this point in time, a voltage signal that has changed by a degree corresponding to the electric signal generated in the first photoelectric converter PC1 from the time of completion of noise suppression (time t4) to readout is accumulated in the readout node FD1. The voltage signal of the readout node FD1 is output to the vertical signal line 9 at an amplification factor of approximately 1 by the source follower circuit. Random noise is a fluctuation of output (i.e., kTC noise) obtained when the electric signal generated in the first photoelectric converter PC1 is 0. The kTC noise is suppressed to be $[1+(1+A\times B)\times CFD/Cs]^{1/2}/(1+A\times B)$ times during the noise suppression period. Furthermore, during the exposure/readout period, the voltage signal of the readout node FD1 is output to the vertical signal line 9 at an amplification factor of approximately 1. Therefore, according to the present embodiment, it is possible to acquire good image data in which random noise is suppressed.

The random noise is suppressed by increasing the second capacitive element Cs1 as much as the area permits. In general, random noise is reduced by increasing capacitance. However, when the electric charge signal is converted into a voltage signal in the readout node FD1, the signal itself decreases. As a result, S/N is not improved.

In the present embodiment, since the readout node FD1 and the connection part node RD1 are separated by the first capacitive element Cc1, the signal decrease does not occur even in a case where the capacitance of the second capacitive element Cs1 is increased. Since only the random noise is suppressed, the S/N ratio can be improved. Therefore, the present embodiment is effective in an imaging device in which the area of each unit pixel 1 can be made large.

A post-stage circuit for detecting a signal of the vertical signal line 9 may be connected, for example, as illustrated in FIG. 4. The post-stage circuit is, for example, constituted by a first vertical scanning circuit 2, a second vertical scanning circuit 2', a first column AD conversion circuit 4, and a second column AD conversion circuit 4'. However, the present disclosure is not limited to such a circuit configuration.

In the imaging device 100, CDS for cancelling a variation of the post-stage circuit may be performed. Specifically, the aforementioned reset operation is performed again after readout of a signal voltage. After completion of the reset operation, the readout operation described in Exposure/Readout Period is performed before light detection by the first photoelectric converter PC1. In this way, a reference voltage can be read out. A signal excluding fixed noise can be obtained by finding a difference between the signal voltage and the reference voltage.

In the present embodiment, a signal of the readout node FD1 is read out by the source follower circuit at an amplification factor of approximately 1 during the exposure/readout period. However, the present disclosure is not limited to this. The amplification factor may be changed by a designer in accordance with an S/N ratio and a circuit range necessary for a system.

In the present embodiment, the noise suppressing effect can be increased by increasing the capacitance value of a capacitive element disposed in the first pixel cell 1a.

Furthermore, the reset voltage of the readout node FD1 in the reset period may be supplied via the connection node RD1 as illustrated in FIG. 9C or may be directly supplied from the first inverting amplifier FBAMP1 as illustrated in FIG. 9F. Alternatively, it is also possible to employ a configuration in which a desired voltage is supplied from an outside. According to these examples of the configuration, wires that connect nodes can be optimized in a pixel layout having a small area, and thus a pixel area can be reduced.

Although an example of operation of the first pixel cell 1a has been described above, the second pixel cell 1a' can be also operated in a manner similar to the first pixel cell 1a. Furthermore, an example of operation of the first pixel cell 1a having the highest noise suppression performance illustrated in FIG. 9C has been described above. However, a configuration in which the first band control transistor M13 is not provided (e.g., the first pixel cell 1a illustrated in FIG. 7) may be selected in accordance with required noise level and pixel area. In this case, bandwidth limitation may be placed while performing a reset operation by supplying an intermediate voltage (e.g., Vrs3 in FIG. 10) to the first reset transistor M13 in FIG. 7. Alternatively, only a reset operation may be performed by supplying only a low level and a high level without supplying an intermediate voltage. Operations of the other transistors are similar to those described above. Furthermore, it is also possible to employ a configuration in which the first band control transistor M23 and the second feedback circuit are not provided (e.g., the second pixel cell 1a' of FIG. 7). Operations of the other transistors are similar to those described above.

Third Embodiment

An example of a circuit configuration of a unit pixel 1 according to Third Embodiment is described below with reference to FIGS. 11 to 14I.

Figure 11:
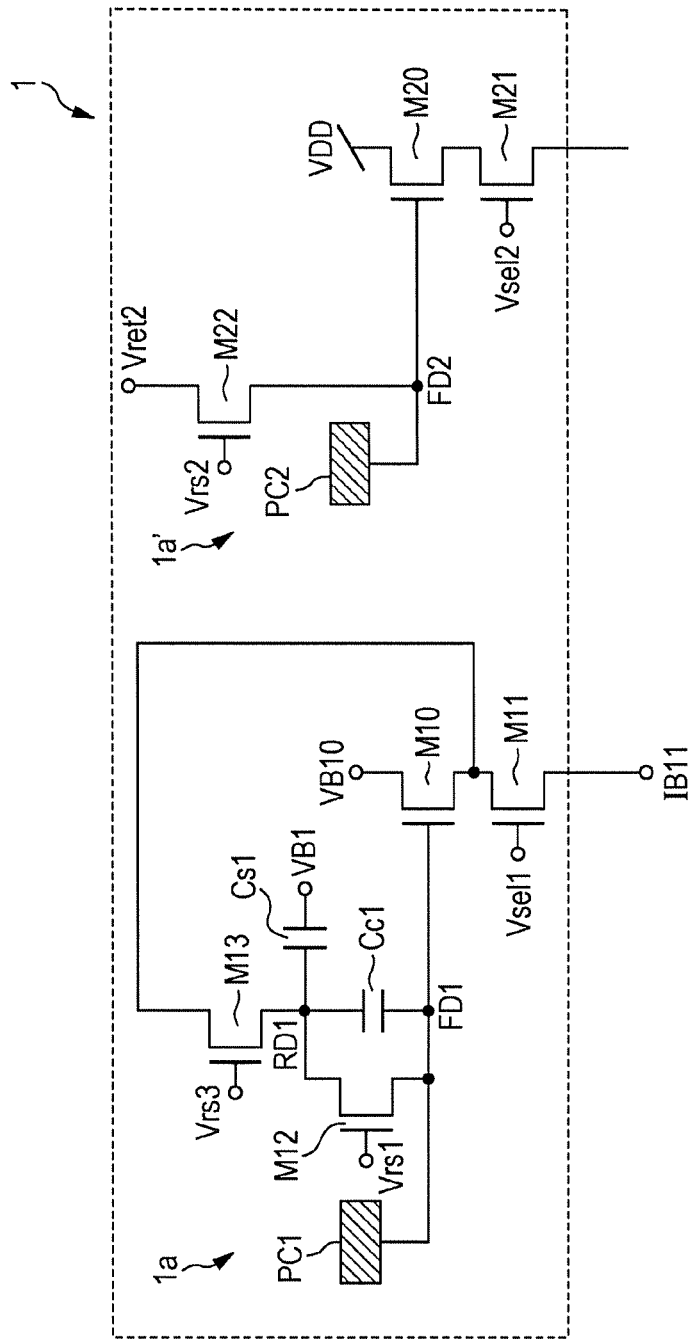
FIG. 11 illustrates a circuit configuration of a unit pixel according to exemplary Third Embodiment.

FIG. 11 illustrates an example of a circuit configuration of the unit pixel 1 according to the present embodiment. The unit pixel 1 includes a first pixel cell 1a and a second pixel cell 1a'. The first pixel cell 1a functions as a low-noise cell. The first pixel cell 1a includes a first photoelectric converter PC1 that converts light into an electric signal and a first signal processing circuit P1 that is electrically connected to the first photoelectric converter PC1 and reads out the electric signal generated in the first photoelectric converter PC1.

The first signal processing circuit P1 includes a first signal detection circuit that detects the electric signal generated in the first photoelectric converter PC1. The first signal detection circuit includes a first amplifier transistor M10, a first selection transistor M11, a first reset transistor M12, a capacitance circuit, and a first band control transistor M13. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M12 is connected to a readout node FD1. The first reset transistor M12 resets (initializes) the readout node FD1 connected to the first photoelectric converter PC1. The capacitance circuit includes a first capacitive element Cc1 one end of which is electrically connected to the readout node FD1 and a second capacitive element Cs1 having a larger capacitance value than the first capacitive element Cc1. The first capacitive element Cc1 is connected in series with the second capacitive element Cs1. One of a source and a drain of the first band control transistor M13 is connected to a connection node RD1 between the first capacitive element Cc1 and the second capacitive element Cs1 and performs band control of a first feedback circuit.

The first signal processing circuit P1 further includes the first feedback circuit that forms a first feedback path for negative feedback and suppression of noise that occurs when the first reset transistor M12 is turned off. The first feedback circuit performs negative feedback via the first amplifier transistor M10, the first band control transistor M13, and the first capacitive element Cc1.

The second pixel cell 1a' functions as a high-saturation cell. The second pixel cell 1a' includes a second photoelectric converter PC2 that converts light into an electric signal and a second signal processing circuit P2 that is electrically connected to the second photoelectric converter PC2 and reads out the electric signal generated in the second photoelectric converter PC2.

The second signal processing circuit P2 includes a second signal detection circuit that detects the electric signal generated in the second photoelectric converter PC2. The second signal detection circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated in the second photoelectric converter PC2. One of a source and a drain of the second selection transistor M21 is connected to one of a source and a drain of the second amplifier transistor M20. The second selection transistor M21 selectively outputs the signal amplified by the second amplifier transistor M20. The second reset transistor M22 is connected to a readout node FD2 and resets (initializes) the readout node FD2 connected to the second photoelectric converter PC2.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene.

Since the first pixel cell 1a includes the first feedback circuit, the first pixel cell 1a can markedly suppress noise that occurs when the first reset transistor M12 is turned off. Meanwhile, noise characteristics of the second pixel cell 1a' do not pose a problem even in a case where the noise characteristics are equivalent to conventional ones. A gate width of the first amplifier transistor M10 may be larger than that of the second amplifier transistor M20. This makes it possible to set gm of the first amplifier transistor M10 large. As a result, it is possible to reduce readout noise of the first pixel cell 1a. Meanwhile, noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones.

Figure 12:
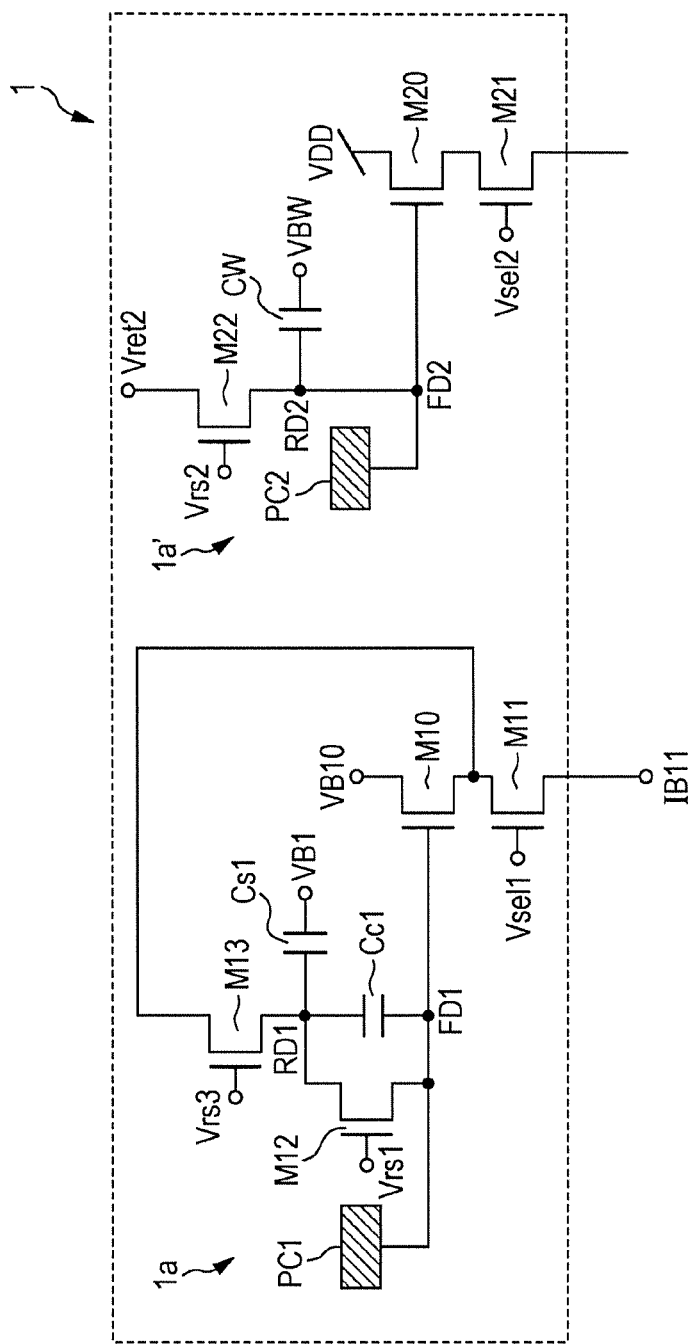
FIG. 12 illustrates another circuit configuration of the unit pixel according to exemplary Third Embodiment.
Figure 13:
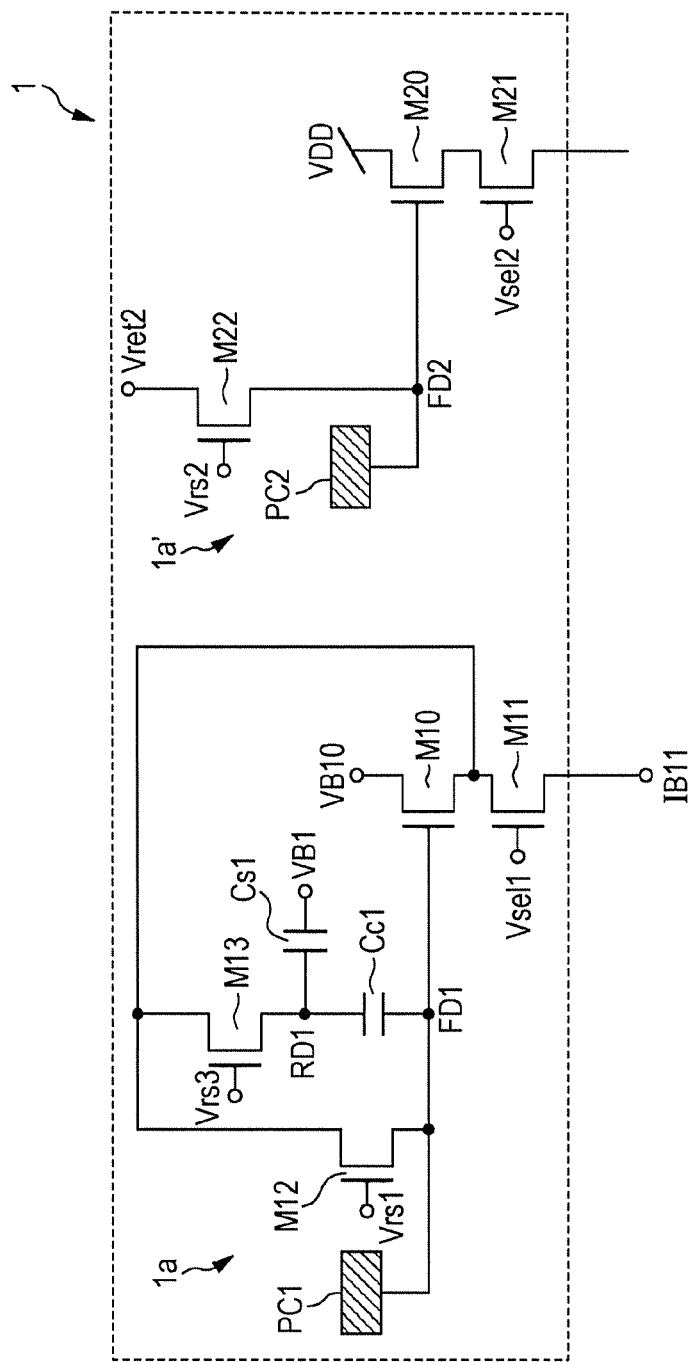
FIG. 13 illustrates another circuit configuration of the unit pixel according to exemplary Third Embodiment.
Figure 14A:
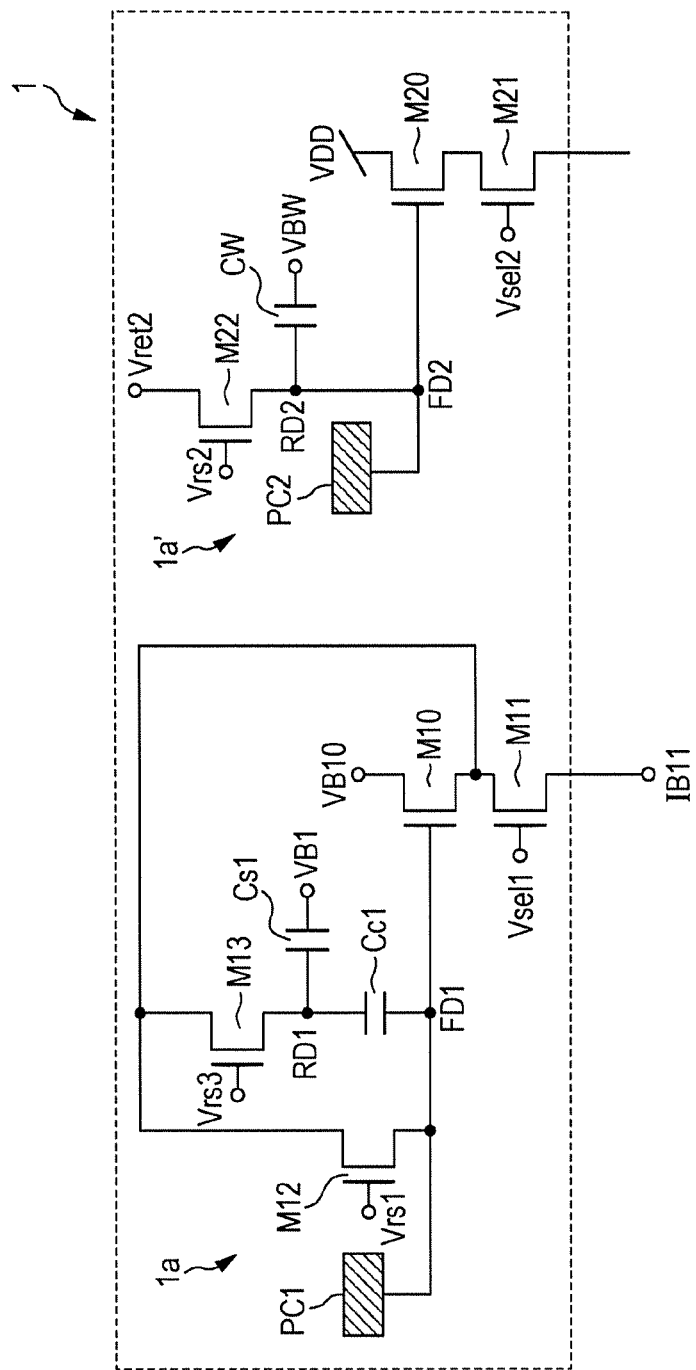
FIG. 14A is a schematic view illustrating still another circuit configuration of the unit pixel according to exemplary Third Embodiment.
Figure 14B:
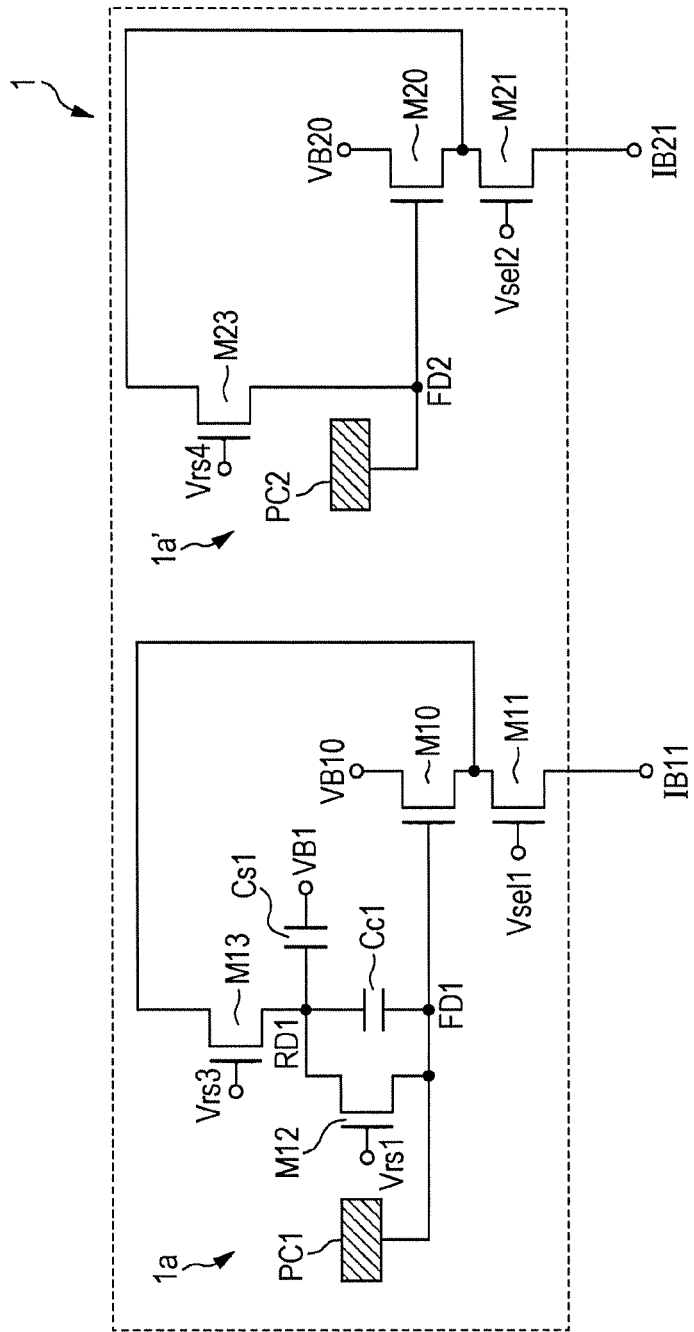
FIG. 14B is a schematic view illustrating still another circuit configuration of the unit pixel according to exemplary Third Embodiment.
Figure 14C:
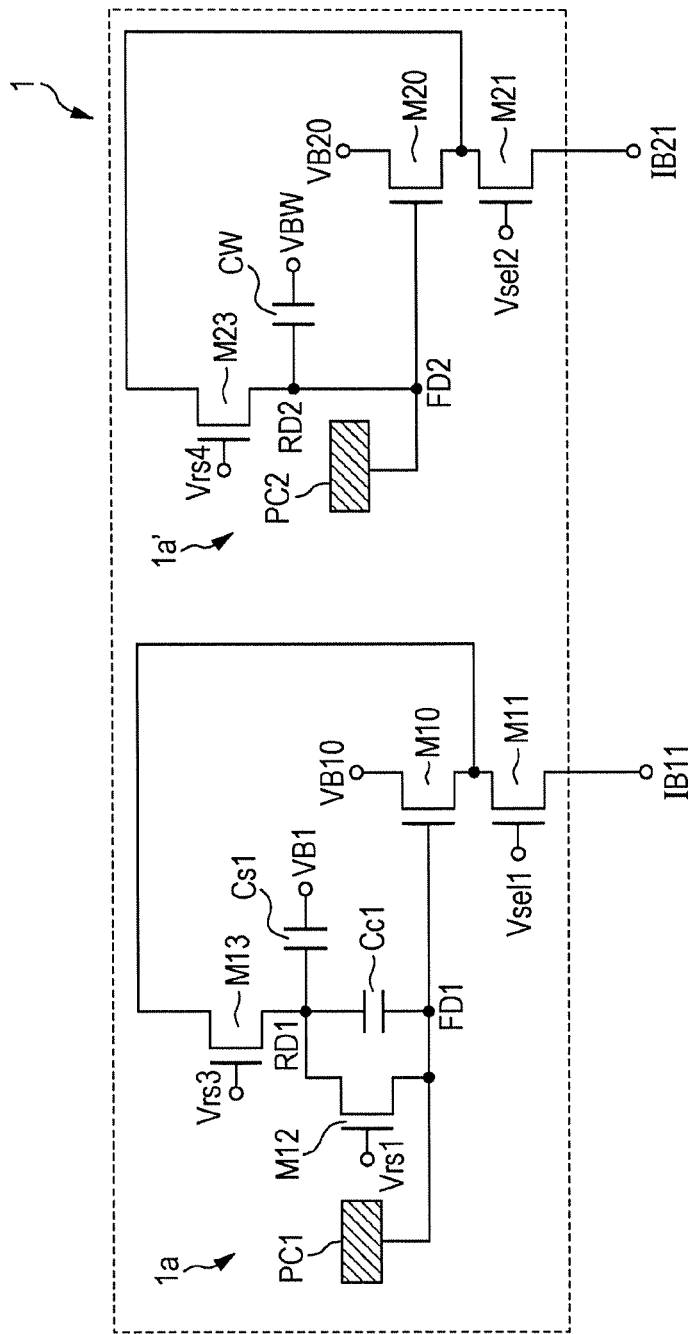
FIG. 14C is a schematic view illustrating still another circuit configuration of the unit pixel according to exemplary Third Embodiment.
Figure 14D:
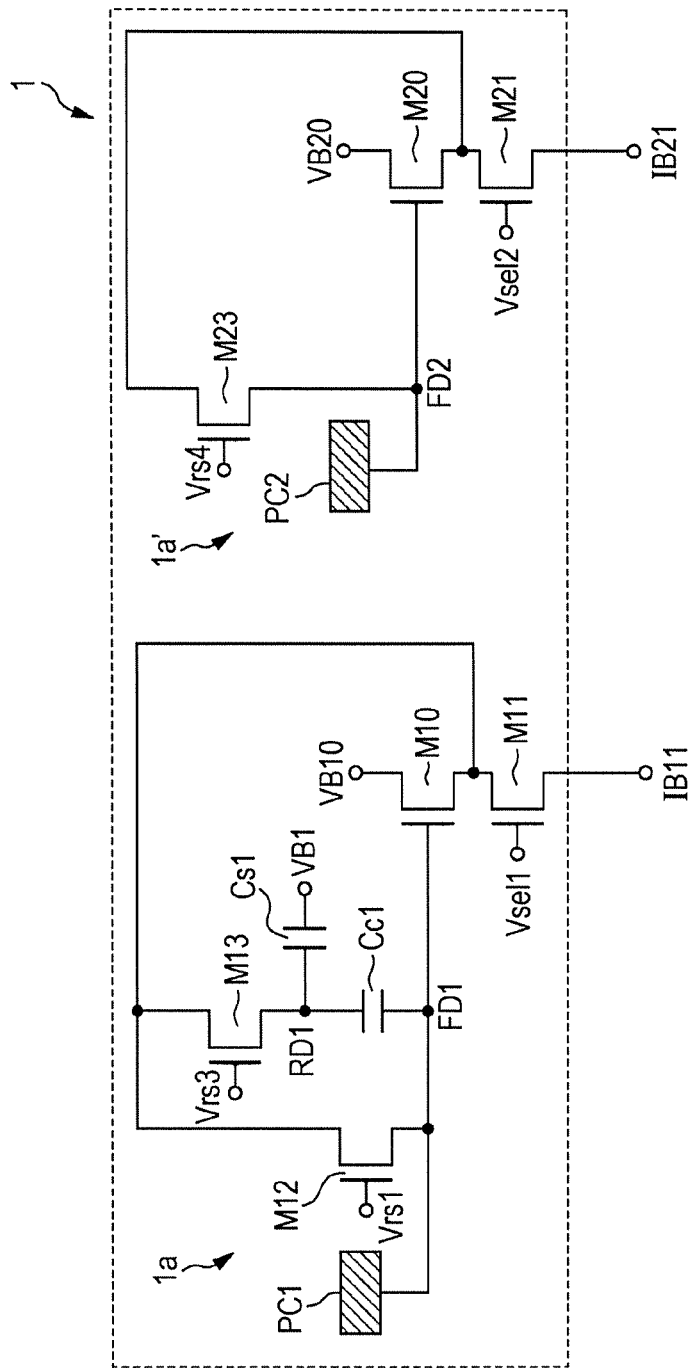
FIG. 14D is a schematic view illustrating still another circuit configuration of the unit pixel according to exemplary Third Embodiment.
Figure 14E:
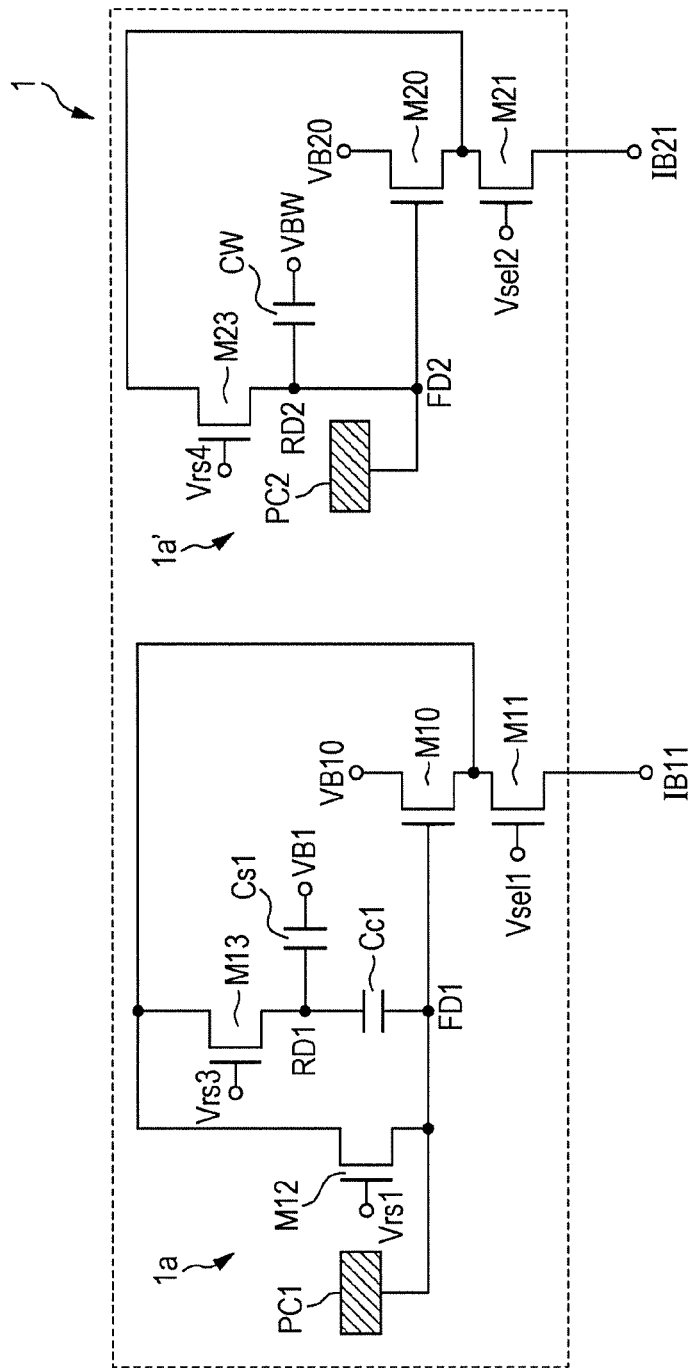
FIG. 14E is a schematic view illustrating still another circuit configuration of the unit pixel according to exemplary Third Embodiment.
Figure 14F:
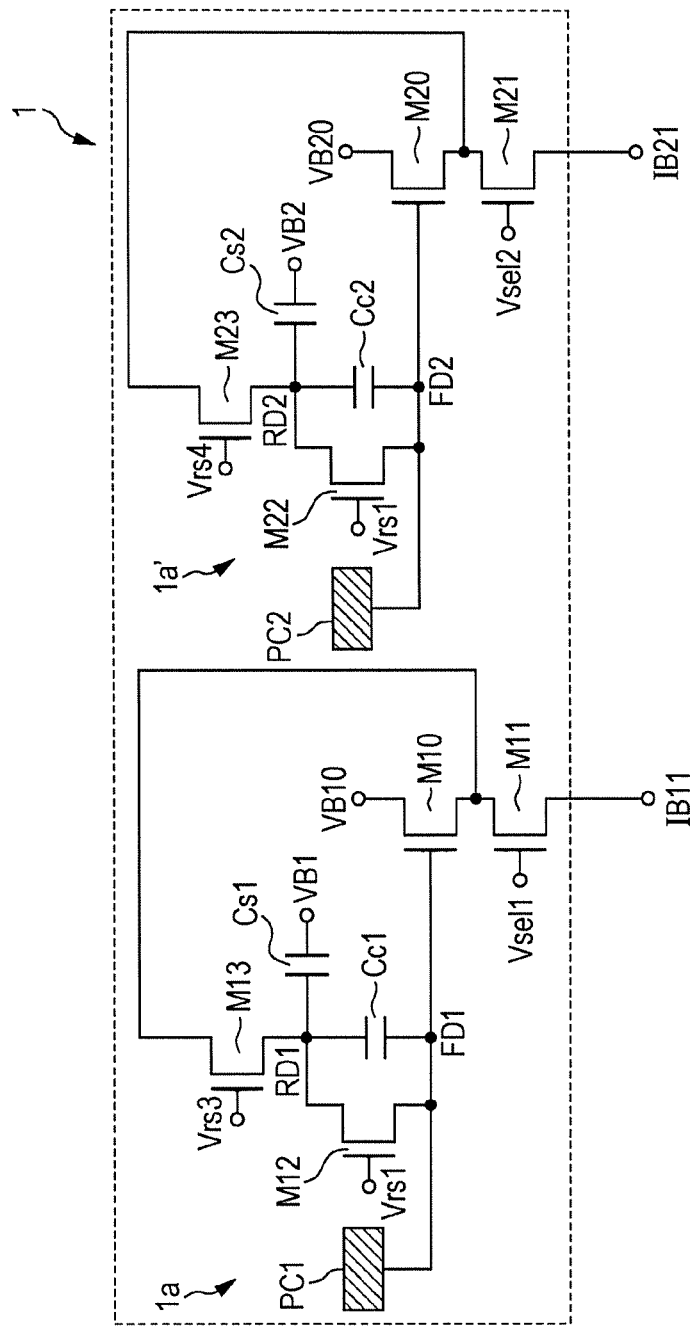
FIG. 14F is a schematic view illustrating still another circuit configuration of the unit pixel according to exemplary Third Embodiment.
Figure 14G:
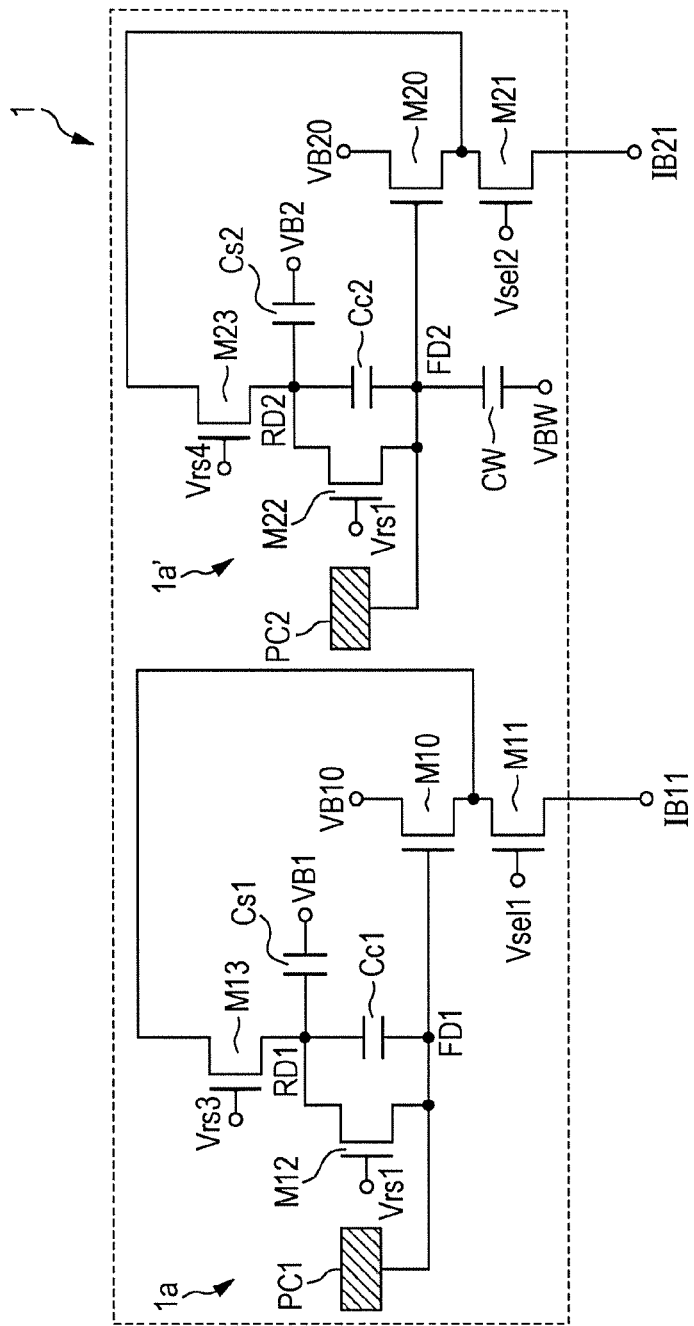
FIG. 14G is a schematic view illustrating still another circuit configuration of the unit pixel according to exemplary Third Embodiment.
Figure 14H:
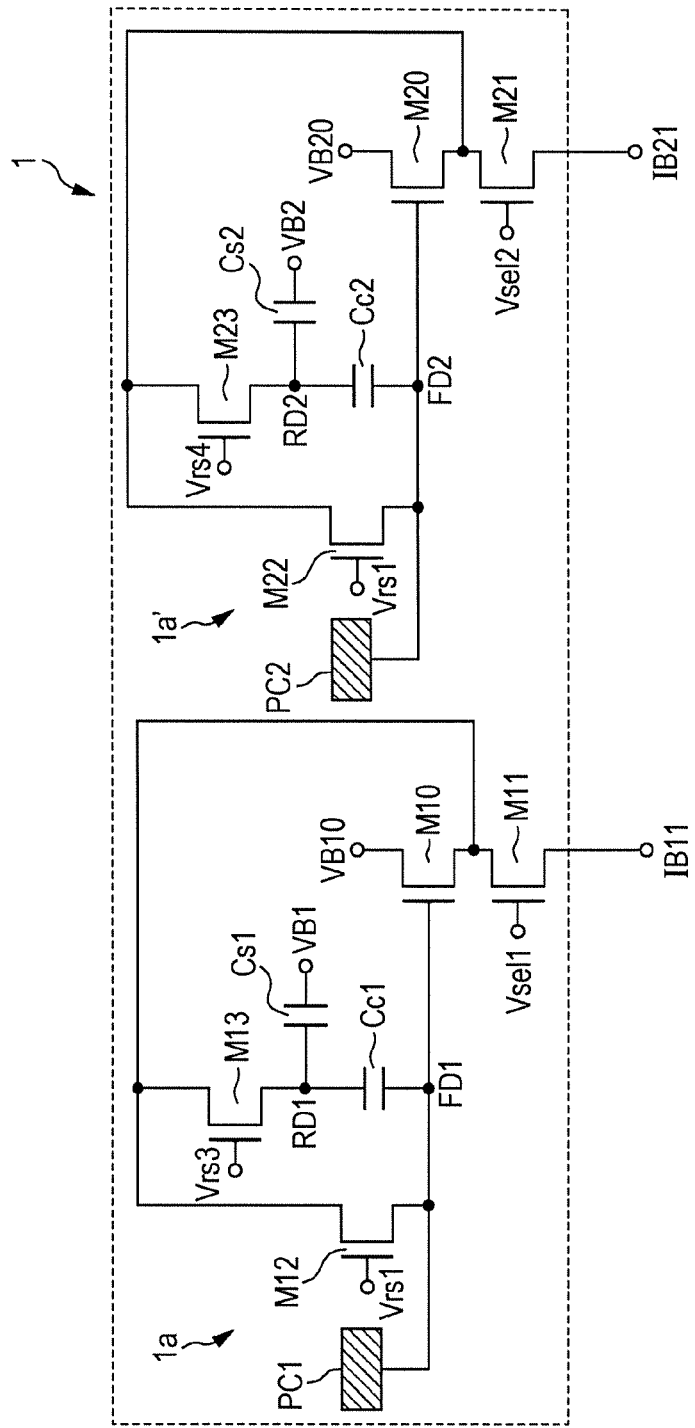
FIG. 14H is a schematic view illustrating still another circuit configuration of the unit pixel according to exemplary Third Embodiment.
Figure 14I:
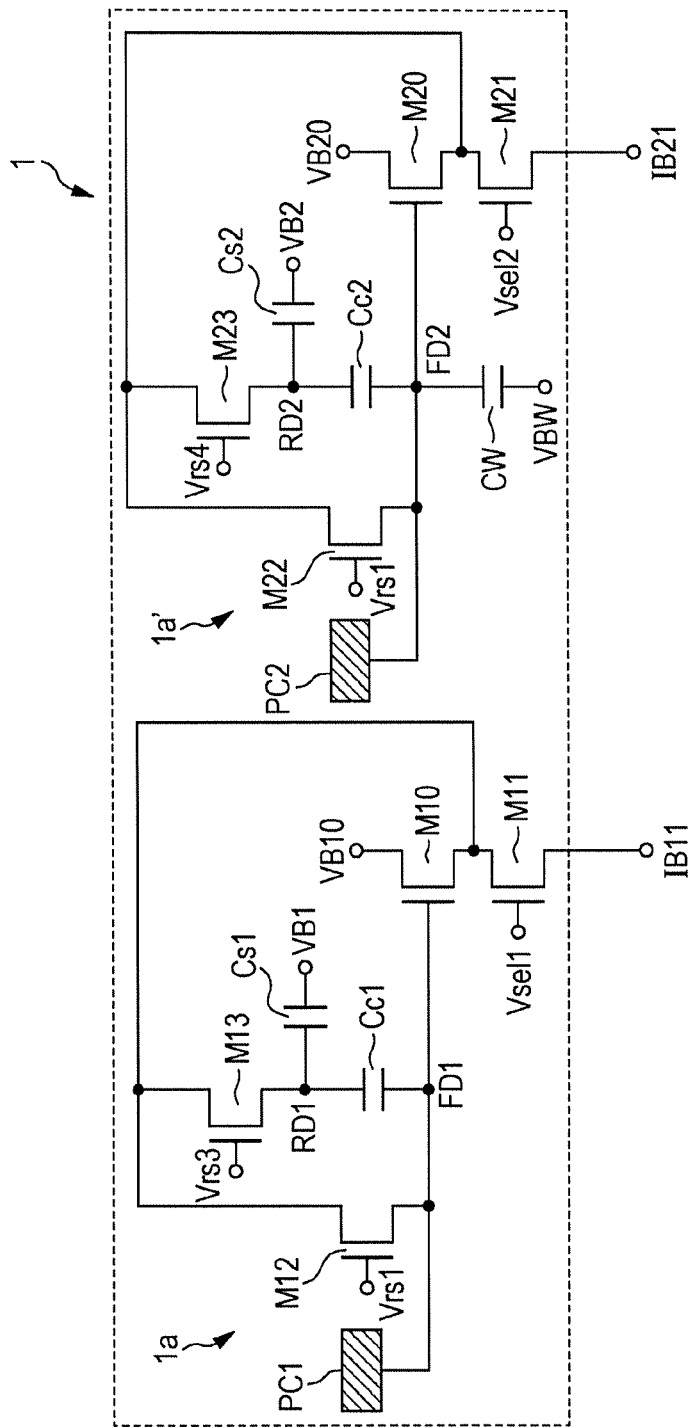
FIG. 14I is a schematic view illustrating still another circuit configuration of the unit pixel according to exemplary Third Embodiment.

FIGS. 12 and 13 illustrate other examples of a circuit configuration of the unit pixel 1 according to the present embodiment. As illustrated in FIG. 12, a fifth capacitive element CW that is electrically connected between the second photoelectric converter PC2 and a reference voltage VBW is provided. This makes it possible to improve the high-saturation characteristics of the second pixel cell 1a' by a degree corresponding to a capacitance ratio. As a result, it is possible to further widen a dynamic range. A method for setting a reset voltage can be changed by changing a method of connection of the first reset transistor M12. As a result, it is possible to shorten a period for convergence to a reset voltage.

According to the present embodiment, it is possible to suppress an unnecessary increase in pixel size. Furthermore, according to the present embodiment, it is possible to provide a small imaging device in which low-noise high-sensitivity imaging is achieved by the first pixel cell 1a and high-saturation low-sensitivity imaging is achieved by the second pixel cell 1a'. Furthermore, according to the present embodiment, a subject having a large difference in brightness can be imaged without a time lag and without blown out highlights and blocked up shadows.

It is desirable that the first reset transistor M12 be connected between the readout node FD1 connected to the first photoelectric converter PC1 and the connection node RD1 between the first capacitive element Cc1 and the second capacitive element Cs1, as illustrated in FIG. 11. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 13. According to such a configuration, it is unnecessary to additionally provide a reset voltage Vret (=VRST). Furthermore, since convergence into a value close to a reset value can be achieved by feedback, the speed of noise cancelling can be increased.

Still other examples of a circuit configuration of the first and second pixel cells 1a and 1a' according to the present embodiment are described below.

FIGS. 14A through 14I illustrate still other examples of a circuit configuration of the unit pixel 1 according to the present embodiment. The configurations illustrated in FIGS. 11, 12, 13, and 14A through 14I correspond to the configurations illustrated in FIGS. 9C through 9N of Second Embodiment. The configurations illustrated in FIGS. 11, 12, 13, and 14A through 14I and the configurations illustrated in FIGS. 9C through 9N of Second Embodiment are different in configuration and operation of the first feedback circuit for noise suppression in the first pixel cell 1a and are the same in other configurations and operations.

An operation of the first pixel cell 1a according to the present embodiment is described below.

Readout and Noise Suppression

A noise suppression and data readout operation using the first pixel cell 1a illustrated in FIG. 11 is described below as a specific example.

In the first signal processing circuit P1, one end of the second capacitive element Cs1 is connected to one of a source and a drain of the first band control transistor M13. The first band control transistor M13 and the second capacitive element Cs1 form an RC filter circuit. Furthermore, one end of the first capacitive element Cc1 is also connected to the one of the source and the drain of the first band control transistor M13. The other end of the first capacitive element Cc1 is connected to the first readout node FD1.

A gate of the first band control transistor M13 receives a first band control signal Vrs3, and the state of the first band control transistor M13 is determined by the voltage of the first band control signal Vrs3. For example, in a case where the first band control signal Vrs3 is at a high level, the first band control transistor M13 is on, and the readout node FD1, the first amplifier transistor M10, the first band control transistor M13, and the first capacitive element Cc1 form a feedback path. A resistance component of the first band control transistor M13 increases when the voltage of the first band control signal Vrs3 decreases. This narrows the bandwidth of the first band control transistor M13 and narrows a frequency region of a signal that is fed back. While a feedback path is being formed, a signal that is output by the first band control transistor M13 is attenuated by an attenuation circuit formed by the first capacitive element Cc1 and parasitic capacitance of the readout node FD1 and is fed back to the readout node FD1. An attenuation rate B is expressed by B=Cc/(Cc+CFD) where Cc is the capacitance value of the first capacitive element Cc1 and CFD is the parasitic capacitance of the readout node FD1. Furthermore, when the voltage of the first band control signal Vrs3 decreases to a low level, the first band control transistor M13 is turned off, and no feedback path is formed. The readout node FD1 is further connected to one of a source and a drain of the first reset transistor M12. The other one of the source and the drain of the first reset transistor M12 is connected to the connection node RD1.

A gate of the first reset transistor M12 receives a first reset control signal Vrs1, and the state of the first reset transistor M12 is determined by the voltage of the first reset control signal Vrs1. For example, in a case where the first reset control signal Vrs1 is at a high level, the first reset transistor M12 is on, and the readout node FD1 has the same voltage as the connection node RD1. In this case, in a case where the first band control signal Vrs3 is also at a high level, both of the first reset transistor M12 and the first band control transistor 13M are on, and both of the readout node FD1 and the connection node RD1 have a desired reset voltage VRST. One of a source and a drain of the first selection transistor M11 is connected to the vertical signal line 9. A gate of the first selection transistor M11 receives a first selection control signal Vsel1, and the state of the first selection transistor M11 is determined by the voltage of the first selection control signal Vsel1. For example, in a case where the first selection control signal Vsel1 is at a high level, the first selection transistor M11 is on, and the first amplifier transistor M10 and the vertical signal line 9 are electrically connected. In a case where the first selection control signal Vsel1 is at a low level, the first selection transistor M11 is off, and the first amplifier transistor M10 and the vertical signal line 9 are electrically separated.

Figure 15:
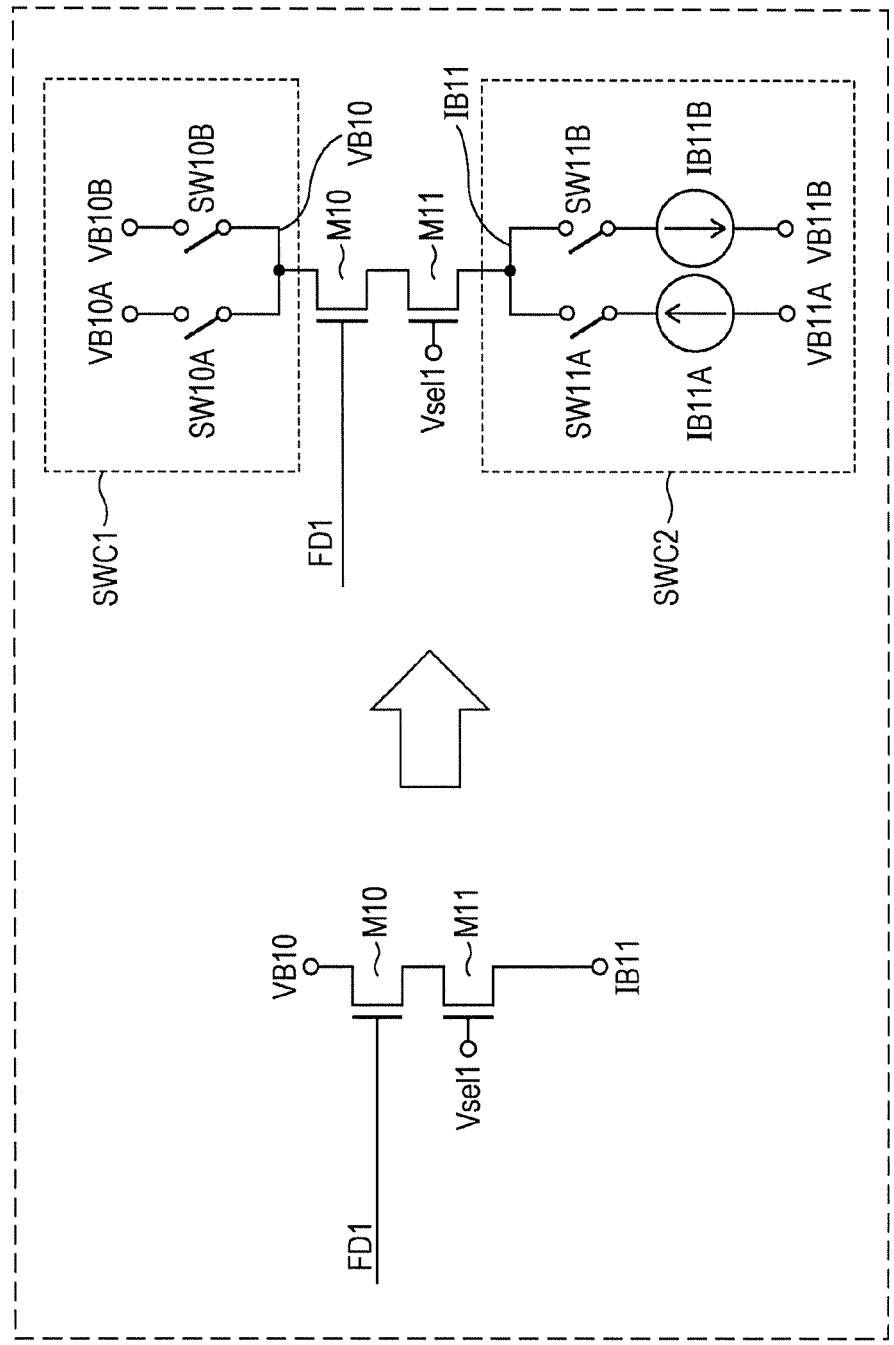
FIG. 15 is a schematic view illustrating part of a first signal processing circuit of a first pixel cell.

FIG. 15 illustrates part of the first signal processing circuit P1 of the first pixel cell 1a. A first switching circuit SWC1 is connected to one of a source and a drain of the first amplifier transistor M10. The first switching circuit SWC1 includes switch elements SW10A and SW10B. The switch elements SW10A and SW10B are connected to reference voltages VB10A and VB10B, respectively. The reference voltage VB10A can be input to the one of the source and the drain of the first amplifier transistor M10 via the switch element SW10A, and the reference voltage VB10B can be input to the one of the source and the drain of the first amplifier transistor M10 via the switch element SW10B. The voltage of the one of the source and the drain of the first amplifier transistor M10 can be switched by a control signal. The reference voltage VB10A is, for example, GND, and the reference voltage VB10B is, for example, VDD. Note that the first switching circuit SWC1 may be provided for each unit pixel or may be shared by a plurality of unit pixels in order to reduce the number of elements per unit pixel.

A second switching circuit SWC2 is connected to the vertical signal line 9. The second switching circuit SWC2 includes switch elements SW11A and SW11B. The switch elements SW11A and SW11B are connected to reference voltages VB11A and VB11B via constant electric current sources IB11A and IB11B, respectively. The reference voltage VB11A is, for example, VDD, and the reference voltage VB11B is, for example, GND.

Assume that the switch elements SW10A and SW11A are selectively turned on. In this case, in a case where the voltage of the first selection control signal Vsel1 is at a high level, the first selection transistor M11 is on, and the constant electric current source IB11A and the first amplifier transistor M10 form an inverting amplifier circuit. As a result, the readout node FD1, the first amplifier transistor M10, the first band control transistor M13, and the first capacitive element Cc1 form a feedback path.

Assume that the switch elements SW10B and SW11B are selectively turned on. In this case, in a case where the voltage of the first selection control signal Vsel1 is at a high level, the first selection transistor M11 is on, and the first amplifier transistor M10 and the constant electric current source IB11B form a source follower circuit. As a result, a signal of the readout node FD1 is output to the vertical signal line 9.

Operation of First Pixel Cell 1a

Figure 16:
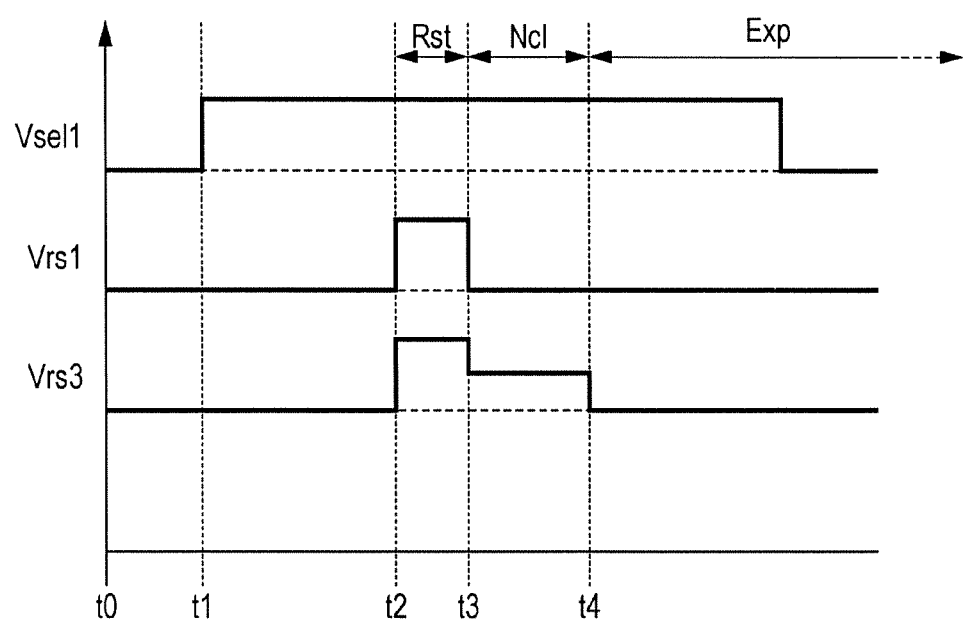
FIG. 16 is a timing diagram illustrating an example of operation timings of the first pixel cell according to exemplary Third Embodiment.

FIG. 16 illustrates an example of operation timings of the first pixel cell 1a according to the present embodiment.

Reset Period

First, the first selection control signal Vsel1 is brought into a high level. Furthermore, the constant electric current source IB11A is connected to the vertical signal line 9, and one of the source and the drain of the first amplifier transistor M10 is set to the reference voltage VB10A by controlling the first and second switching circuits SWC1 and SWC2 (time t1). Next, the voltage of the first band control signal Vrs3 is brought into a high level so that the first band control transistor M13 is turned on. Furthermore, the first reset control signal Vrs1 is brought into a high level so that the first reset transistor M12 is turned on (time t2). This makes the voltage of the readout node FD1 equal to the reset voltage VRST.

Noise Suppression Period

Next, the first reset control signal Vrs1 is brought into a low level so that the first reset transistor M12 is turned off (time t3). In this state, the first signal detection circuit forms a feedback path at an amplification factor (=−A×B), the kTC noise of the readout node FD1 that occurs when the first reset transistor M12 is turned off is suppressed to 1/(1+A×B). Furthermore, noise is suppressed at high speed by setting the voltage of the first band control signal Vrs3 so that the operation bandwidth of the first band control transistor M13 is a first bandwidth that is a broad bandwidth.

At the same timing, the first band control signal Vrs3 is set to an intermediate voltage between the high level and the low level (time t3). Note that this timing may be slightly later than the time t3. At this point in time, the operation bandwidth of the first band control transistor M13 is a second bandwidth that is lower than the first bandwidth. The noise suppressing effect is increased by making the second bandwidth sufficiently lower than the operation bandwidth of the first amplifier transistor M10. However, trade-off for this is extension of a period necessary for noise suppression. The noise suppression effect is obtained even in a case where the second bandwidth is higher than the operation bandwidth of the first amplifier transistor M10. A designer can design the second bandwidth to any value in accordance with a period for noise suppression. In the present embodiment, it is assumed that the second bandwidth is sufficiently lower than the operation bandwidth of the first amplifier transistor M10.

In a state where the second bandwidth is lower than the operation bandwidth of the first amplifier transistor M10, thermal noise that occurs in the first band control transistor M13 is suppressed to be $1/(1+A\times B)^{1/2}$ times by a feedback circuit. In this state, the first band control signal Vrs3 is set to a low level so that the first band control transistor M13 is turned off (time t4). At this point in time, kTC noise that remains in the readout node FD1 is the sum of squares of kTC noise resulting from the first reset transistor M12 and kTC noise resulting from the first band control transistor M13. When Cs is the capacitance value of the second capacitive element Cs1, the kTC noise of the first band control transistor M13 that occurs in a state where there is no suppression by feedback is $(CFD/Cs)^{1/2}$ times the kTC noise of the first reset transistor M12 that occurs in a state where there is no suppression by feedback. When this is taken into consideration, the kTC noise is suppressed to be $[1+(1+A\times B)\times CFD/Cs]^{1/2}/(1+A\times B)$ times as compared with a case where there is no feedback.

Note that the first band control signal Vrs3 may be controlled to a voltage that changes across a threshold voltage of the first band control transistor M13 so that the first band control transistor M13 gradually changes from an ON state to an OFF state. This makes it possible to suppress noise of all of the unit pixels 1 even in a case where there are variations in threshold voltage of the first band control transistor M13 among the plurality of unit pixels 1 that constitute the imaging device 100. Furthermore, a voltage range in which the first band control signal Vrs3 is changed may be limited to a range of the variations of the unit pixels 1. This makes it possible to shorten a period for the change and achieve high speed noise suppression.

Exposure/Readout Period

Next, the constant electric current source IB11B is connected to the vertical signal line 9, and the voltage of one of the source and the drain of the first amplifier transistor M10 is set to the reference voltage VB10B by controlling the first and second switching circuits SWC1 and SWC2. In this state, the first amplifier transistor M10 and the constant electric current source IB11B constitute a source follower circuit, and the voltage of the vertical signal line 9 has a level corresponding to the voltage of the readout node FD1. However, an amplification factor of the source follower circuit is approximately 1. At this point in time, a voltage signal that has changed by a degree corresponding to the electric signal generated in the first photoelectric converter PC1 from the time of completion of noise suppression (time t4) to readout is accumulated in the readout node FD1. The voltage signal of the readout node FD1 is output to the vertical signal line 9 at an amplification factor of approximately 1 by the source follower circuit. Random noise is a fluctuation of output (i.e., kTC noise) obtained when the electric signal generated in the first photoelectric converter PC1 is 0. The kTC noise is suppressed to be $[1+(1+A\times B)\times CFD/Cs]^{1/2}/(1+A\times B)$ times during the noise suppression period. Furthermore, during the exposure/readout period, the voltage signal of the readout node FD1 is output to the vertical signal line 9 at an amplification factor of approximately 1. Therefore, according to the present embodiment, it is possible to acquire good image data in which random noise is suppressed.

The random noise is suppressed by increasing the second capacitive element Cs1 as much as the area permits. In general, the random noise is reduced by increasing capacitance. However, when the electric charge signal is converted into a voltage signal in the readout node FD1, the signal itself decreases. As a result, S/N is not improved.

In the present embodiment, since the readout node FD1 and the connection node RD1 are separated by the first capacitive element Cc1, the signal decrease does not occur even in a case where the capacitance of the second capacitive element Cs1 is increased. Since only the random noise is suppressed, the S/N ratio can be improved. Therefore, the present embodiment is effective in an imaging device in which the area of each unit pixel 1 can be made large.

A post-stage circuit for detecting a signal of the vertical signal line 9 may be connected, for example, as illustrated in FIG. 4. The post-stage circuit is, for example, constituted by a first vertical scanning circuit 2, a second vertical scanning circuit 2', a first column AD conversion circuit 4, and a second column AD conversion circuit 4'. However, the present disclosure is not limited to such a circuit configuration.

In the imaging device 100, CDS for cancelling a variation of the post-stage circuit may be performed. Specifically, the aforementioned reset operation is performed again after readout of a signal voltage. After completion of the reset operation, the readout operation described in Exposure/Readout Period is performed before light detection by the first photoelectric converter PC1. In this way, a reference voltage can be read out. A signal excluding fixed noise can be obtained by finding a difference between the signal voltage and the reference voltage.

In the present embodiment, a signal of the readout node FD1 is read out by the source follower circuit at an amplification factor of approximately 1 during the exposure/readout period. However, the present disclosure is not limited to this. The amplification factor may be changed by a designer in accordance with an S/N ratio and a circuit range necessary for a system. Furthermore, the reset voltage of the readout node FD1 in the reset period may be supplied via the connection node RD1 as illustrated in FIG. 11 or may be directly supplied from the first amplifier transistor M10 as illustrated in FIG. 13. Alternatively, it is also possible to employ a configuration in which a desired voltage value is supplied from an outside. According to these examples of the configuration, wires that connect nodes can be optimized in a pixel layout having a small area, and thus a pixel area can be reduced.

According to the present embodiment, feedback for noise cancelling can be performed within a pixel excluding an electric current source. This makes it possible to reduce the influence of a time constant of the vertical signal line 9, thereby allowing high-speed noise cancelling. Furthermore, a noise suppression effect can be increased by increasing the capacitance value of a capacitive element disposed in the unit pixel 1.

Fourth Embodiment

An example of a circuit configuration of a unit pixel 1 according to Fourth Embodiment is described below with reference to FIGS. 17 to 20I.

Figure 17:
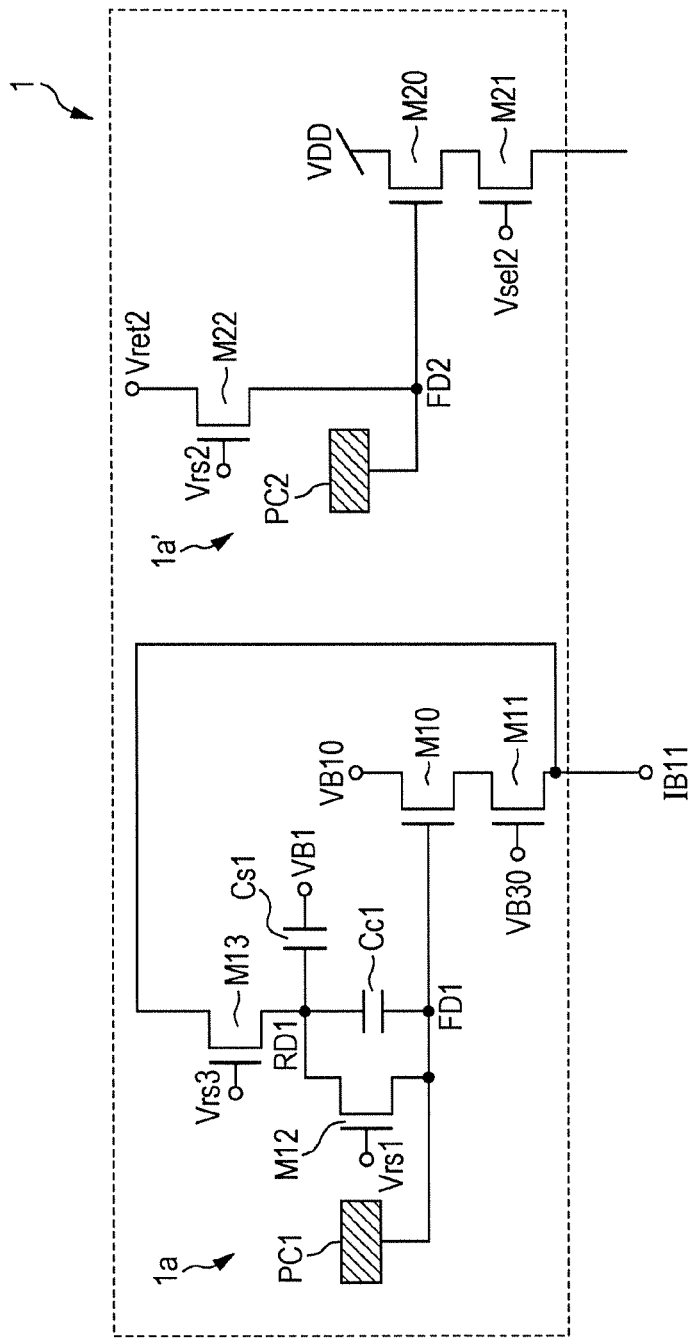
FIG. 17 is a schematic view illustrating a circuit configuration of a unit pixel according to exemplary Fourth Embodiment.

FIG. 17 illustrates an example of a circuit configuration of the unit pixel 1 according to the present embodiment. The unit pixel 1 includes a first pixel cell 1a and a second pixel cell 1a'. The first pixel cell 1a functions as a low-noise cell. The first pixel cell 1a includes a first photoelectric converter PC1 that converts light into an electric signal and a first signal processing circuit P1 that is electrically connected to the first photoelectric converter PC1 and reads out the electric signal generated in the first photoelectric converter PC1.

The first signal processing circuit P1 includes a first signal detection circuit that detects the electric signal generated in the first photoelectric converter PC1. The first signal detection circuit includes a first amplifier transistor M10, a first selection transistor M11, a first reset transistor M12, a capacitance circuit, and a first band control transistor M13. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. The first amplifier transistor M10 and the first selection transistor M11 constitute cascode connection during a feedback operation of the feedback circuit. One of a source and a drain of the first reset transistor M12 is connected to a readout node FD1. The first reset transistor M12 resets (initializes) the readout node FD1 connected to the first photoelectric converter PC1. The capacitance circuit includes a first capacitive element Cc1 one end of which is electrically connected to the readout node FD1 and a second capacitive element Cs1 having a larger capacitance value than the first capacitive element Cc1. The first capacitive element Cc1 is connected in series with the second capacitive element Cs1. One of a source and a drain of the first band control transistor M13 is connected to a connection node RD1 between the first capacitive element Cc1 and the second capacitive element Cs1 and performs band control of a first feedback circuit.

The first signal processing circuit includes the first feedback circuit that forms a first feedback path for negative feedback and suppression of noise that occurs when the first reset transistor M12 is turned off. The first feedback circuit performs negative feedback via the first amplifier transistor M10, the first selection transistor M11, the first band control transistor M13, and the first capacitive element Cc1.

The second pixel cell 1a' functions as a high-saturation cell. The second pixel cell 1a' includes a second photoelectric converter PC2 that converts light into an electric signal and a second signal processing circuit P2 that is electrically connected to the second photoelectric converter PC2 and reads out the electric signal generated in the second photoelectric converter PC2.

The second signal processing circuit P2 includes a second signal detection circuit that detects the electric signal generated in the second photoelectric converter PC2. The second signal detection circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated in the second photoelectric converter PC2. One of a source and a drain of the second selection transistor M21 is connected to one of a source and a drain of the second amplifier transistor M20. The second selection transistor M21 selectively outputs the signal amplified by the second amplifier transistor M20. The second reset transistor M22 is connected to a readout node FD2 and resets (initializes) the readout node FD2 connected to the second photoelectric converter PC2.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene.

Since the first pixel cell 1a includes the first feedback circuit, the first pixel cell 1a can markedly suppress noise that occurs when the first reset transistor M12 is turned off. Meanwhile, noise characteristics of the second pixel cell 1a' do not pose a problem even in a case where the noise characteristics are equivalent to conventional ones. A gate width of the first amplifier transistor M10 may be larger than that of the second amplifier transistor M20. This makes it possible to set gm of the first amplifier transistor M10 large. As a result, it is possible to reduce readout noise of the first pixel cell 1a. Meanwhile, noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones.

Figure 18:
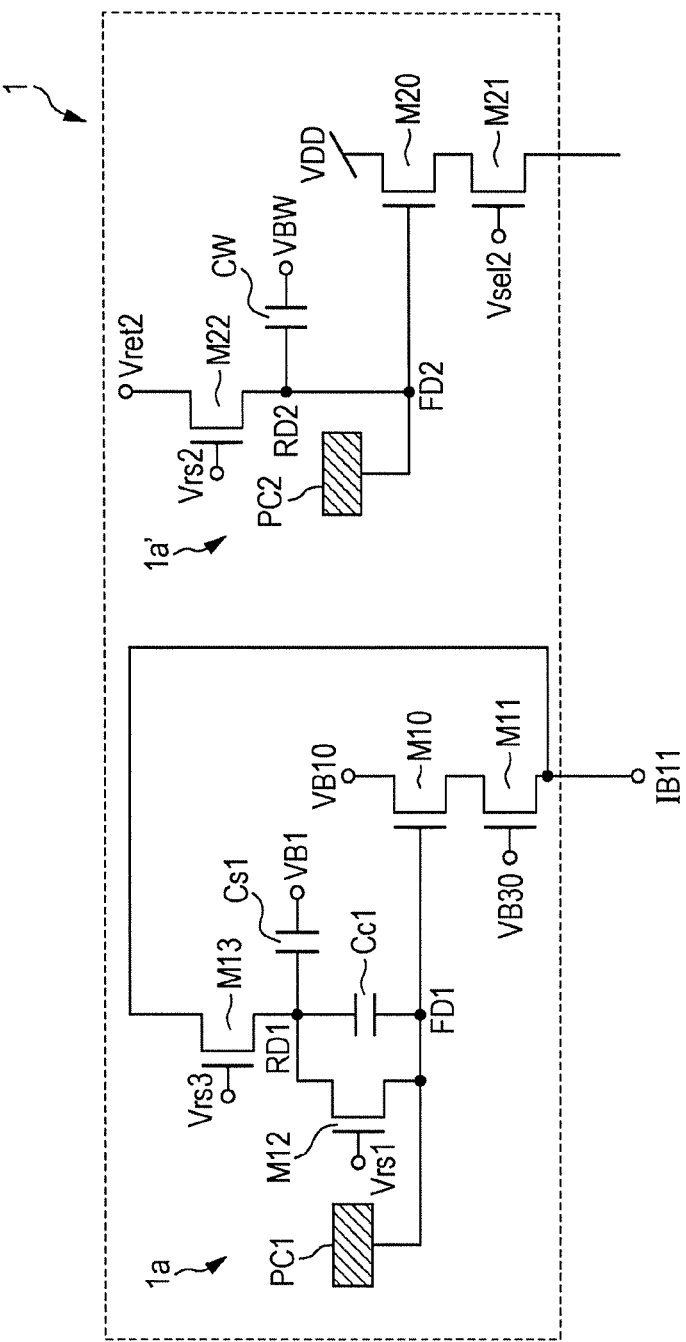
FIG. 18 is a schematic view illustrating another circuit configuration of the unit pixel according to exemplary Fourth Embodiment.
Figure 19:
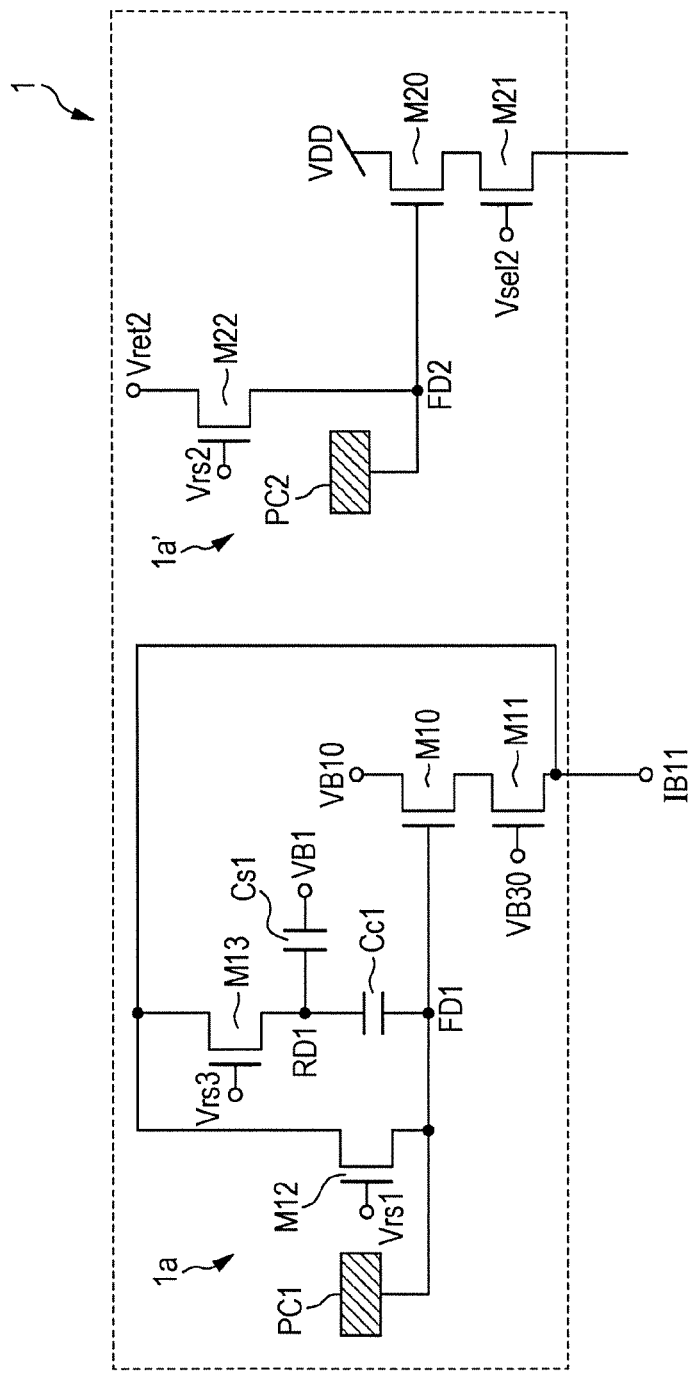
FIG. 19 is a schematic view illustrating another circuit configuration of the unit pixel according to exemplary Fourth Embodiment.

FIGS. 18 and 19 illustrate other examples of a circuit configuration of the unit pixel 1 according to the present embodiment. As illustrated in FIG. 18, a fifth capacitive element CW that is electrically connected between the second photoelectric converter PC2 and a reference voltage VBW is provided. This makes it possible to improve the high-saturation characteristics of the second pixel cell 1a' by a degree corresponding to a capacitance ratio. As a result, it is possible to further widen a dynamic range. A method for setting a reset voltage can be changed by changing a method of connection of the first reset transistor M12. As a result, it is possible to shorten a period for convergence to a reset voltage.

According to the present embodiment, it is possible to suppress an unnecessary increase in pixel size. Furthermore, according to the present embodiment, it is possible to provide a small imaging device in which low-noise high-sensitivity imaging is achieved by the first pixel cell 1a and high-saturation low-sensitivity imaging is achieved by the second pixel cell 1a'. Furthermore, according to the present embodiment, a subject having a large difference in brightness can be imaged without a time lag and without blown out highlights and blocked up shadows.

It is desirable that the first reset transistor M12 be connected between the readout node FD1 connected to the first photoelectric converter PC1 and the connection node RD1 between the first capacitive element Cc1 and the second capacitive element Cs1, as illustrated in FIG. 17. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 19. According to such a configuration, it is unnecessary to additionally provide a reset voltage Vret (=VRST). Furthermore, since convergence into a value close to a reset value can be achieved by feedback, the speed of noise cancelling can be increased.

Still other examples of a circuit configuration of the first and second pixel cells 1a and 1a' according to the present embodiment are described below.

Figure 20A:
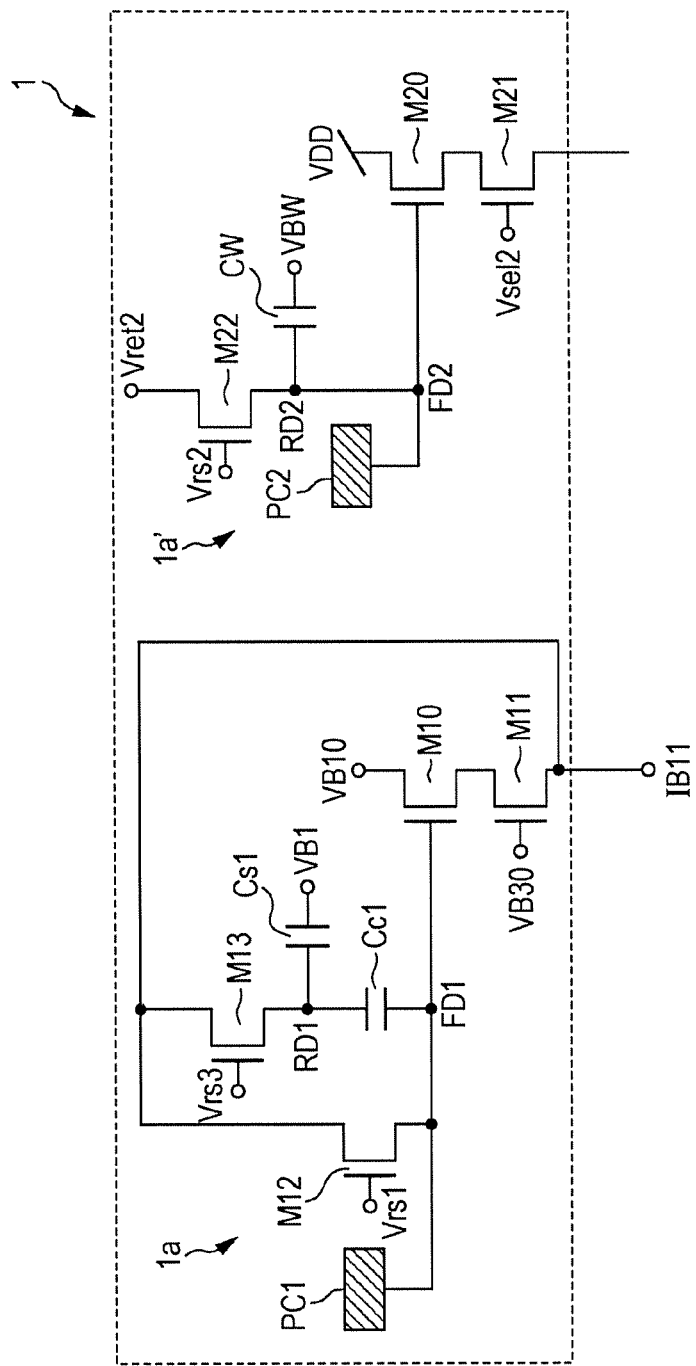
FIG. 20A is a schematic view illustrating still another circuit configuration of the unit pixel according to exemplary Fourth Embodiment.
Figure 20B:
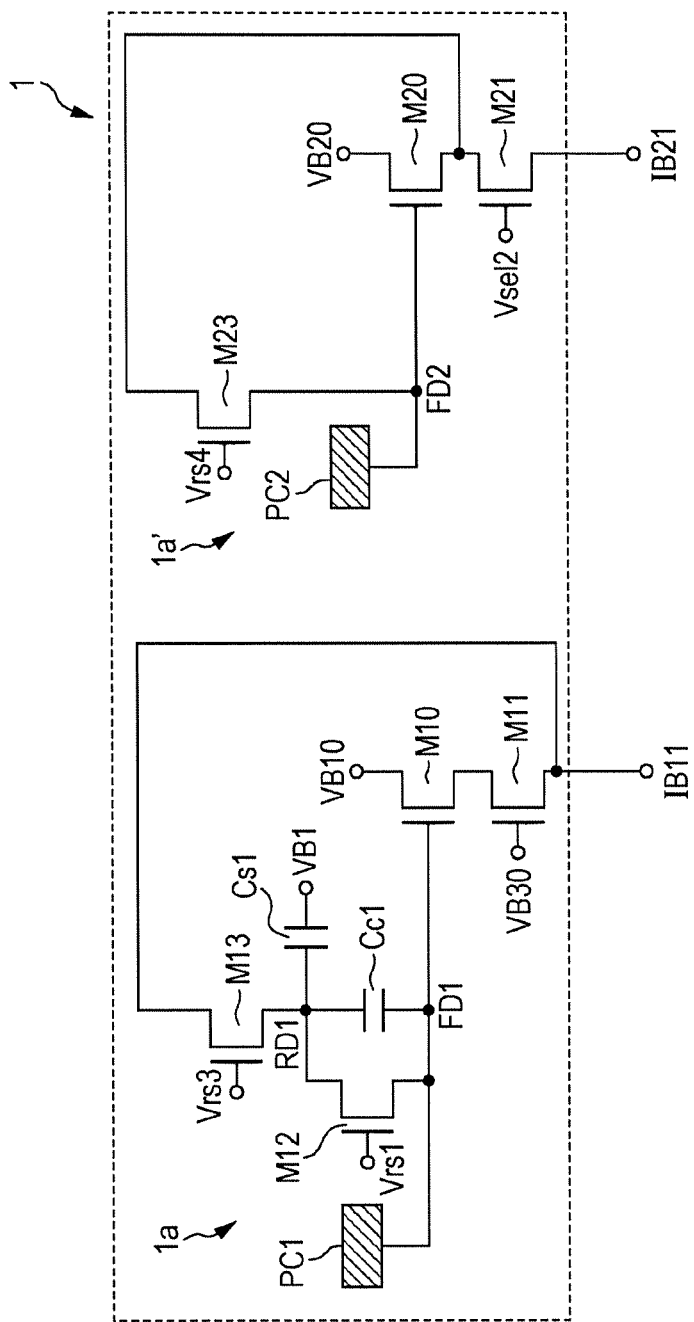
FIG. 20B is a schematic view illustrating still another circuit configuration of the unit pixel according to exemplary Fourth Embodiment.
Figure 20C:
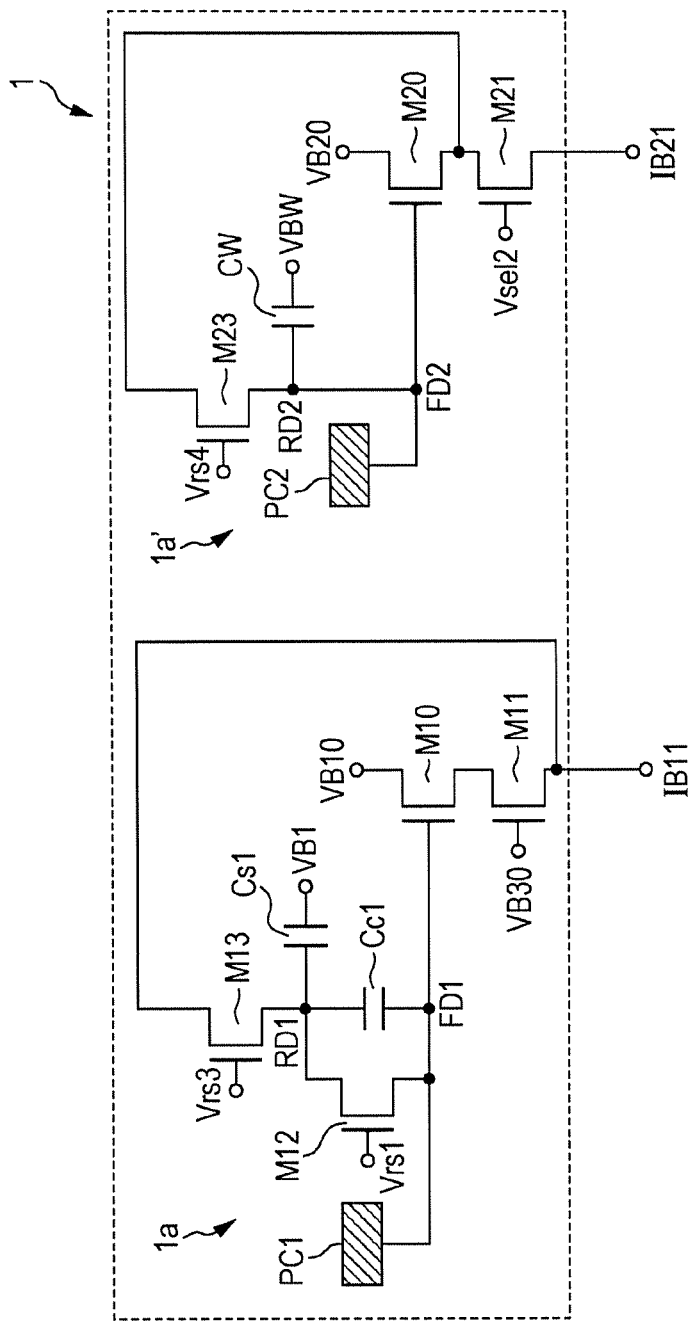
FIG. 20C is a schematic view illustrating still another circuit configuration of the unit pixel according to exemplary Fourth Embodiment.
Figure 20D:
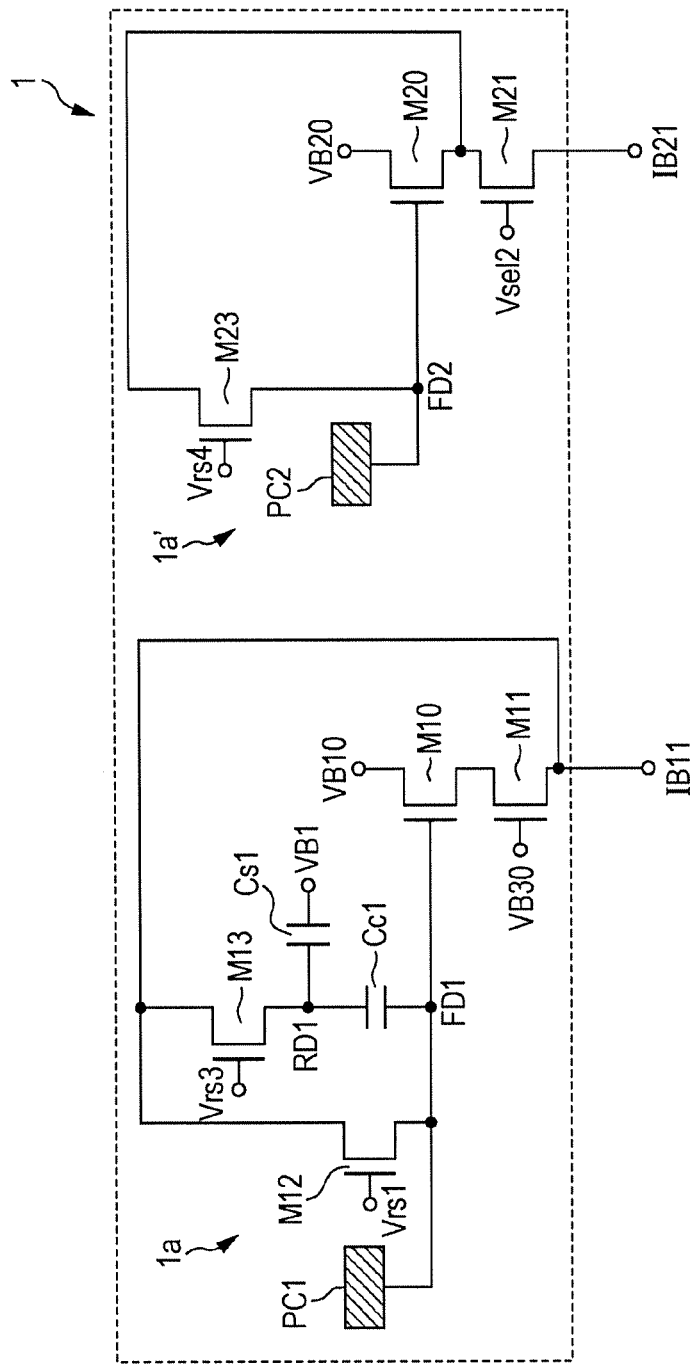
FIG. 20D is a schematic view illustrating still another circuit configuration of the unit pixel according to exemplary Fourth Embodiment.
Figure 20E:
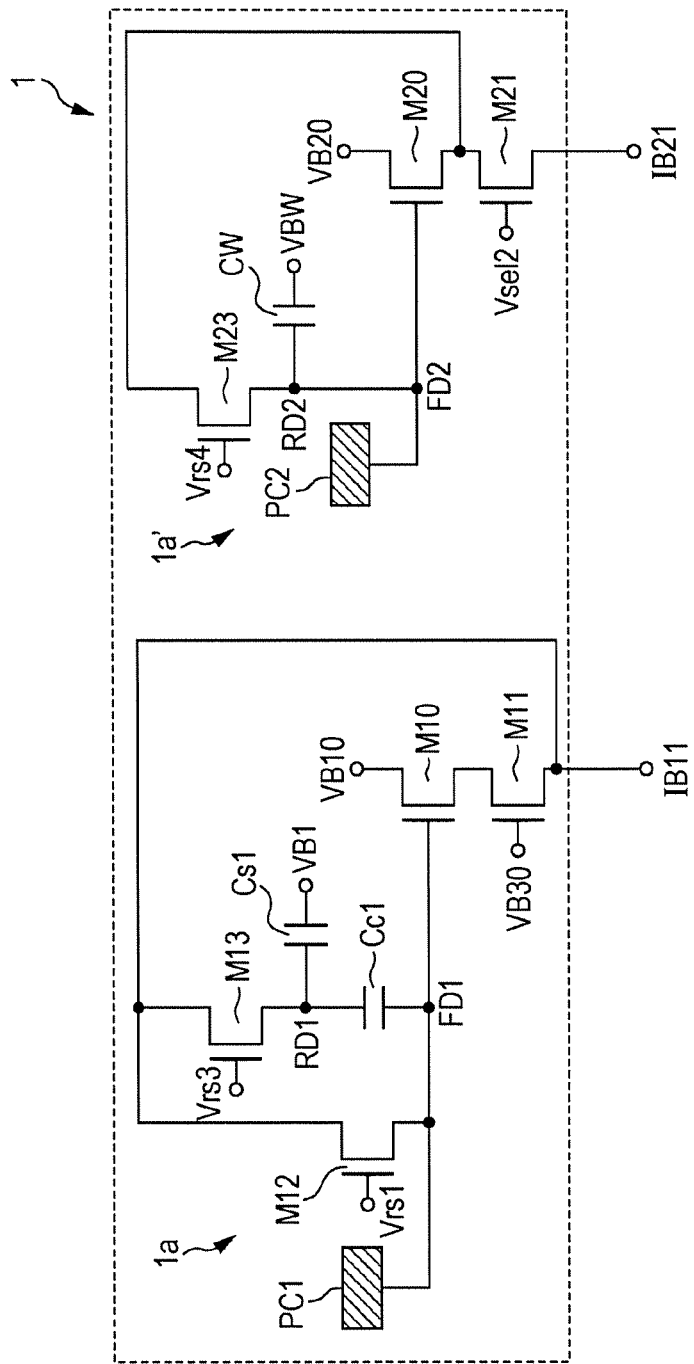
FIG. 20E is a schematic view illustrating still another circuit configuration of the unit pixel according to exemplary Fourth Embodiment.
Figure 20F:
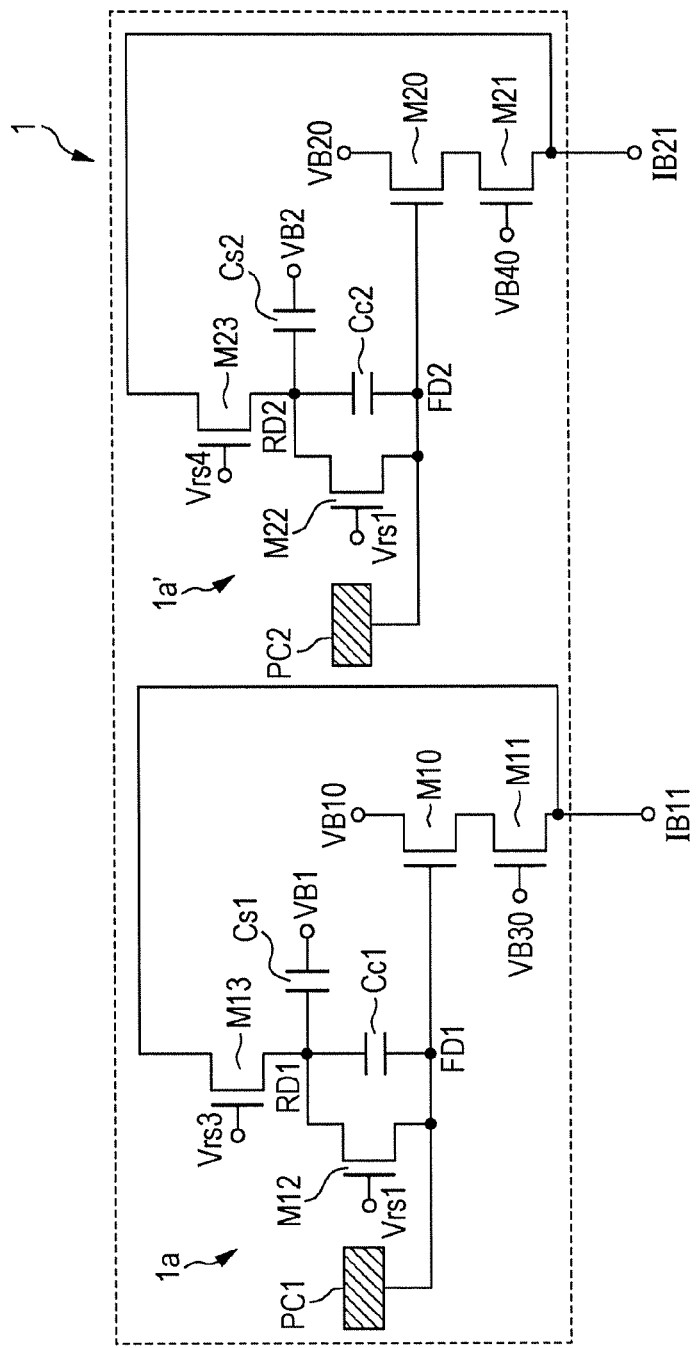
FIG. 20F is a schematic view illustrating still another circuit configuration of the unit pixel according to exemplary Fourth Embodiment.
Figure 20G:
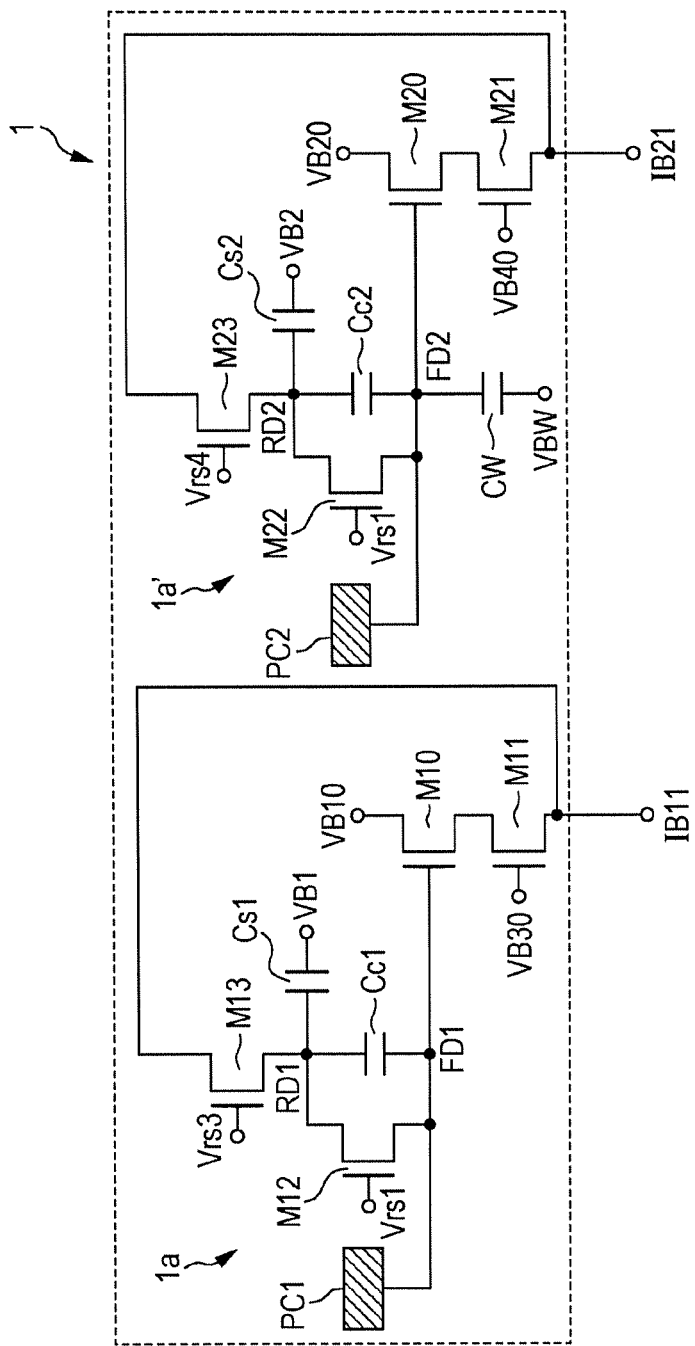
FIG. 20G is a schematic view illustrating still another circuit configuration of the unit pixel according to exemplary Fourth Embodiment.
Figure 20H:
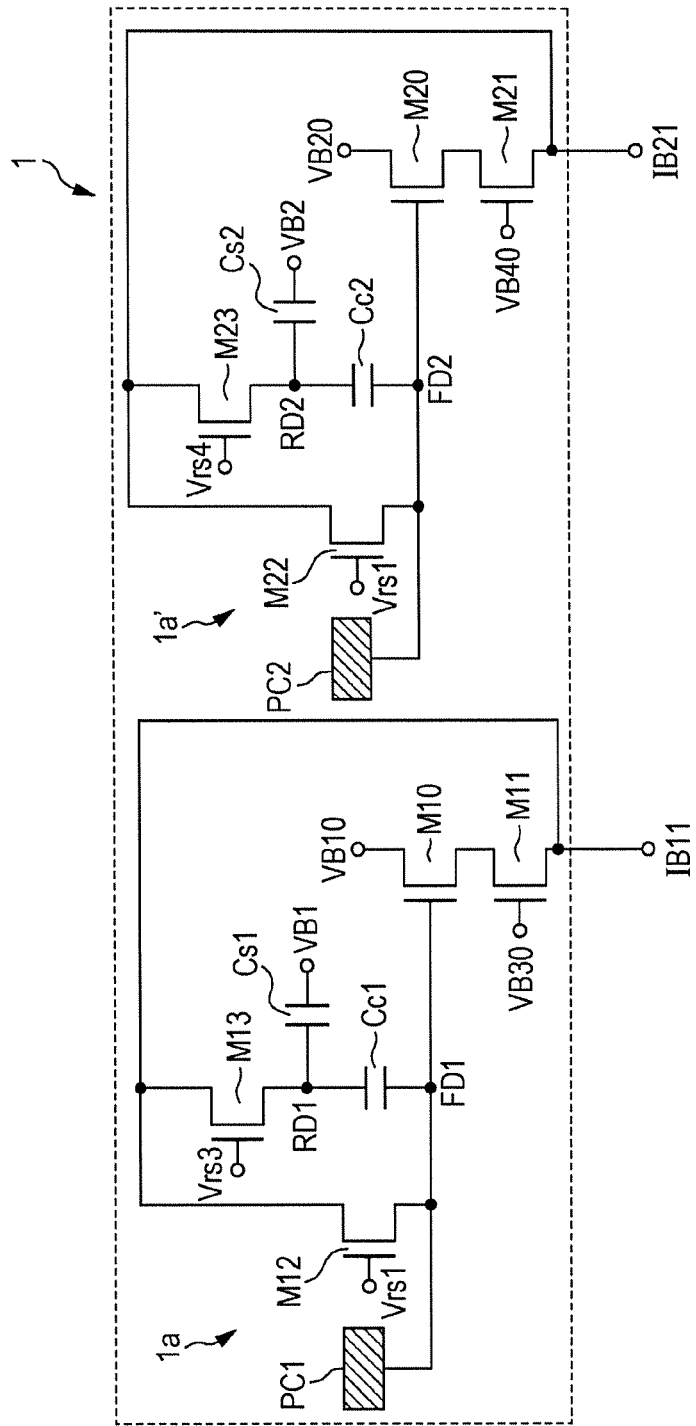
FIG. 20H is a schematic view illustrating still another circuit configuration of the unit pixel according to exemplary Fourth Embodiment.
Figure 20I:
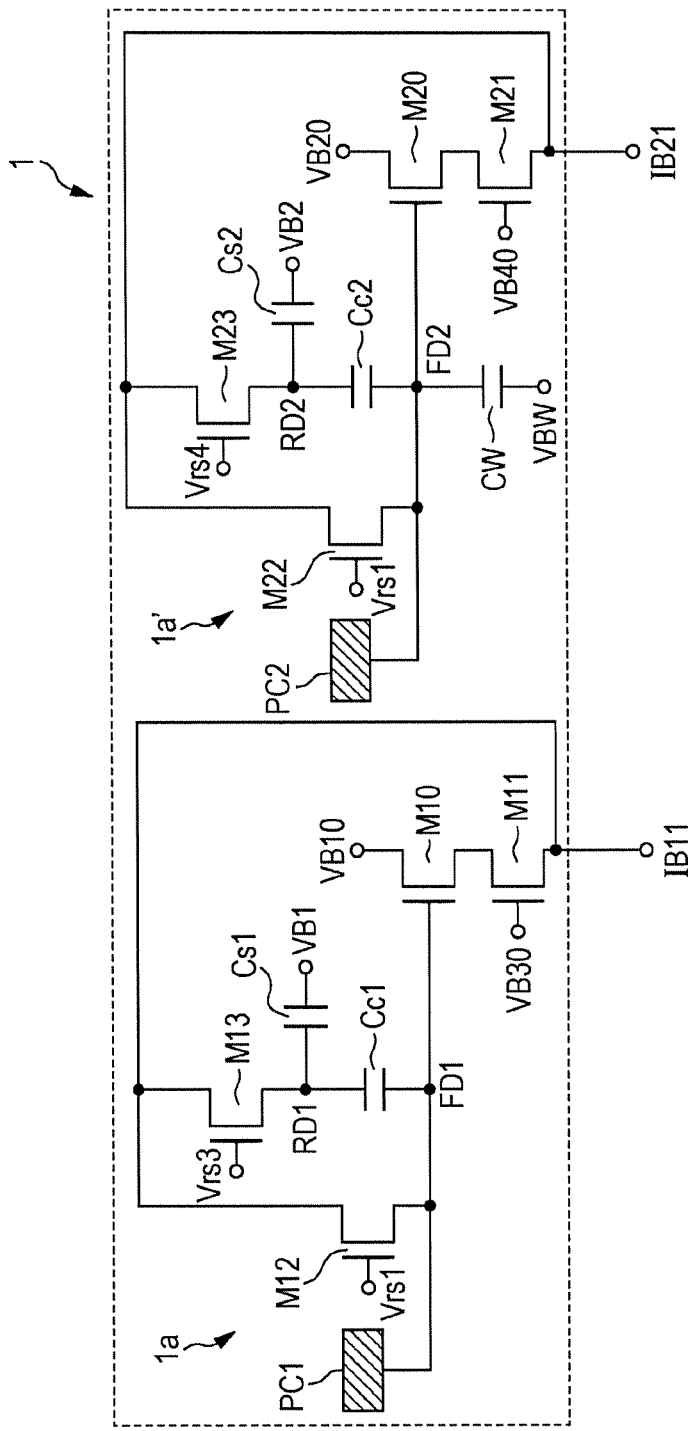
FIG. 20I is a schematic view illustrating still another circuit configuration of the unit pixel according to exemplary Fourth Embodiment.

FIGS. 20A and 20I illustrate still other examples of a circuit configuration of the first and second pixel cells 1a and 1a'. The configurations illustrated in FIGS. 17, 18, 19, and 20A through 20I correspond to the configurations illustrated in FIGS. 11, 12, 13, and 14A through 14I of Third Embodiment. The configurations illustrated in FIGS. 17, 18, 19, and 20A through 20I and the configurations illustrated in FIGS. 11, 12, 13, and 14A through 14I of Third Embodiment are different in configuration and operation of the first feedback circuit for noise suppression in the first pixel cell 1a and are the same in other configurations and operations.

An operation of the first pixel cell 1a according to the present embodiment is described below.

Readout and Noise Suppression

A noise suppression and data readout operation using the first pixel cell 1a illustrated in FIG. 17 is described below as a specific example.

In Third Embodiment, a feedback path is formed by connection between one of the source and the drain of the first amplifier transistor M10 and one of the source and the drain of the first band control transistor M13. In Fourth Embodiment, feedback is formed by connection between one of the source and the drain of the first selection transistor M11 that is not connected to the first amplifier transistor M10 and one of the source and the drain of the first band control transistor M13. In other words, in Third Embodiment, a feedback path is formed by the readout node FD1, the first amplifier transistor M10, the first band control transistor M13, and the first capacitive element Cc1. Meanwhile, in Fourth Embodiment, a feedback path is formed by the readout node FD1, the first amplifier transistor M10, the first selection transistor M11, the first band control transistor M13, and the first capacitive element Cc1.

In Third Embodiment, the first selection transistor M11 has only a function of switching a state of connection with the vertical signal line 9. Meanwhile, in Fourth Embodiment, the first selection transistor M11 also forms a feedback path in addition to the aforementioned function. Specifically, during noise suppression, a bias control signal VB30 that is supplied to the first selection transistor M11 is set to an intermediate voltage between a high level and a low level. In this state, the first amplifier transistor M10, the first selection transistor M11, and an electric current source IB11A constitute an inverting amplifier that forms cascode connection. This makes it possible to markedly improve the gain of the inverting amplifier. As a result, noise of the first pixel cell 1a can be reduced by a degree corresponding to the improvement of the gain.

Fifth Embodiment

An example of a circuit configuration of a unit pixel 1 according to Fifth Embodiment is described below with reference to FIGS. 21 to 24I.

FIG. 21 illustrates an example of a circuit configuration of the unit pixel 1 according to the present embodiment. The unit pixel 1 includes a first pixel cell 1a and a second pixel cell 1a'. The first pixel cell 1a functions as a low-noise cell. The first pixel cell 1a includes a first photoelectric converter PC1 that converts light into an electric signal and a first signal processing circuit P1 that is electrically connected to the first photoelectric converter PC1 and reads out the electric signal generated in the first photoelectric converter PC1.

The first signal processing circuit P1 includes a first signal detection circuit that detects the electric signal generated in the first photoelectric converter PC1. The first signal detection circuit includes a first amplifier transistor M10, a first selection transistor M11, a first reset transistor M12, a capacitance circuit, and a first band control transistor M13. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M12 is connected to a readout node FD1. The first reset transistor M12 resets (initializes) the readout node FD1 connected to the first photoelectric converter PC1. The capacitance circuit includes a first capacitive element Cc1 one end of which is electrically connected to the readout node FD1 and a second capacitive element Cs1 having a larger capacitance value than the first capacitive element Cc1. The first capacitive element Cc1 is connected in series with the second capacitive element Cs1. One of a source and a drain of the first band control transistor M13 is connected to a connection node RD1 between the first capacitive element Cc1 and the second capacitive element Cs1 and performs band control of a first feedback circuit.

The first signal processing circuit P1 further includes the first feedback circuit that forms a first feedback path for negative feedback and suppression of noise that occurs when the first reset transistor M12 is turned off. The first feedback circuit performs negative feedback via the first band control transistor M13 and the first capacitive element Cc1. During the negative feedback, a gate of the first band control transistor M13 serves as an input terminal of an inverting amplifier and one of a source and a drain of the first band control transistor M13 serves as an output terminal of the inverting amplifier.

The second pixel cell 1a' functions as a high-saturation cell. The second pixel cell 1a' includes a second photoelectric converter PC2 that converts light into an electric signal and a second signal processing circuit P2 that is electrically connected to the second photoelectric converter PC2 and reads out the electric signal generated in the second photoelectric converter PC2.

The second signal processing circuit P2 includes a second signal detection circuit that detects the electric signal generated in the second photoelectric converter PC2. The second signal detection circuit includes a second amplifier transistor M20, a second selection transistor M21, and a second reset transistor M22. A gate of the second amplifier transistor M20 is connected to the second photoelectric converter PC2. The second amplifier transistor M20 amplifies the electric signal generated in the second photoelectric converter PC2. One of a source and a drain of the second selection transistor M21 is connected to one of a source and a drain of the second amplifier transistor M20. The second selection transistor M21 selectively outputs the signal amplified by the second amplifier transistor M20. One of a source and a drain of the second reset transistor M22 is connected to a readout node FD2. The second reset transistor M22 resets (initializes) the readout node FD2 connected to the second photoelectric converter PC2.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene.

Since the first pixel cell 1a includes the first feedback circuit, the first pixel cell 1a can markedly suppress noise that occurs when the first reset transistor M12 is turned off. Meanwhile, noise characteristics of the second pixel cell 1a' do not pose a problem even in a case where the noise characteristics are equivalent to conventional ones. A gate width of the first amplifier transistor M10 may be larger than that of the second amplifier transistor M20. This makes it possible to set gm of the first amplifier transistor M10 large. As a result, it is possible to reduce readout noise of the first pixel cell 1a. Meanwhile, noise characteristics of the second pixel cell 1a' do not pose a problem even in a case where the noise characteristics are equivalent to conventional ones. A gate length of the first reset transistor M12 may be longer than that of the second reset transistor M22. This further improves the noise reducing effect of the first pixel cell 1a. Noise characteristics of the second pixel cell 1a' do not pose a problem even in a case where the noise characteristics are equivalent to conventional ones.

Figure 22:
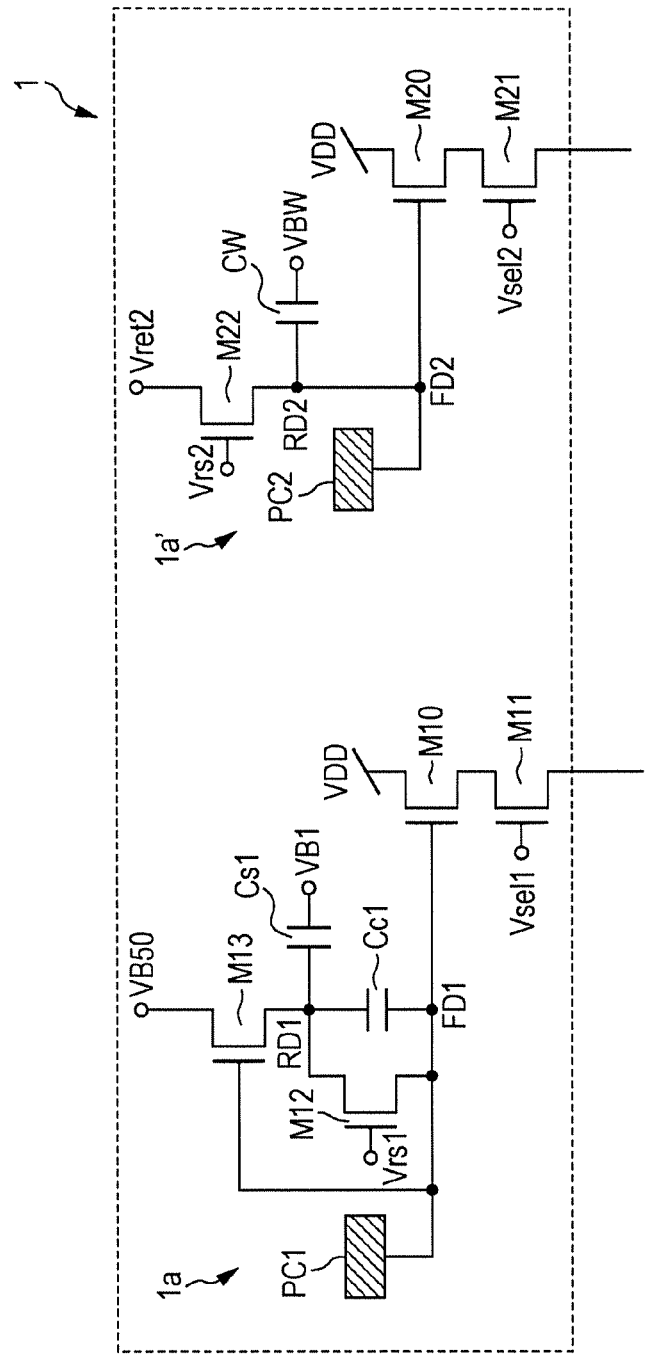
FIG. 22 is a schematic view illustrating another circuit configuration of the unit pixel according to exemplary Fifth Embodiment.
Figure 23:
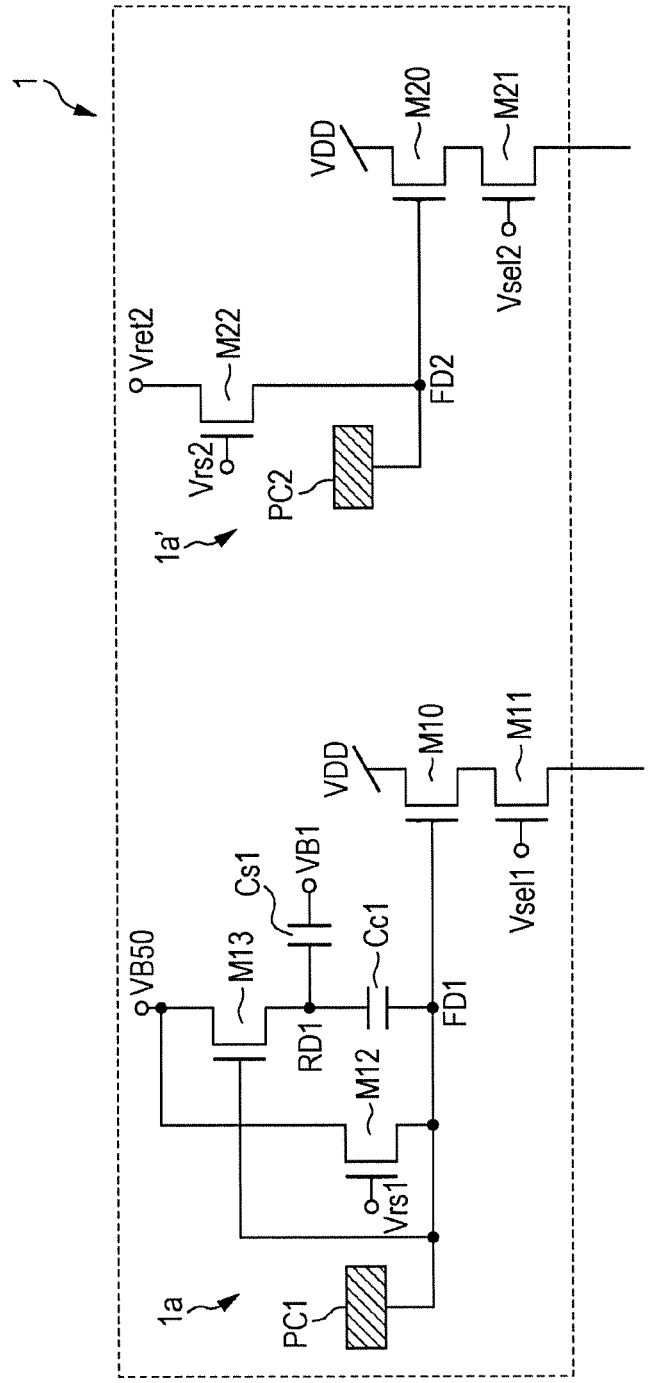
FIG. 23 is a schematic view illustrating another circuit configuration of the unit pixel according to exemplary Fifth Embodiment.
Figure 24A:
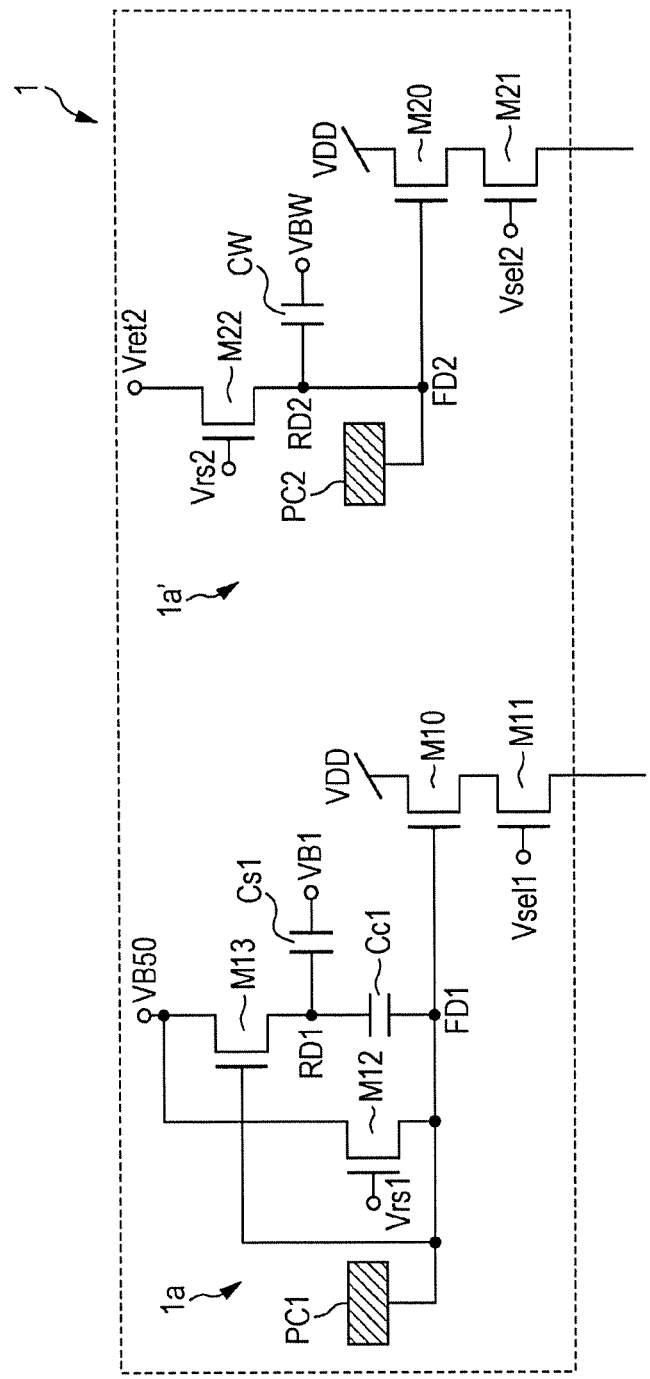
FIG. 24A is a schematic view illustrating still another circuit configuration of the unit pixel according to exemplary Fifth Embodiment.
Figure 24B:
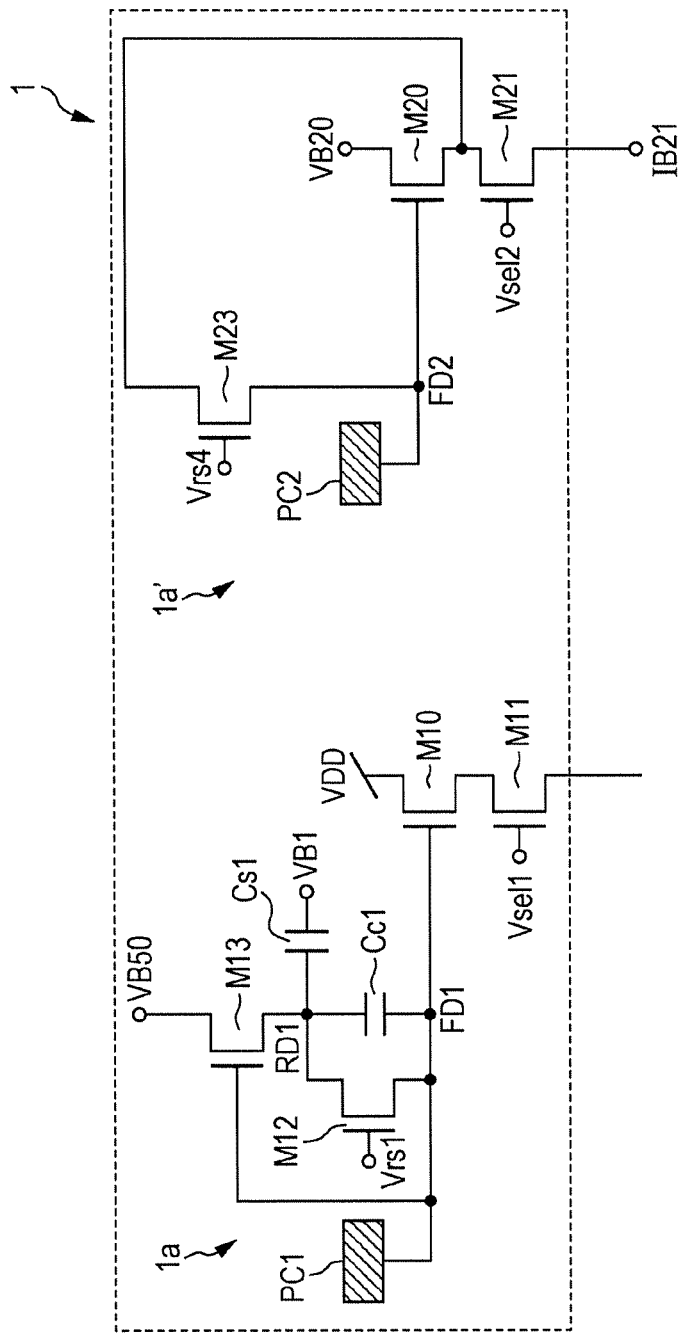
FIG. 24B is a schematic view illustrating still another circuit configuration of the unit pixel according to exemplary Fifth Embodiment.
Figure 24C:
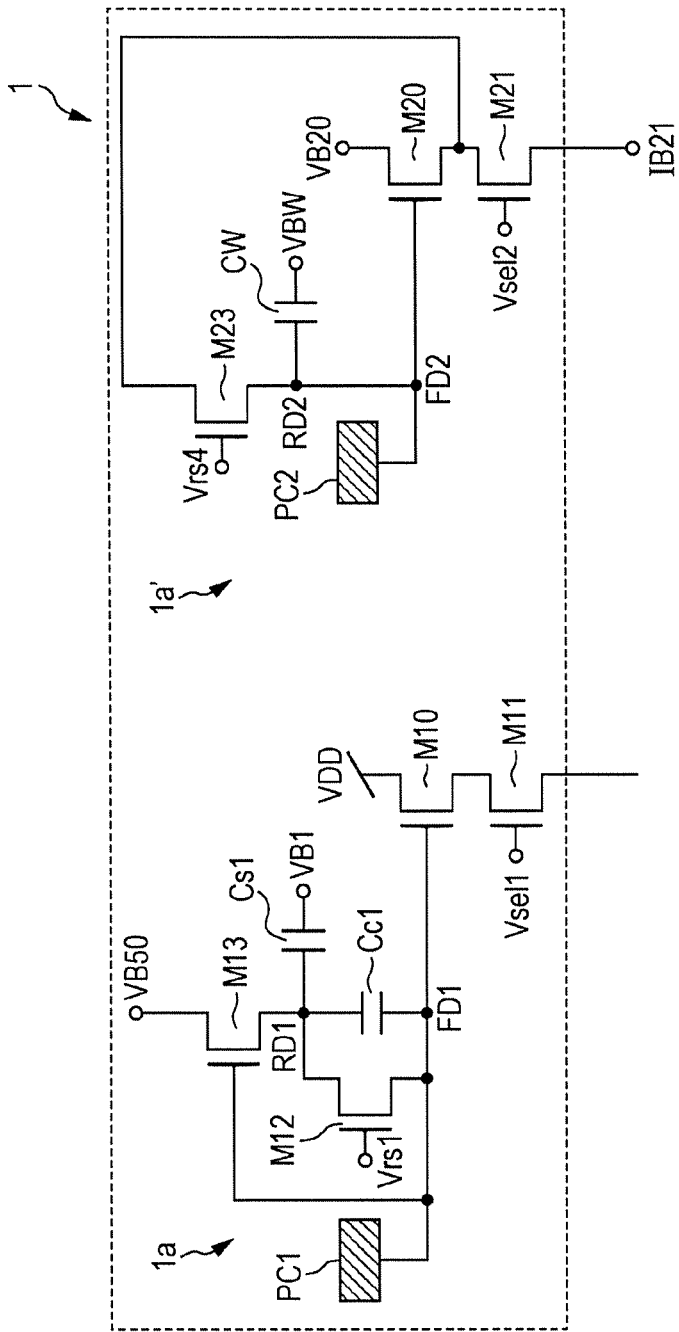
FIG. 24C is a schematic view illustrating still another circuit configuration of the unit pixel according to exemplary Fifth Embodiment.
Figure 24D:
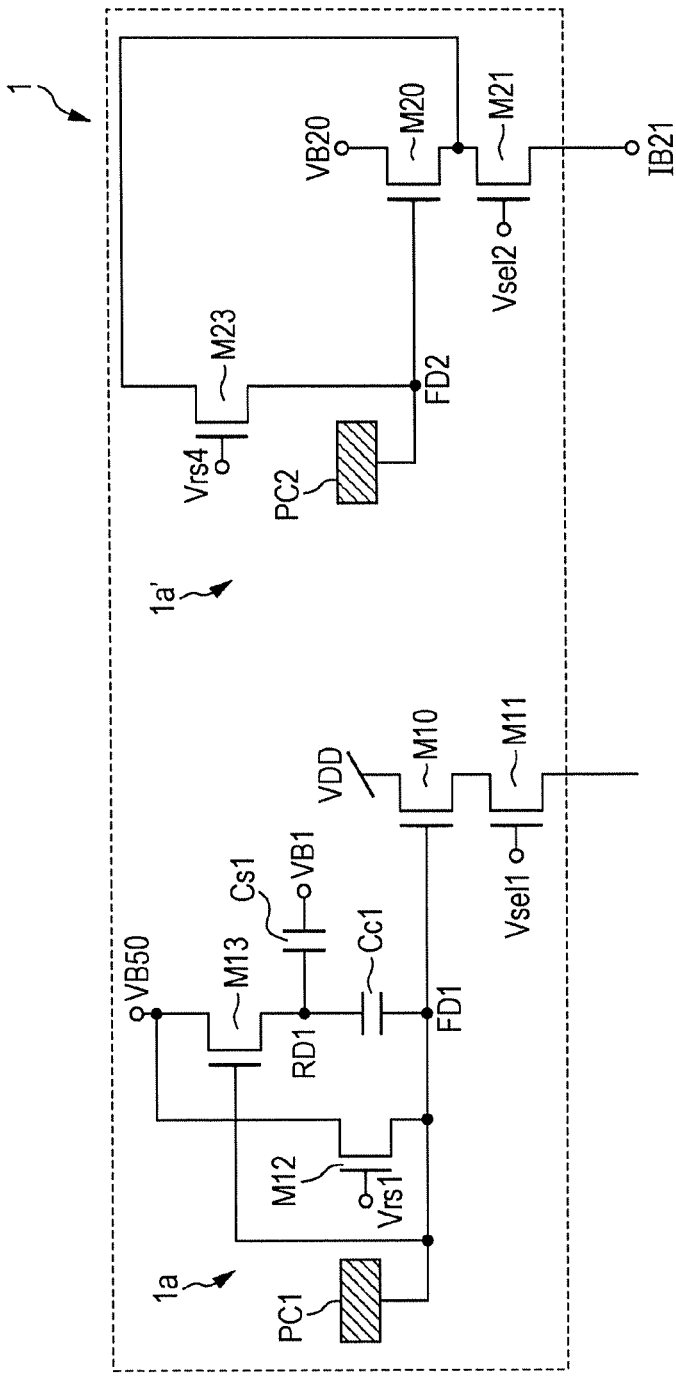
FIG. 24D is a schematic view illustrating still another circuit configuration of the unit pixel according to exemplary Fifth Embodiment.
Figure 24E:
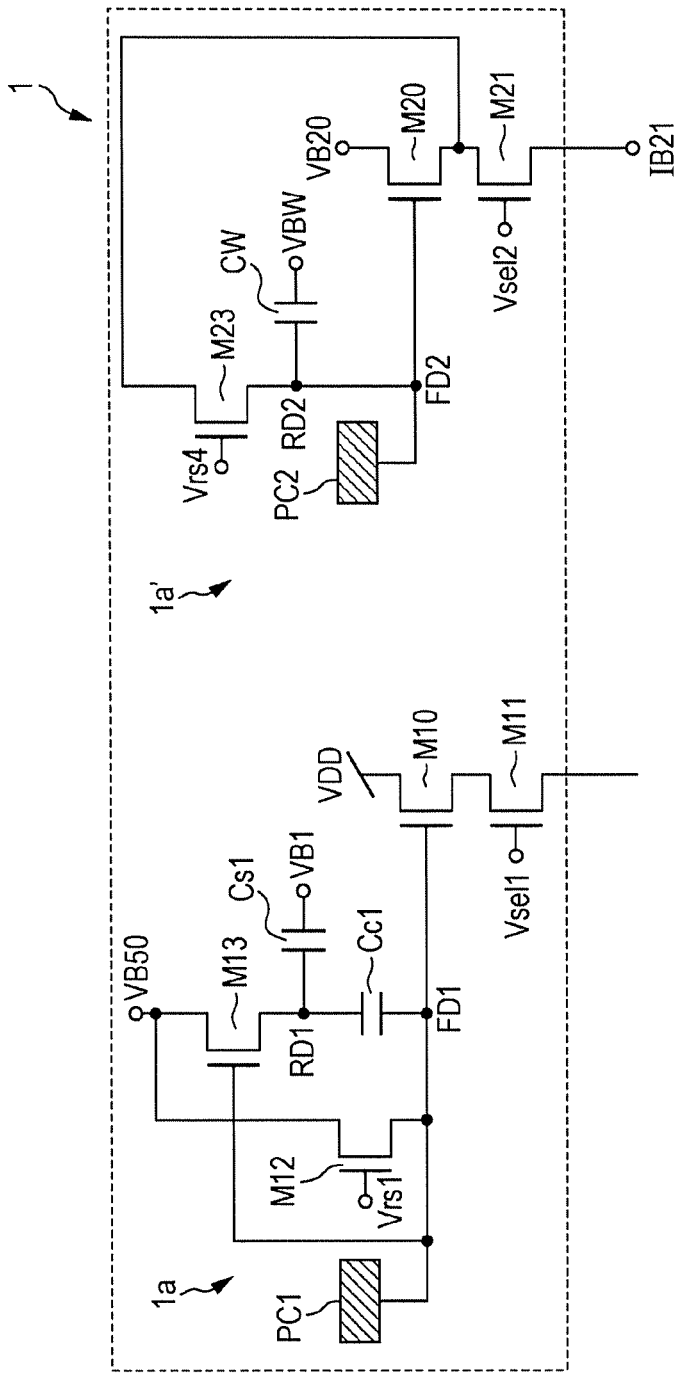
FIG. 24E is a schematic view illustrating still another circuit configuration of the unit pixel according to exemplary Fifth Embodiment.
Figure 24F:
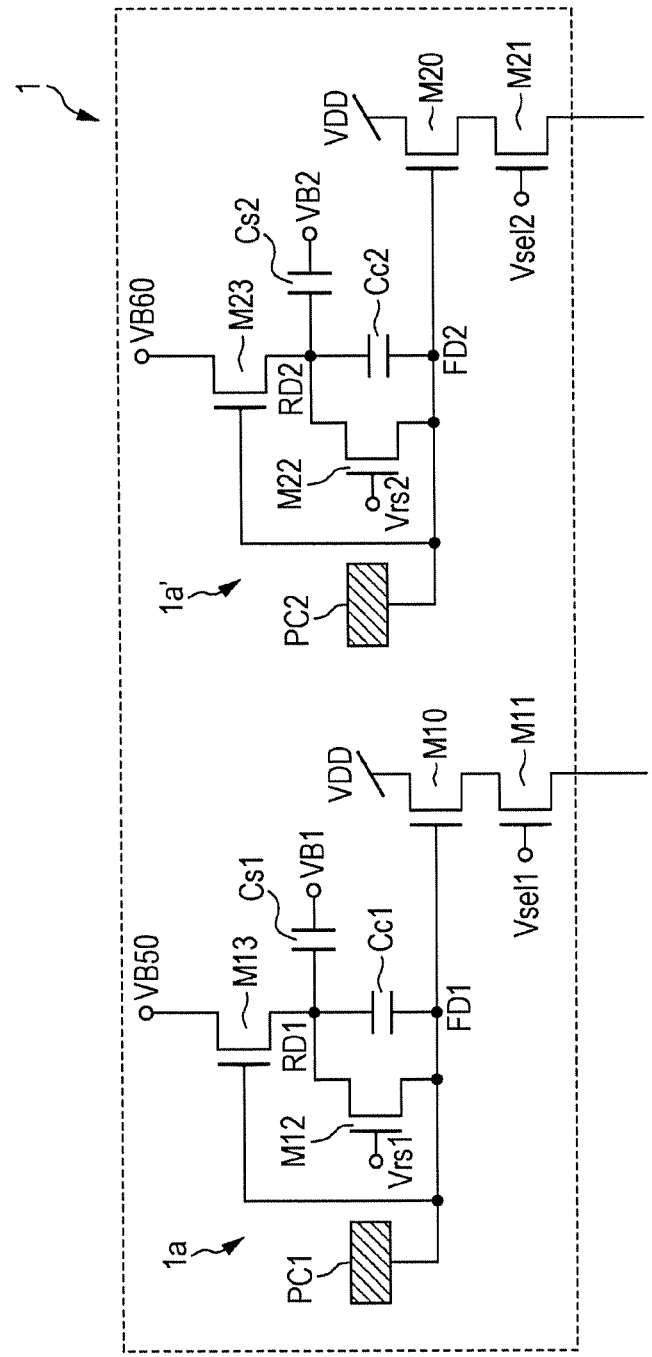
FIG. 24F is a schematic view illustrating still another circuit configuration of the unit pixel according to exemplary Fifth Embodiment.
Figure 24G:
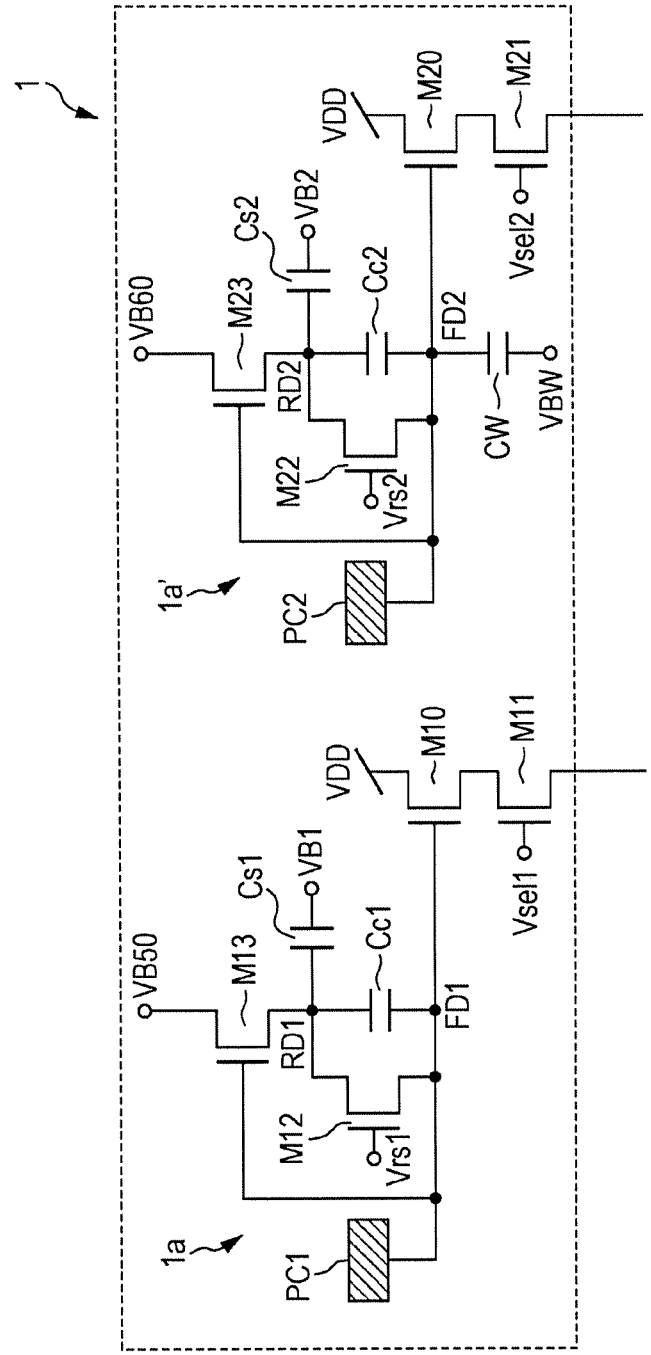
FIG. 24G is a schematic view illustrating still another circuit configuration of the unit pixel according to exemplary Fifth Embodiment.
Figure 24H:
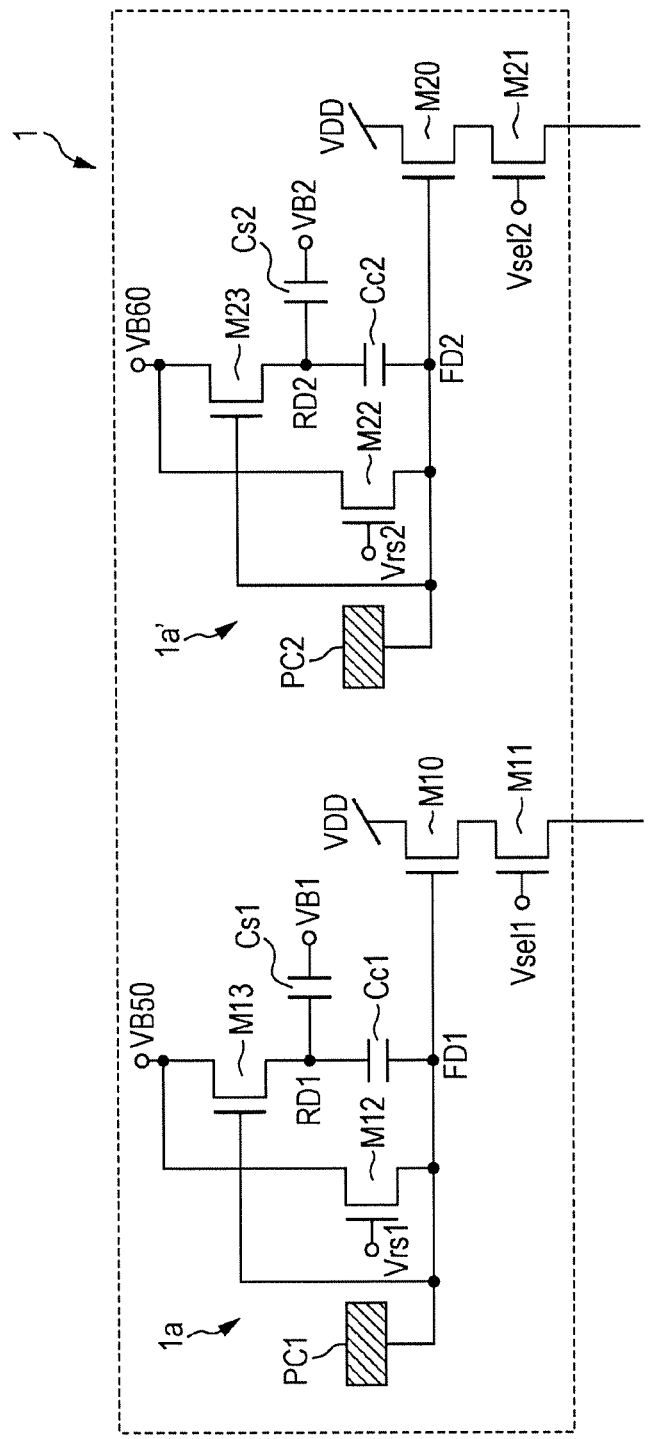
FIG. 24H is a schematic view illustrating still another circuit configuration of the unit pixel according to exemplary Fifth Embodiment.
Figure 24I:
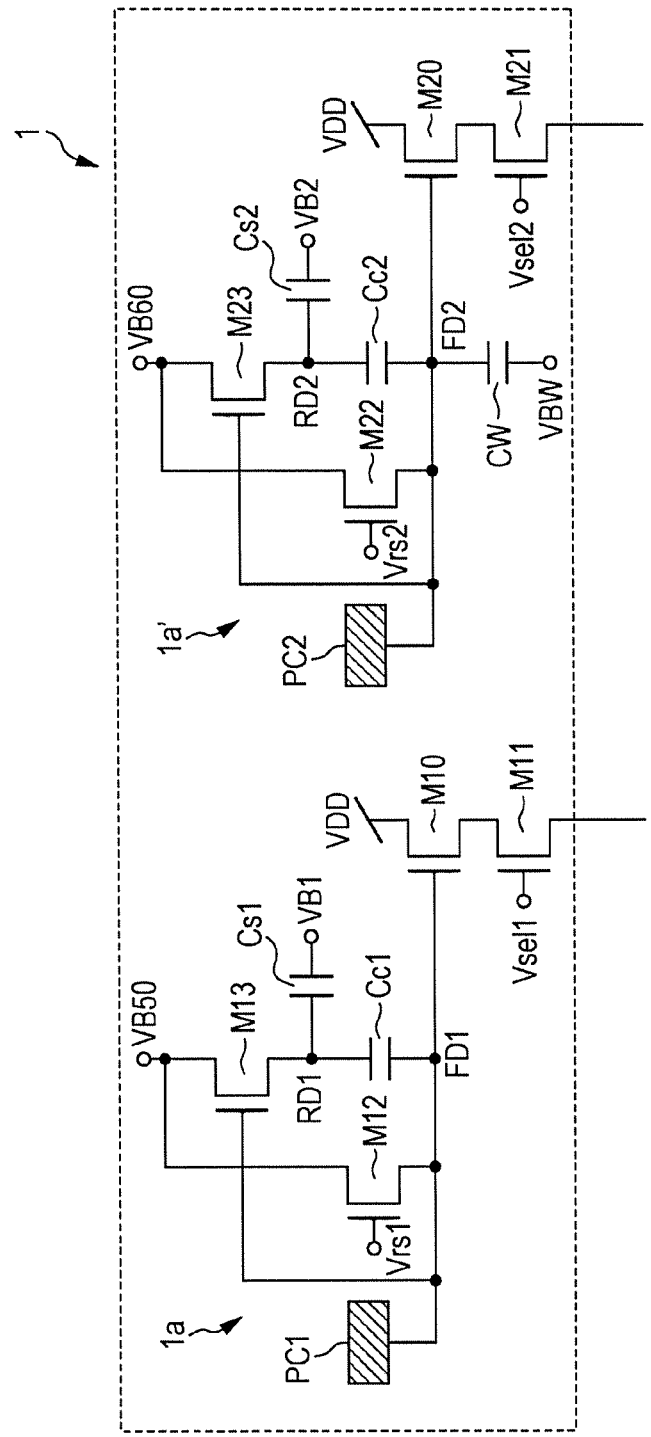
FIG. 24I is a schematic view illustrating still another circuit configuration of the unit pixel according to exemplary Fifth Embodiment.

FIGS. 22 and 23 illustrate other examples of a circuit configuration of the unit pixel 1 according to the present embodiment. As illustrated in FIG. 22, a fifth capacitive element CW that is electrically connected between the second photoelectric converter PC2 and a reference voltage VBW is provided. This makes it possible to improve the high-saturation characteristics of the second pixel cell 1a' by a degree corresponding to a capacitance ratio. As a result, it is possible to further widen a dynamic range.

According to the present embodiment, it is possible to suppress an unnecessary increase in pixel size. Furthermore, according to the present embodiment, it is possible to provide a small imaging device in which low-noise high-sensitivity imaging is achieved by the first pixel cell 1a and high-saturation low-sensitivity imaging is achieved by the second pixel cell 1a'. Furthermore, according to the present embodiment, a subject having a large difference in brightness can be imaged without a time lag and without blown out highlights and blocked up shadows.

It is desirable that the first reset transistor M12 be connected between the readout node FD1 connected to the first photoelectric converter PC1 and the connection node RD1 between the first capacitive element Cc1 and the second capacitive element Cs1, as illustrated in FIG. 21. Alternatively, it is desirable that the first reset transistor M12 be connected between the readout node FD1 connected to the first photoelectric converter PC1 and one of a source and a drain of the first band control transistor M13 that is not connected to the connection node RD1, as illustrated in FIG. 23. According to such a configuration, it is unnecessary to additionally provide a reset voltage Vret (=VRST). Furthermore, since convergence into a value close to a reset value can be achieved by feedback, the speed of noise cancelling can be increased.

Still other examples of a circuit configuration of the first and second pixel cells 1a and 1a' according to the present embodiment are described below.

FIGS. 24A through 24I illustrate still other examples of a circuit configuration of the first and second pixel cells 1a and 1a'. The configurations illustrated in FIGS. 21, 22, 23, and 24A through 24I correspond to the configurations illustrated in FIGS. 11, 12, 13, and 14A through 14I of Third Embodiment. The configurations illustrated in FIGS. 21, 22, 23, and 24A through 24I and the configurations illustrated in FIGS. 11, 12, 13, and 14A through 14I of Third Embodiment are different in configuration and operation of the first feedback circuit for noise suppression in the first pixel cell 1a and are the same in other configurations and operations.

An operation of the first pixel cell 1a according to the present embodiment is described below.
Readout and Noise Suppression A noise suppression and data readout operation using the first pixel cell 1a illustrated in FIG. 21 is described below as a specific example. Noteworthy points of the present configuration are as follows.

(A) Unlike First through Fourth Embodiments, the first band control transistor M13 has both an amplification function and a band control function within a single circuit. One of the source and the drain of the first band control transistor M13 is connected to the gate of the first band control transistor M13 so that self-bias occurs. In this way, the first band control transistor M13 suppresses kTC noise to $1/(1+A)^{1/2}$ by performing negative feedback by the amplification function thereof (=−A) while performing band control by itself.

(B) In a period other than a readout period, noise can be suppressed while electrically separating the first pixel cell 1a from the vertical signal line 9 by bringing the first selection control signal Vsel1 into a low level so that the first selection transistor M11 is turned off. Accordingly, even in a case where a parasitic component of the vertical signal line 9 is large, for example, in a configuration in which the size of each unit pixel is large or in a configuration in which the number of unit pixels is large, the influence of the parasitic component is small. This is a great advantage.

(C) Since noise can be suppressed while electrically separating the first pixel cell 1a from the vertical signal line 9, no feedback line is needed. This is advantageous in terms of area. Furthermore, a coupling capacitance with the vertical signal line 9 is less likely to occur.

(D) In First through Fourth Embodiment, band control of the first band control transistor M13 is performed by using the first band control signal Vrst3. However, in the present embodiment, band control of the first band control transistor M13 can be performed by using a reference voltage VB50.

Structures and operations of the first pixel cells 1a and the second pixel cells 1a' according to First through Fifth Embodiments are described in detail in Japanese Patent Application No. 2015-207381 and Japanese Patent Application No. 2015-207303, which are unpublished patent applications filed by the applicant of the subject application. The entire contents disclosed in these patent applications are hereby incorporated for reference.

Sixth Embodiment

An example of a circuit configuration of a unit pixel 1 according to Sixth Embodiment is described below with reference to FIGS. 25 through 26I.

Figure 25:
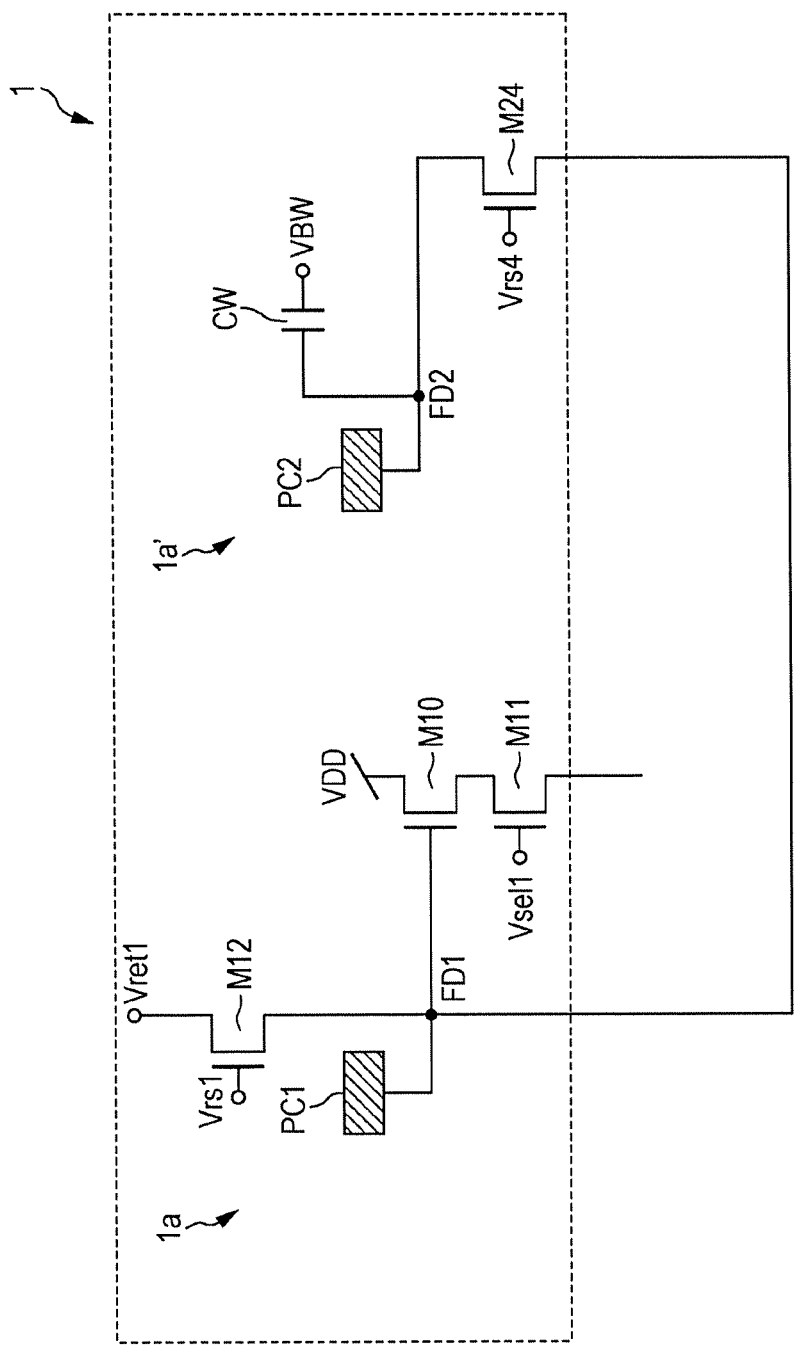
FIG. 25 is a schematic view illustrating a circuit configuration according to exemplary Sixth Embodiment.

FIG. 25 illustrates an example of a circuit configuration of the unit pixel 1 according to the present embodiment. The unit pixel 1 includes a first pixel cell 1a and a second pixel cell 1a'. The first pixel cell 1a functions as a low-noise cell. The first pixel cell 1a includes a first photoelectric converter PC1 that converts light into an electric signal and a first signal processing circuit P1 that is electrically connected to the first photoelectric converter PC1 and reads out the electric signal generated in the first photoelectric converter PC1.

The first signal processing circuit P1 includes a first signal detection circuit that detects the electric signal generated in the first photoelectric converter PC1. The first signal detection circuit includes a first amplifier transistor M10, a first selection transistor M11, and a first reset transistor M12. A gate of the first amplifier transistor M10 is connected to the first photoelectric converter PC1. The first amplifier transistor M10 amplifies the electric signal generated in the first photoelectric converter PC1. One of a source and a drain of the first selection transistor M11 is connected to one of a source and a drain of the first amplifier transistor M10. The first selection transistor M11 selectively outputs the signal amplified by the first amplifier transistor M10. One of a source and a drain of the first reset transistor M12 is connected to a readout node FD1. The first reset transistor M12 resets (initializes) the readout node FD1 connected to the first photoelectric converter PC1.

The second pixel cell 1a' functions as a high-saturation cell. The second pixel cell 1a' includes a second photoelectric converter PC2 that converts light into an electric signal and a second signal processing circuit P2 that is electrically connected to the second photoelectric converter PC2 and reads out the electric signal generated in the second photoelectric converter PC2.

Unlike the other embodiments, the second signal processing circuit P2 according to the present embodiment includes only a third reset transistor M24 and a fifth capacitive element CW. The electric signal generated in the second photoelectric converter PC2 is read out from the first amplifier transistor M10.

The first pixel cell 1a, which is in charge of imaging of a dark scene, requires low-noise characteristics but does not require high-saturation characteristics. Meanwhile, the second pixel cell 1a', which is in charge of imaging of a bright scene, requires high-saturation characteristics. However, the second pixel cell 1a' does not require low-noise characteristics since a light amount is large and the characteristics are determined by shot noise at a bright scene. Therefore, in the present embodiment, the size of the unit pixel 1 is reduced assuming that an increase of kTC noise of the third reset transistor M24 does not pose a problem.

FIGS. 26A through 26I illustrate various variations of the circuit configuration of the unit pixel 1 according to the present embodiment. As illustrated in FIGS. 26A through 26I, the configurations described in First through Fifth Embodiments may be applied to the configuration illustrated in FIG. 25. For example, the first pixel cell 1a that functions as a low-noise cell may include an inverting amplifier FBAMP1, a first band control transistor M13, and a capacitance circuit. According to any one of the variations, it is possible to provide a small imaging device in which high-saturation low-sensitivity imaging is achieved by the second pixel cell 1a'.

Next, an operation of the first pixel cell 1a and the second pixel cell 1a' according to the present embodiment is described.

Readout Driving for Achieving Reduction in Size

Figure 26A:
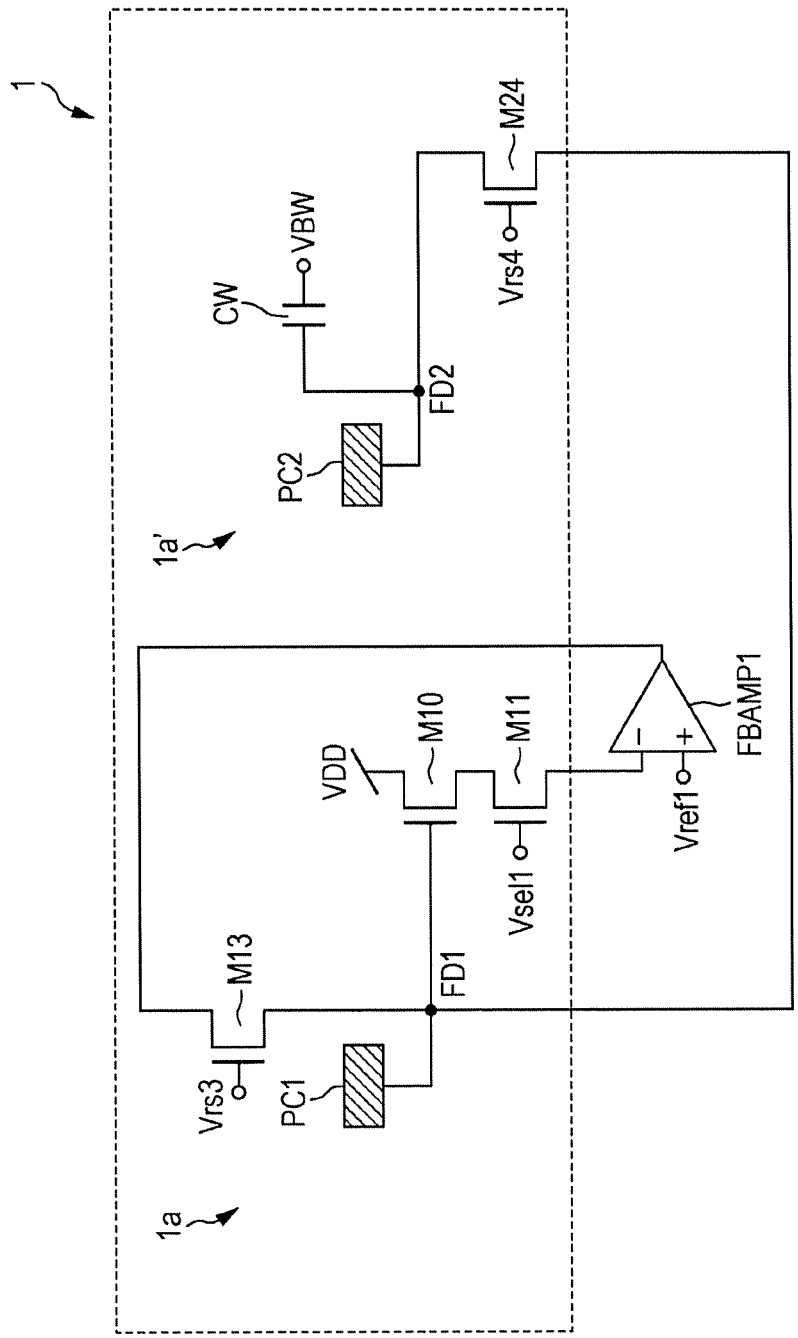
FIG. 26A is a schematic view illustrating a variation of the circuit configuration according to exemplary Sixth Embodiment.
Figure 26B:
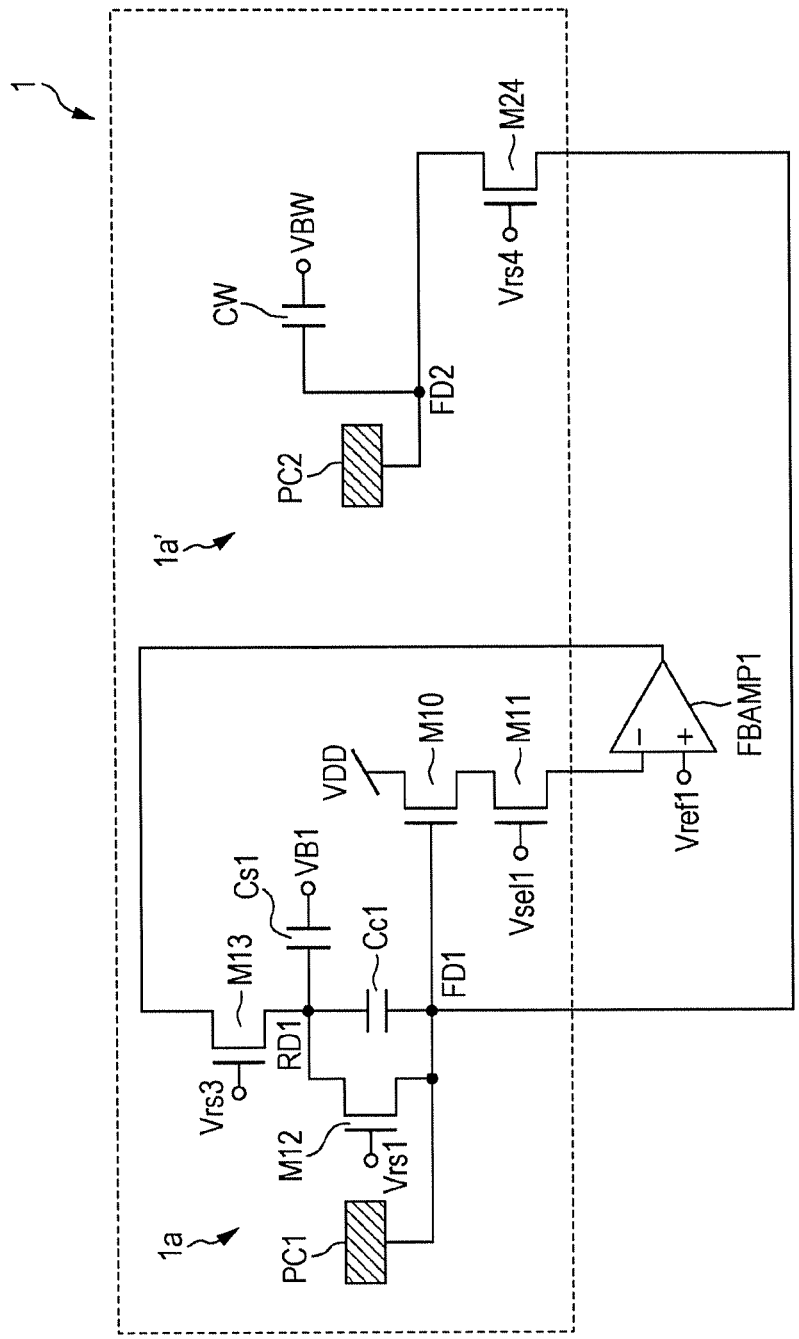
FIG. 26B is a schematic view illustrating a variation of the circuit configuration according to exemplary Sixth Embodiment.
Figure 26C:
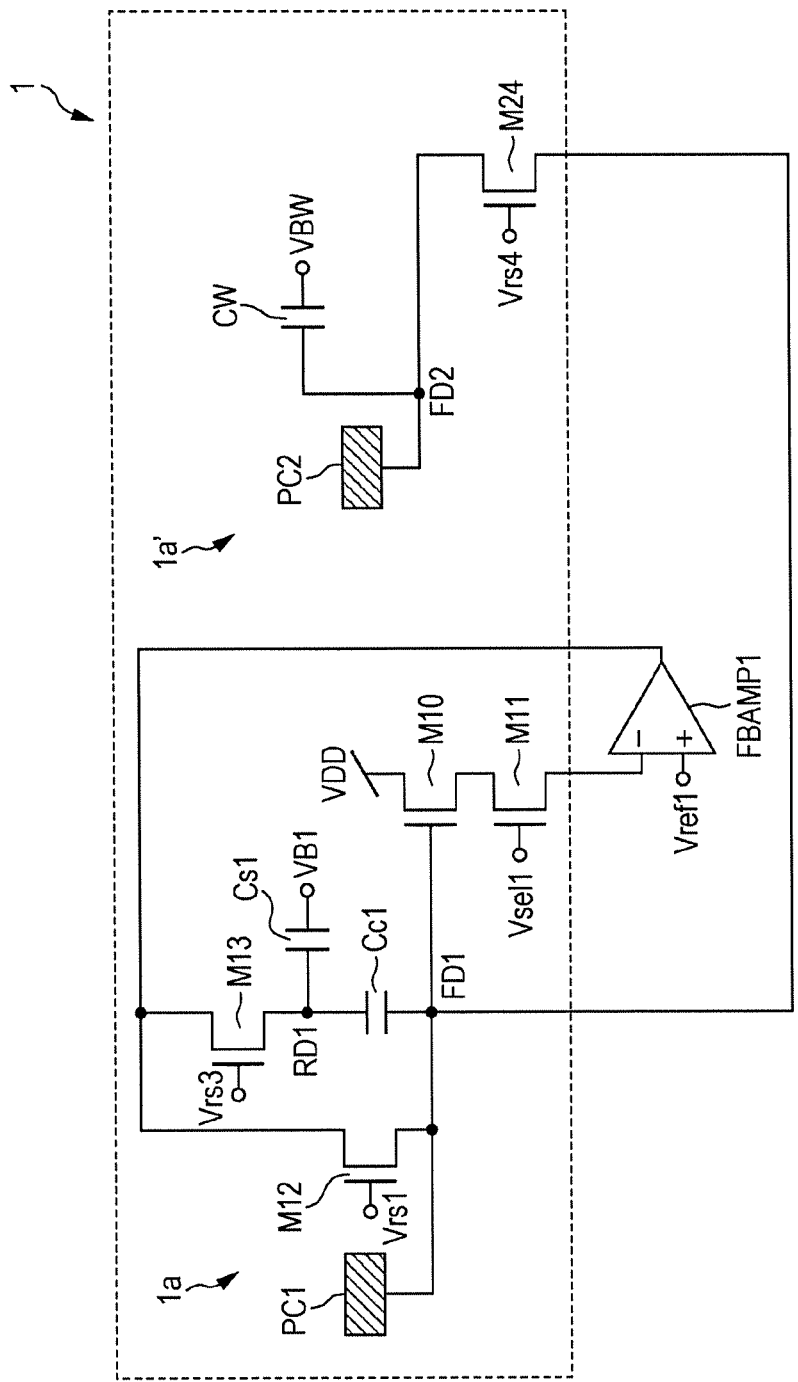
FIG. 26C is a schematic view illustrating a variation of the circuit configuration according to exemplary Sixth Embodiment.
Figure 26D:
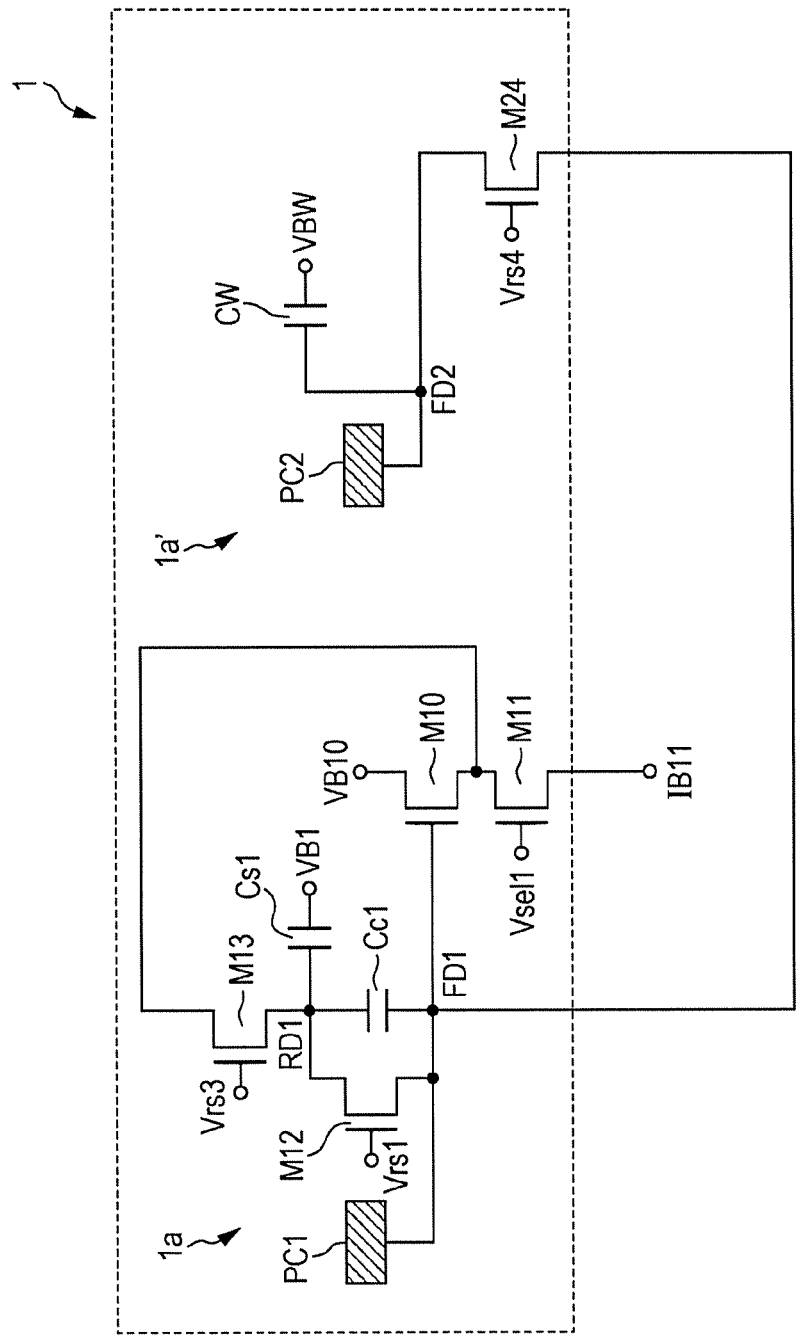
FIG. 26D is a schematic view illustrating a variation of the circuit configuration according to exemplary Sixth Embodiment.
Figure 26E:
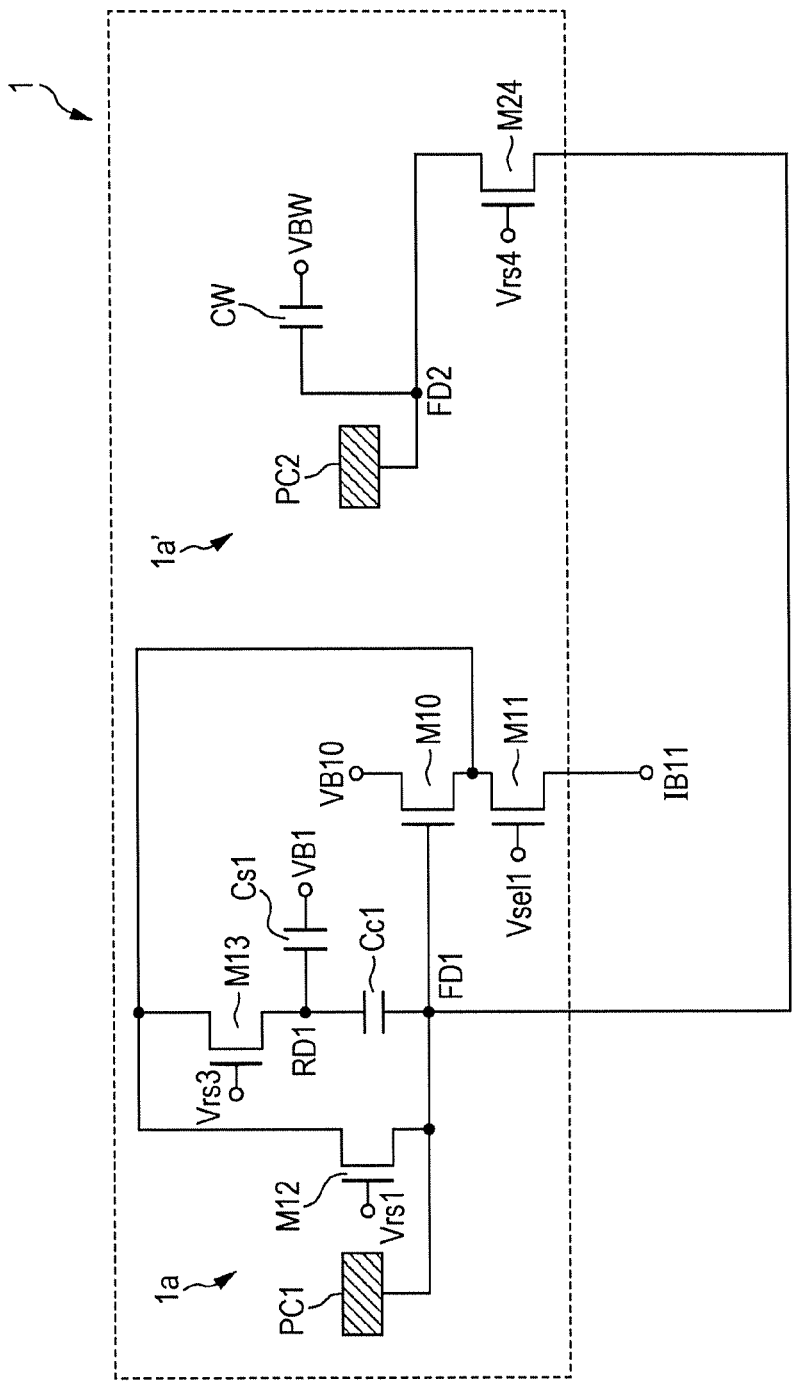
FIG. 26E is a schematic view illustrating a variation of the circuit configuration according to exemplary Sixth Embodiment.
Figure 26F:
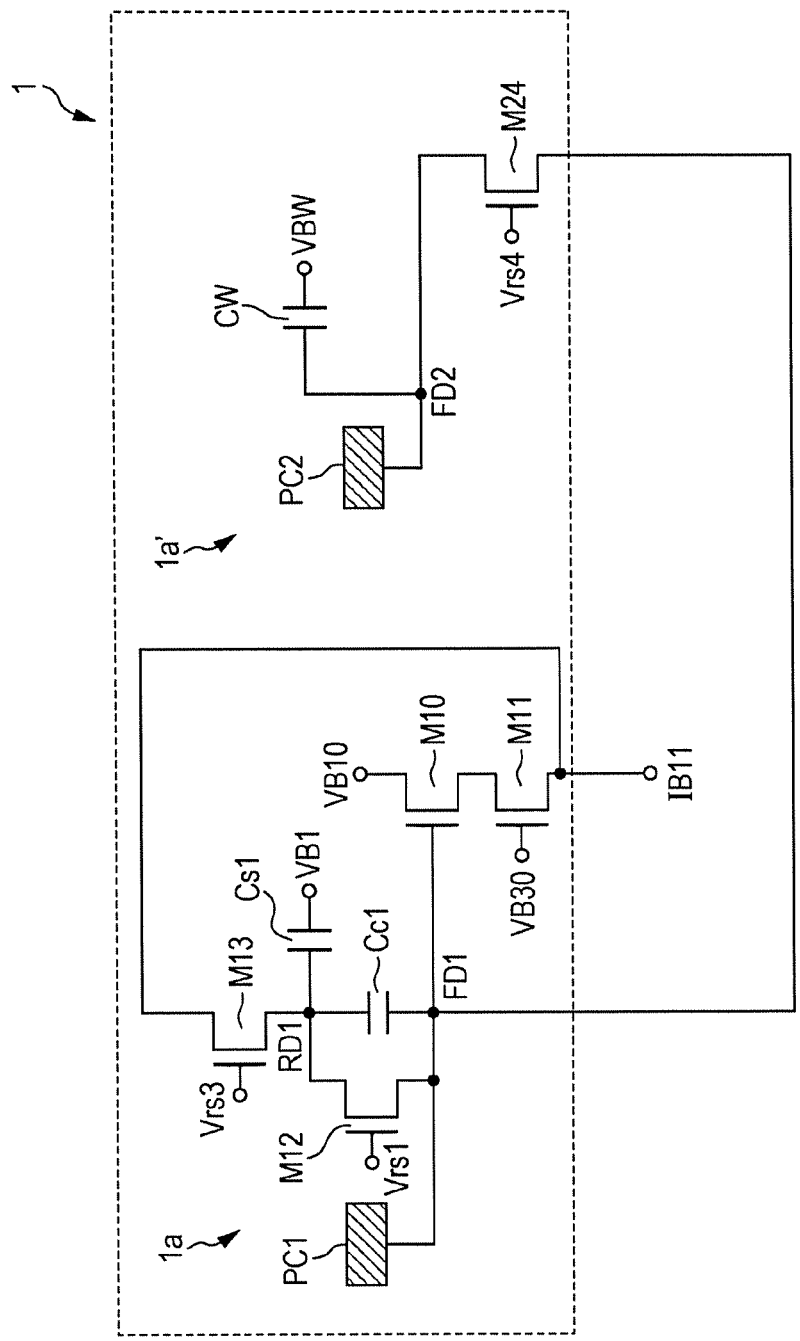
FIG. 26F is a schematic view illustrating a variation of the circuit configuration according to exemplary Sixth Embodiment.
Figure 26G:
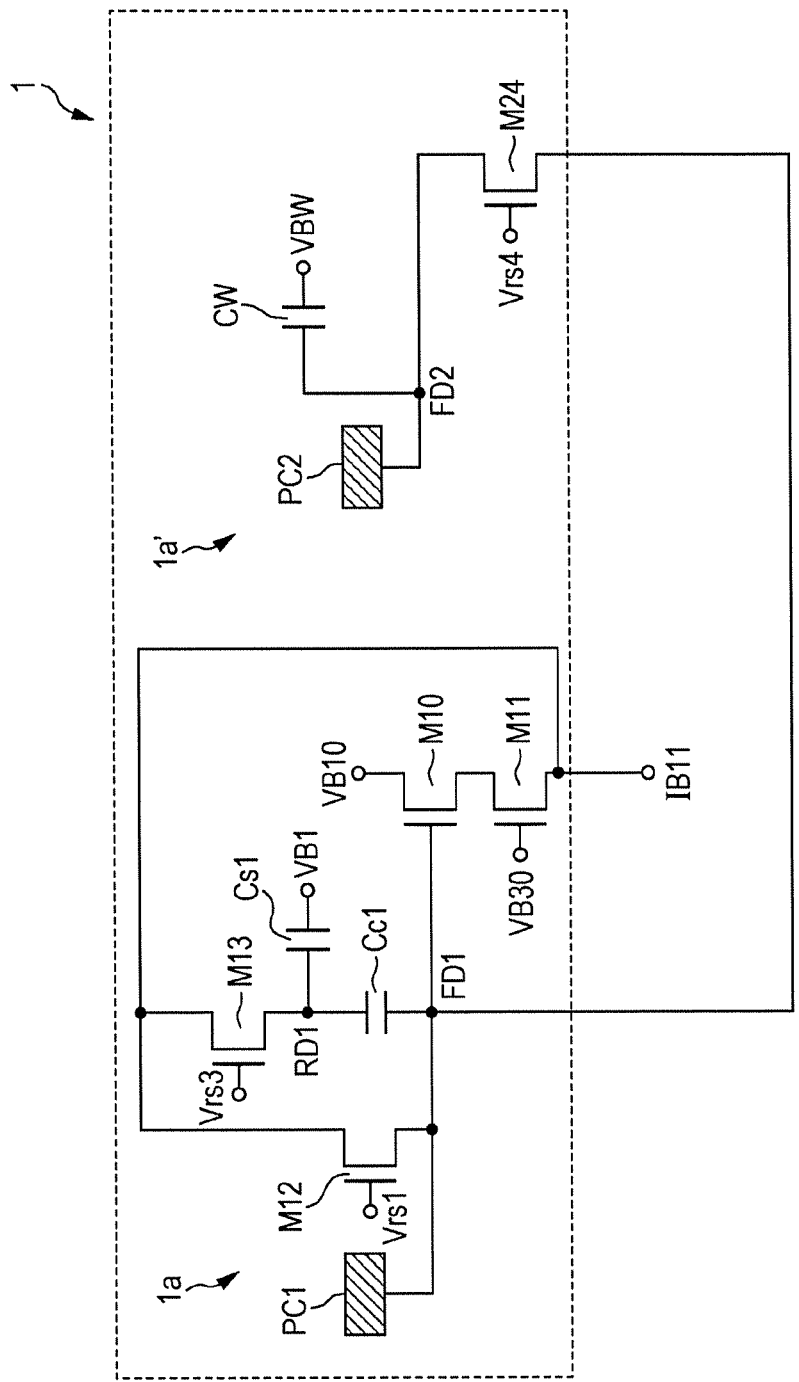
FIG. 26G is a schematic view illustrating a variation of the circuit configuration according to exemplary Sixth Embodiment.
Figure 26H:
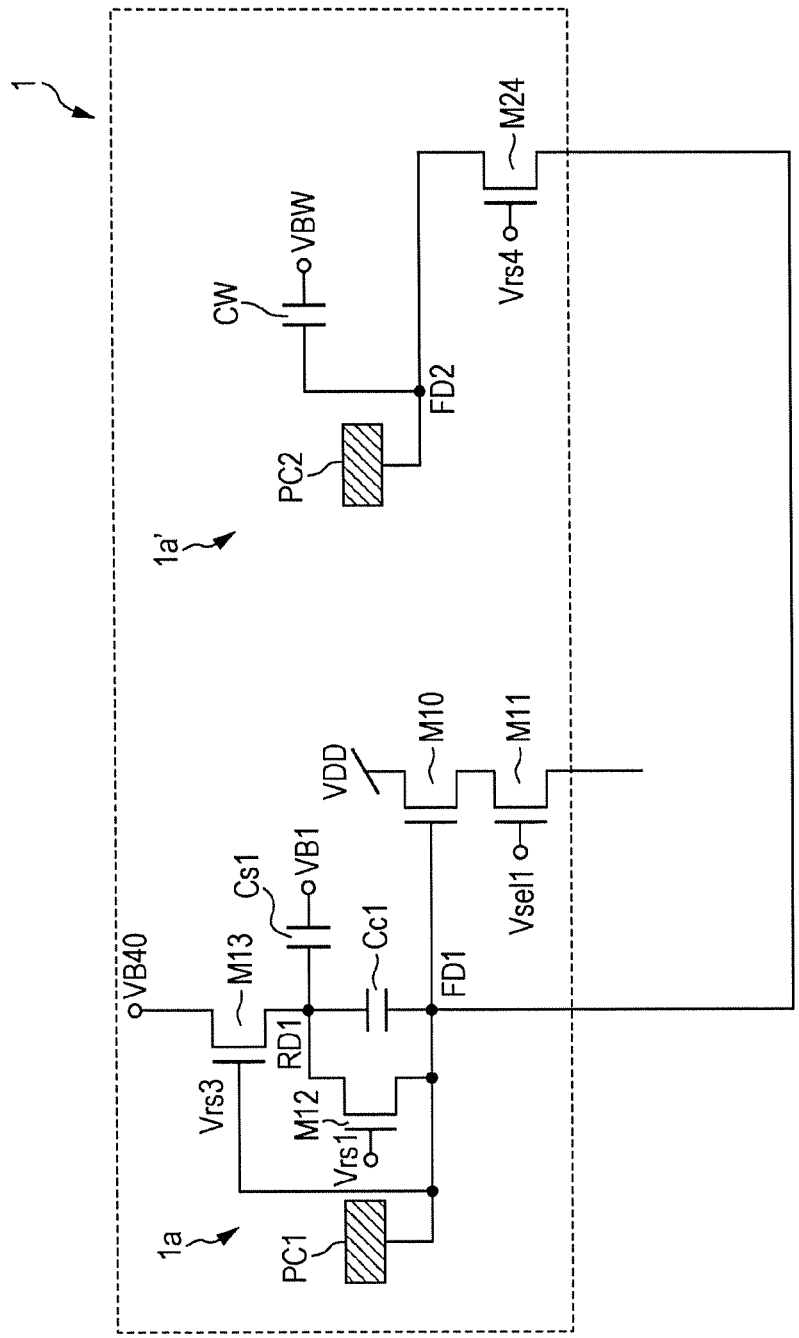
FIG. 26H is a schematic view illustrating a variation of the circuit configuration according to exemplary Sixth Embodiment.
Figure 26I:
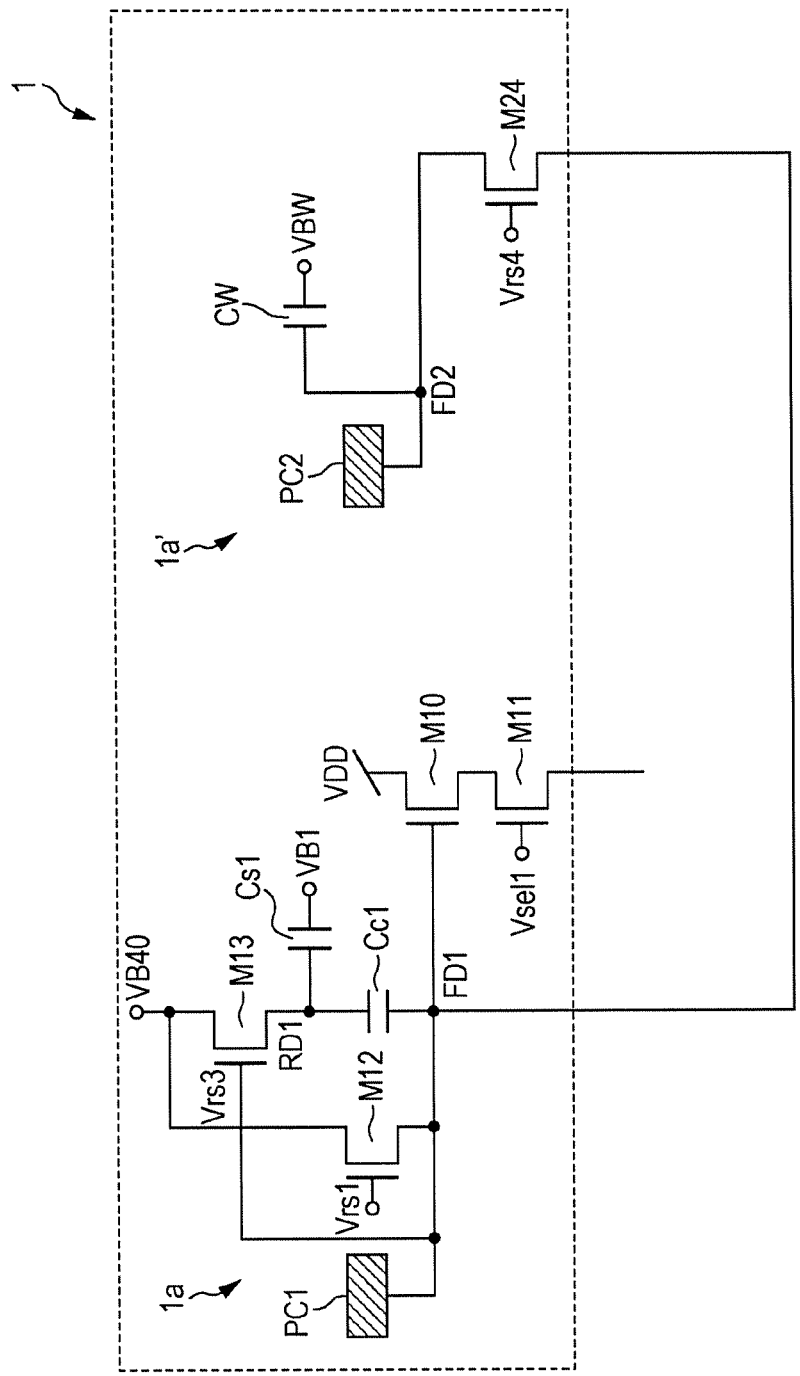
FIG. 26I is a schematic view illustrating a variation of the circuit configuration according to exemplary Sixth Embodiment.

In the present embodiment, the first pixel cell 1a includes an amplifier transistor and a selection transistor, but the second pixel cell 1a' does not include an amplifier transistor and a selection transistor. The present embodiment is different from the other embodiments on this point. An example of driving of the unit pixel 1 having, for example, the configuration illustrated in FIG. 26B is described in detail with reference to FIG. 27.

Figure 27:
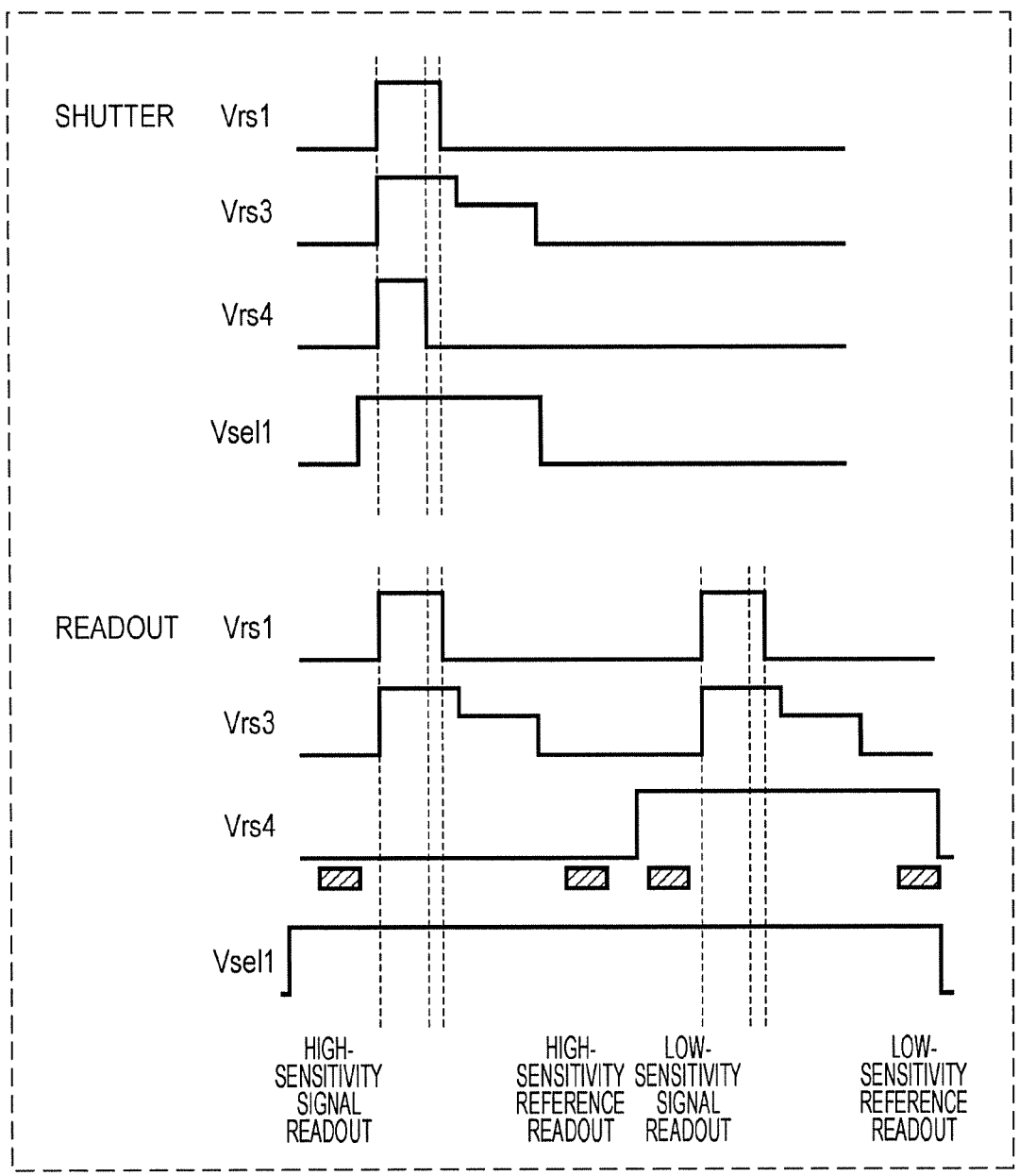
FIG. 27 is a timing chart illustrating an example of timings of driving in a case where a first band control transistor is provided according to exemplary Sixth Embodiment.

FIG. 27 illustrates an example of timings of driving in a case where the first band control transistor M13 is provided.

First, at the time of reset (electronic shutter) before signal accumulation (electric charge accumulation), all of the first reset transistor M12, the first band control transistor M13, and the third reset transistor M24 are turned on, and thus the readout node FD1 connected to the first photoelectric converter PC1 of the first pixel cell 1a is reset. At the same timing, the readout node FD2 connected to the second photoelectric converter PC2 of the second pixel cell 1a' is reset.

Next, the second pixel cell 1a' is separated by turning off the third reset transistor M24 before the first reset transistor M12 and the first band control transistor M13 are turned off. At this timing, kTC noise of the third reset transistor M24 is superimposed on the readout node FD2 connected to the second photoelectric converter PC2. However, since shot noise is dominant in a light amount which the second pixel cell 1a' copes with, the kTC noise is left as it is. Then, the first reset transistor M12 and the first band control transistor M13 are sequentially turned off.

In the first pixel cell 1a, noise characteristics are important, and therefore kTC noise of the first reset transistor M12 and the first band control transistor M13 is cancelled by using the first feedback circuit. This noise suppression operation is similar to the operation of the first pixel cell 1a according to Third Embodiment.

After signal accumulation, a signal value of the readout node FD1 connected to the first photoelectric converter PC1 is read out. In this readout, only a signal is read out from the first pixel cell 1a. Then, both of the first reset transistor M12 and the first band control transistor M13 are turned on again, and thus the readout node FD1 connected to the first photoelectric converter PC1 is reset in the first pixel cell 1a. Then, a reference value for the first pixel cell 1a is read out.

Next, the third reset transistor M24 is turned on, and a signal value is read out from a combined readout node including the readout node FD1 of the first photoelectric converter PC1 and the readout node FD2 of the second photoelectric converter PC2. A signal read out from the second pixel cell 1a' includes kTC noise of a fourth reset transistor M24. Then, both of the first reset transistor M12 and the first band control transistor M13 are turned on again, and thus the combined readout node is reset in the second pixel cell 1a'. Then, a reference value is read out. A signal value of the second pixel cell 1a' need be converted as a value accumulated in both of the readout nodes of the first photoelectric converter PC1 and the second photoelectric converter PC2 since both of the readout nodes of the first photoelectric converter PC1 and the second photoelectric converter PC2 are connected by turning on the third reset transistor M24.

Figure 28:
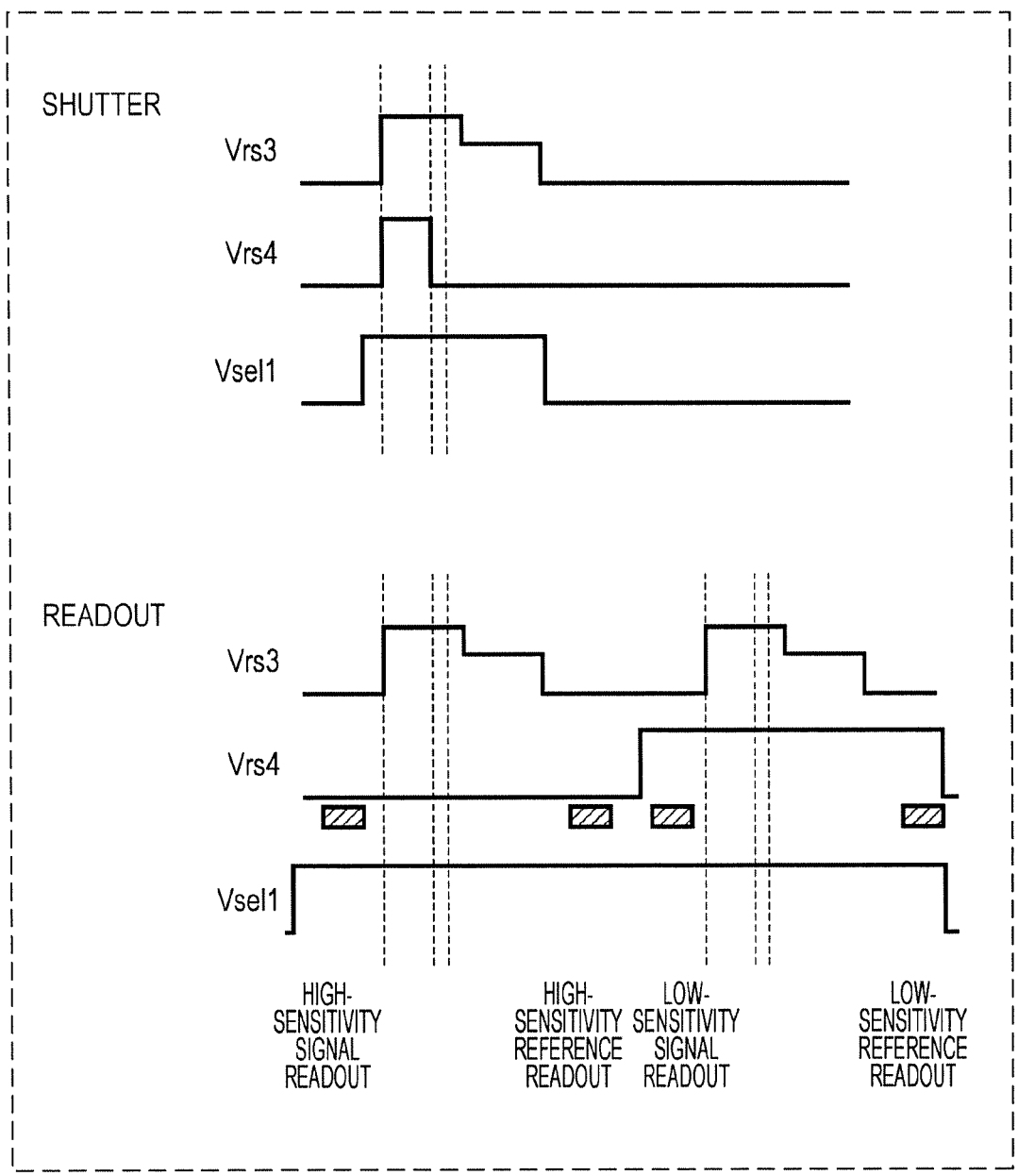
FIG. 28 is a timing diagram illustrating an example of timings of driving in a case where the first band control transistor is not provided according to exemplary Sixth Embodiment.

FIG. 28 illustrates an example of timings of driving in a case where the first band control transistor M13 is not provided. Operations of the other transistors are similar to those in FIG. 27. Although FIGS. 27 and 28 illustrate an example of timings of driving of the unit pixel 1 according to the present embodiment, driving timings are not limited to those in FIGS. 27 and 28 as long as a driving method that achieves the aforementioned noise suppression and readout is employed.

Seventh Embodiment

A camera system 204 according to the present embodiment is described with reference to FIG. 29.

Figure 29:
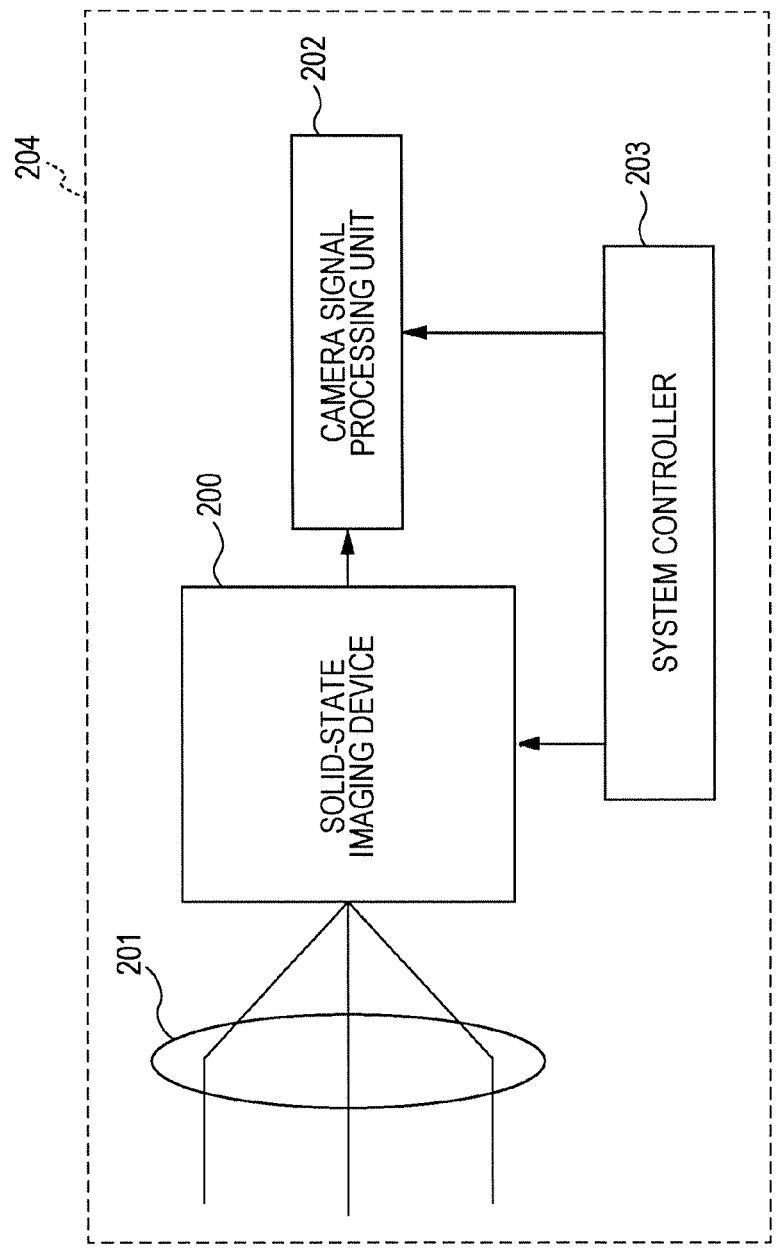
FIG. 29 is a diagram illustrating a system configuration of a camera system according to exemplary Seventh Embodiment.

FIG. 29 illustrates a system configuration of the camera system 204 according to the present embodiment. The camera system 204 includes a lens optical system 201, an imaging device 200, a system controller 203, and a camera signal processing unit 202.

The lens optical system 201 includes, for example, an autofocus lens, a zoom lens, and a diaphragm. The lens optical system 201 collects light onto an imaging surface of the imaging device 200. The imaging device 100 according to any one of First through Sixth Embodiments and modifications thereof can be widely used as the imaging device 200.

The system controller 203 controls the whole camera system 204. The system controller 203 can be, for example, realized by a microcomputer.

The camera signal processing unit 202 functions as a signal processing circuit that processes an output signal from the imaging device 200. The camera signal processing unit 202 performs processes such as gamma correction, color interpolation, spatial interpolation, and auto white balance. The camera signal processing unit 202 can be realized, for example, by a digital signal processor (DSP).

According to the camera system according to the present embodiment, reset noise (kTC noise) during readout can be properly suppressed by using the imaging device 100 according to any one of First through Sixth Embodiment. This makes it possible to accurately read out an electric charge, thereby obtaining a good-quality image.

An imaging device according to the present disclosure is applicable to various camera systems and sensor systems such as a digital still camera, a camera for medical use, a monitoring camera, an on-board camera, a digital single-lens reflex camera, and a digital mirrorless interchangeable lens camera.

What is claimed is:

1. An imaging device comprising:
    a first pixel cell including
        a first photoelectric converter that generates a first signal by photoelectric conversion, the first photoelectric converter including a first electrode and a first photoelectric conversion region on the first electrode, and
        a first circuit that is coupled to the first electrode and that detects the first signal; and
    a second pixel cell including
        a second photoelectric converter that generates a second signal by photoelectric conversion, the second photoelectric converter including a second electrode and a second photoelectric conversion region on the second electrode, and
        a second circuit that is coupled to the second electrode and that detects the second signal, wherein
    a sensitivity of the first pixel cell is higher than a sensitivity of the second pixel cell,
    a circuit configuration of the first circuit is different from a circuit configuration of the second circuit,
    the first circuit includes a feedback circuit that is configured to negatively feed back a voltage of the first electrode to the first electrode,
    the first circuit includes a first transistor, one of a source and a drain of the first transistor being configured to be electrically coupled to the first electrode, and
    the feedback circuit is configured to negatively feed back the voltage of the first electrode to the first electrode via the source and the drain of the first transistor.

2. The imaging device according to claim 1, wherein the first circuit is configured to reduce random noise more than the second circuit is.

3. The imaging device according to claim 1, wherein a number of one or more transistors included in the first circuit is greater than a number of zero or more transistors included in the second circuit.

4. The imaging device according to claim 1, wherein a number of one or more capacitive elements included in the first circuit is greater than a number of zero or more capacitive elements included in the second circuit.

5. The imaging device according to claim 1, wherein the second circuit includes a capacitive element that is coupled to the second electrode.

6. The imaging device according to claim 1, wherein
    the feedback circuit includes an inverting amplifier,
    the first circuit includes a second transistor a gate of which is coupled to the first electrode, and
    the feedback circuit is configured to negatively feed back a voltage of the first electrode to the first electrode via the second transistor, the inverting amplifier, and the first transistor.

7. The imaging device according to claim 6, wherein
    the first circuit includes
        a first capacitive element one end of which is coupled to the first electrode,
        a second capacitive element one end of which is coupled to the other end of the first capacitive element, and
        the one of the source and the drain of the first transistor is coupled to the other end of the first capacitive element.

8. The imaging device according to claim 1, wherein
    the first circuit includes
        a first capacitive element one end of which is coupled to the first electrode,
        a second capacitive element one end of which is coupled to the other end of the first capacitive element, and
        the one of the source and the drain of the first transistor is coupled to the other end of the first capacitive element.

9. The imaging device according to claim 8, wherein a gate of the first transistor is coupled to the first electrode.

10. The imaging device according to claim 1, wherein
    the feedback circuit includes an inverting amplifier,
    the first circuit includes a second transistor having a gate coupled to the first electrode, and
    the feedback circuit is configured to negatively feed back the voltage of the first electrode to the other of the source and the drain of the first transistor via the second transistor and the inverting amplifier.

11. The imaging device according to claim 10, wherein the first circuit includes a first capacitive element and a second capacitive element, the one of the source and the drain of the first transistor being coupled to the first electrode via the first capacitive element, one end of second capacitive element being coupled to the one of the source and the drain of the first transistor.

12. The imaging device according to claim 1, wherein
    the first circuit includes a second transistor having a gate coupled to the first electrode, and
    the feedback circuit is configured to negatively feed back a voltage of the first electrode to the other of the source and the drain of the first transistor via the second transistor.

13. The imaging device according to claim 1, wherein the first circuit includes a first capacitive element and a second capacitive element, the one of the source and the drain of the first transistor being coupled to the first electrode via the first capacitive element, one end of second capacitive element being coupled to the one of the source and the drain of the first transistor.

14. An imaging device comprising:
a first pixel cell including
a first photoelectric converter that generates a first signal by photoelectric conversion, the first photoelectric converter including a first electrode and a first photoelectric conversion region on the first electrode, and
a first circuit that is coupled to the first electrode and that detects the first signal; and
a second pixel cell including
a second photoelectric converter that generates a second signal by photoelectric conversion, the second photoelectric converter including a second electrode and a second photoelectric conversion region on the second electrode, and
a second circuit that is coupled to the second electrode and that detects the second signal, wherein
a sensitivity of the first pixel cell is higher than a sensitivity of the second pixel cell,
a circuit configuration of the first circuit is different from a circuit configuration of the second circuit,
the first circuit includes a feedback circuit that is configured to negatively feed back a voltage of the first electrode to the first electrode,
the feedback circuit includes an inverting amplifier, and
the feedback circuit is configured to negatively feed back the voltage of the first electrode to the first electrode via the inverting amplifier.

15. The imaging device according to claim 14, wherein a number of one or more transistors included in the first circuit is greater than a number of zero or more transistors included in the second circuit.

16. The imaging device according to claim 14, wherein a number of one or more capacitive elements included in the first circuit is greater than a number of zero or more capacitive elements included in the second circuit.

17. The imaging device according to claim 14, wherein the second circuit includes a capacitive element that is coupled to the second electrode.

18. The imaging device according to claim 14, wherein the first circuit includes
a first capacitive element one end of which is coupled to the first electrode,
a second capacitive element one end of which is coupled to the other end of the first capacitive element, and
a first transistor one of a source and a drain of which is coupled to the other end of the first capacitive element.

19. The imaging device according to claim 18, wherein a gate of the first transistor is coupled to the first electrode.

* * * * *